(12) United States Patent
Aoai et al.

(10) Patent No.: US 6,787,283 B1
(45) Date of Patent: *Sep. 7, 2004

(54) POSITIVE PHOTORESIST COMPOSITION FOR FAR ULTRAVIOLET EXPOSURE

(75) Inventors: Toshiaki Aoai, Shizuoka (JP); Kenichiro Sato, Shizuoka (JP); Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 226 days.

This patent is subject to a terminal disclaimer.

(21) Appl. No.: 09/620,708

(22) Filed: Jul. 20, 2000

(30) Foreign Application Priority Data

| Jul. 22, 1999 | (JP) | .............................. P.11-207958 |
| Aug. 20, 1999 | (JP) | .............................. P.11-234239 |
| Aug. 20, 1999 | (JP) | .............................. P.11-234240 |

(51) Int. Cl.⁷ .............................................. G03F 7/039
(52) U.S. Cl. ........................ 430/270.1; 430/905; 430/910
(58) Field of Search .............................. 430/270.1, 905, 430/910

(56) References Cited

U.S. PATENT DOCUMENTS

| 5,824,451 | A | * | 10/1998 | Aoai et al. ............... 430/270.1 |
| 6,042,991 | A | * | 3/2000 | Aoai et al. ............... 430/285.1 |
| 6,087,063 | A | * | 7/2000 | Hada et al. .............. 430/270.1 |
| 6,159,655 | A | * | 12/2000 | Sato ........................ 430/270.1 |
| 6,214,517 | B1 | * | 4/2001 | Sato et al. ............... 430/270.1 |
| 6,291,130 | B1 | * | 9/2001 | Kodama et al. ......... 430/270.1 |
| 2002/0006576 | A1 | * | 1/2002 | Sato et al. ............... 430/270.1 |

FOREIGN PATENT DOCUMENTS

| JP | 2-19847 | 1/1990 |
| JP | 2-209977 | 8/1990 |
| JP | 3-206458 | 9/1991 |
| JP | 4-219757 | 8/1992 |
| JP | 5-281745 | 10/1993 |
| JP | 9-73173 | 3/1997 |
| JP | 9-90637 | 4/1997 |
| JP | 10-10739 | 1/1998 |
| JP | 10-111569 | 4/1998 |
| JP | 10-161313 | 6/1998 |
| JP | 10-207069 | 8/1998 |
| JP | 10-239846 | 9/1998 |
| JP | 10-274852 | 10/1998 |
| JP | 11-109632 | 4/1999 |

* cited by examiner

*Primary Examiner*—John S. Chu
(74) *Attorney, Agent, or Firm*—Sughrue Mion, PLLC

(57) ABSTRACT

Disclosed is a positive photoresist composition comprising (A) a compound capable of generating an acid upon irradiation with actinic rays or radiation and (B) a resin capable of decomposing under the action of an acid to increase the solubility in alkali, containing a repeating unit having a group represented by the following formula (I):

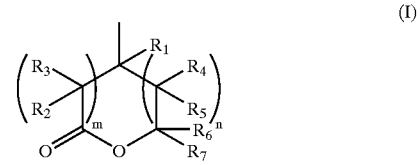

(I)

wherein $R_1$ represents hydrogen atom or an alkyl group having from 1 to 4 carbon atoms, which may have a substituent, $R_1$ to $R_7$, which may be the same or different, each represents hydrogen atom, an alkyl group which may have a substituent, a cycloalkyl group which may have a substituent or an alkenyl group which may have a substituent, provided that at least one of $R_6$ and $R_7$ is a group exclusive of hydrogen atom and $R_6$ and $R_7$ may combine to form a ring, and m and n each independently represents 0 or 1, provided that m and n are not 0 at the same time. The positive photoresist composition can further comprise a fluorine-containing and/or silicon-containing surfactant and at least one first solvent selected from propylene glycol monomethyl ether acetate, propylene glycol monomethyl ether propionate, methyl 3-methoxypropionate, ethyl 3-methoxypropionate, methyl 3-ethoxypropionate and 3-ethoxypropionate.

25 Claims, No Drawings

POSITIVE PHOTORESIST COMPOSITION FOR FAR ULTRAVIOLET EXPOSURE

FIELD OF THE INVENTION

The present invention relates to a positive photoresist composition for use in the ultramicrolithography process and other photofabrication processes, such as production of VLSI (Very Large Scale Integration) and high-capacitance micro-chip. More specifically, the present invention relates to a positive photoresist composition capable of forming a highly precise pattern using light in the far ultraviolet region including an excimer laser ray, particularly, in the region of 250 nm or less.

BACKGROUND OF THE INVENTION

In recent years, the integration degree of integrated circuits is more and more elevated and in the production of a semiconductor substrate such as VLSI, an ultrafine pattern consisting of lines having a width of half micron or less must be worked. To meet this requirement, the wavelength used in the exposure apparatus for photo-lithography increasingly becomes shorter and at the present time, studies are being made on the use of an excimer laser ray (e.g., XeCl, KrF, ArF) having a short wavelength among far ultraviolet rays.

In the formation of a pattern for lithography using this wavelength region, a chemical amplification-system resist is used.

The chemical amplification-system resist in general can be roughly classified into three groups, that is, commonly called 2-component system, 2.5-component system and 3-component system. The 2-component system uses a combination of a compound capable of generating an acid by the photochemical decomposition (hereinafter referred to as a "photo-acid generator") and a binder resin. This binder resin is a resin having within the molecule thereof a group capable of decomposing under the action of an acid and thereby increasing solubility of the resin in an alkali developer (also called acid-decomposable group). The 2.5-component system contains a low-molecular weight compound having an acid-decomposable group in addition to the 2-component system. The 3-component system contains a photo-acid generator, an alkali-soluble resin and the above-described low-molecular weight compound.

The chemical amplification-system resist is suitable as a photoresist for use under irradiation with an ultraviolet ray or a far ultraviolet ray but still in need of coping with the characteristics required on use. For example, a resist composition using a polymer obtained by introducing an acetal or ketal protective group into a hydroxystyrene-base polymer which exhibits small light absorption particularly for light at 248 nm of a KrF excimer laser has been proposed in JP-A-2-141636 (the term "JP-A" as used herein means an "unexamined published Japanese patent application"), JP-A-2-19847, JP-A-4-219757, JP-A-5-281745 and the like. In addition, a similar composition using a t-butoxycarbonyloxy or p-tetrahydropyranyloxy group as the acid-decomposable group has been proposed in JP-A-2-209977, JP-A-3-206458 and JP-A-2-19847.

These compositions are suitable for the case of using light at 248 nm of the KrF excimer laser, however, when an ArF excimer laser is used as the light source, the substantial absorbance is still excessively large and therefore, the sensitivity is low. Accompanying this, other problems arise, such as deterioration in the resolution, the focus allowance or the pattern profile. Thus, improvements are necessary in many points.

As a photoresist composition for use with an ArF light source, a resin in which an alicyclic hydrocarbon site is introduced so as to impart dry etching resistance has been proposed. Examples of this resin include resins obtained by copolymerizing a monomer having a carboxylic acid site such as acrylic acid or methacrylic acid or a monomer having a hydroxyl group or a cyano group within the molecule, with a monomer having an alicyclic hydrocarbon group.

Other than the above-described method of introducing an alicyclic hydrocarbon site into the side chain of an acrylate-base monomer, a method of using an alicyclic hydrocarbon site in the polymer main chain to impart dry etching resistance is also being studied.

Furthermore, JP-A-9-73173, JP-A-9-90637 and JP-A-10-161313 describe a resist material using an acid-sensitive compound containing an alkali-soluble group protected by a structure containing an alicyclic group, and a structural unit for allowing the alkali-soluble group to be released under the action of an acid and render the compound alkali-soluble.

In addition, a resin obtained by introducing a hydrophilic 5- or 6-membered ring lactone group into the above-described resin having an alicyclic group so as to improve the affinity for an alkali developer or the adhesion to a substrate is described in JP-A-9-90637, JP-A-10-207069, JP-A-10-274852 and JP-A-10-239846.

However, these techniques are insufficient in many points such as improvement for higher sensitivity and higher resolution or improvement of the adhesive property to a substrate, and they are still in need of improvements.

Also, in recent years, to cope with the requirement for semiconductor chips in a finer size, the design pattern for the fine semiconductor has reached to a region as fine as 0.13 to 0.35 $\mu$m. The above-described compositions have, however, a problem in that the resolution of the pattern is inhibited due to the factors such as edge roughness of the line pattern or the like. The term "edge roughness" as used herein means the fact that due to the properties of the resist, the edges at the top and bottom of a resist line pattern irregularly fluctuate in the direction perpendicular to the line direction and unevenness is observed on the edges when viewed from right above.

With respect to the photoresist composition for use with an ArF light source, a resin in which an alicyclic hydrocarbon site is introduced so as to impart dry etching resistance has been proposed. However, the system disadvantageously becomes extremely hydrophobic due to the alicyclic hydrocarbon site introduced, as a result, the resist may not be developed with an aqueous tetramethylammonium hydroxide (hereinafter referred to as "TMAH") solution which has been heretofore widely used as a developer for resists or there may arise a phenomenon such that the resist falls off from the substrate during the development.

With an attempt to overcome this hydrophobitization of the resist, an organic solvent such as isopropyl alcohol is mixed in the developer. This gains a certain result but still suffers from problems such as swelling of the resist film or the cumbersome process. From the standpoint of improving the resist, a large number of techniques have been proposed, for example, the hydrophobitization ascribable to various alicyclic hydrocarbon sites is compensated for by introducing a hydrophilic group.

JP-A-10-10739 discloses an energy-sensitive resist material containing a polymer obtained by polymerizing a monomer having an alicyclic structure such as norbornene ring in the main chain, a maleic acid anhydride and a monomer having a carboxyl group. JP-A-10-111569 discloses a radiation-sensitive resin composition containing a resin having an alicyclic skeleton in the main chain and a radiation-sensitive acid generator. JP-A-11-109632 discloses use of a resin containing a polar group-containing alicyclic functional group and an acid-decomposable group, for a radiation-sensitive material.

The resin having an acid-decomposable group, which is used in the photoresist for far ultraviolet exposure, generally contains an aliphatic cyclic hydrocarbon group within the molecule at the same time. Therefore, the resin becomes hydrophobic and there arise problems attributable to it. For overcoming the problems, various techniques have been aggressively investigated as described above, however, these techniques are insufficient in many points (particularly in the developability) and improvements are demanded.

That is, the technique of using a light source of emitting a far ultraviolet ray of short wavelength, for example, an ArF excimer laser (193 nm) is still in need of improvements in view of the developability. To speak specifically, the problem is the development failure, scum (development residue) or edge roughness. Furthermore, the defocus latitude depended on line pitch is also in need of improvements. Devices in recent years have a tendency to contain various patterns, therefore, the resist is required to have various capabilities. One of these capabilities is the defocus latitude on line pitch. More specifically, a device has a portion where lines are crowded, a pattern where the space is broad as compared with lines, and isolated lines. Therefore, it is important to resolve various lines with high reproducibility. However, reproduction of various lines cannot be easily attained because of optical factors and the resist is not yet succeeded in undertaking the part of solving this problem at present. In particular, the above-described resist system containing an alicyclic group conspicuously varies in the reproducibility between the isolated pattern and the crowded pattern, and improvements are being demanded.

For the coating solvent of naphthoquinone-diazide/novolak resin-base positive photoresists, glycol ethers, glycol ether esters such as 2-methoxyethanol and 2-ethoxyethanol, acetates thereof such as ethylene glycol monomethyl ether acetate and ethylene glycol monoethyl ether acetate have been heretofore commonly used.

However, these solvents have problems in the toxicity, the coatability, the storage stability of the solution, the resist performance and the like, and improvements thereof are demanded.

The coatability, the storage stability of the solution and the resist performance are, as well known, attributes to the constituent components such as binder polymer and photoacid generator and at the same time greatly fluctuated by the solvent. As such, the resist solvent is demanded to satisfy all requirements with respect to the coatability, the storage stability of the solution, the safety, the resist performance and the development failure, however, the fact is that such a solvent has been not known for the chemical amplification resist using a polymer having an alicyclic hydrocarbon skeleton.

SUMMARY OF THE INVENTION

Thus, conventional photoresist compositions in known arts cannot respond to the recently required performance in the sensitivity, the resolution or the adhesion to a substrate. Moreover, scumming or edge roughness is generated or a stable pattern cannot be obtained. Under these circumstances, more improvements are being demanded.

Accordingly, an object of the present invention is to provide a chemical amplification-type positive photoresist composition favored with high sensitivity, high resolution and good adhesion to a substrate and improved in the edge roughness of a pattern.

Another object of the present invention is to solve the problems encountered in the techniques for improving the capabilities inherent in the above-described microphotofabrication using far ultraviolet rays, particularly ArF excimer laser rays, more specifically, to provide a positive photoresist composition excellent in the sensitivity, resolution, dry etching resistance and adhesion to a substrate and freed from the problems occurring at the development, namely, generation of development failure, scumming or edge roughness.

Still another object of the present invention is to provide a positive photoresist composition for far ultraviolet exposure, favored with an excellent defocus latitude depended on line pitch.

Still another object of the present invention is to provide a positive photoresist composition for far ultraviolet exposure, favored with an excellent defocus latitude depended on line pitch and improved in the edge roughness of a pattern.

As a result of extensive studies on the constituent materials of a resist composition in the positive chemical amplification system, the present inventors have found that the objects of the present invention can be attained by using an acid-decomposable resin having a specific lactone structure. The present invention has been accomplished based on this finding.

Furthermore, as a result of extensive studies on the constituent material of a resist composition in the positive chemical amplification system, the present inventors have found that the objects of the present invention can be attained by using the above-described specific acid-decomposable resin and additionally a specific additive. The present invention has been accomplished based on this finding.

More specifically, the objects of the present invention can be attained by the following constructions.

(1) A positive photoresist composition comprising (A) a compound capable of generating an acid upon irradiation with actinic rays or radiation and (B) a resin capable of decomposing under the action of an acid to increase the solubility in alkali, containing a repeating unit having a group represented by the following formula (I):

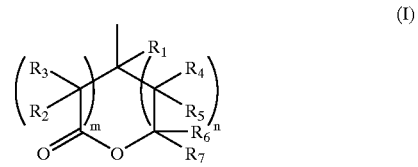

(I)

wherein $R_1$ represents hydrogen atom or an alkyl group having from 1 to 4 carbon atoms, which may have a substituent, $R_2$ to $R_7$, which may be the same or different, each represents hydrogen atom, an alkyl group which may have a substituent, a cycloalkyl group which may have a substituent or an alkenyl group which may have a substituent, provided that at least one of $R_6$ and $R_7$ is a group exclusive of hydrogen atom and $R_6$ and $R_7$ may combine to form a ring, and m and n each independently represents 0 or 1, provided that m and n are not 0 at the same time.

(2) The positive photoresist composition as described in (1) above, wherein the resin (B) further contains a repeating unit having an alkali-soluble group protected by at least one group containing an alicyclic hydrocarbon structure represented by the following formula (pI), (pII), (pIII), (pIV), (pV) or (pVI):

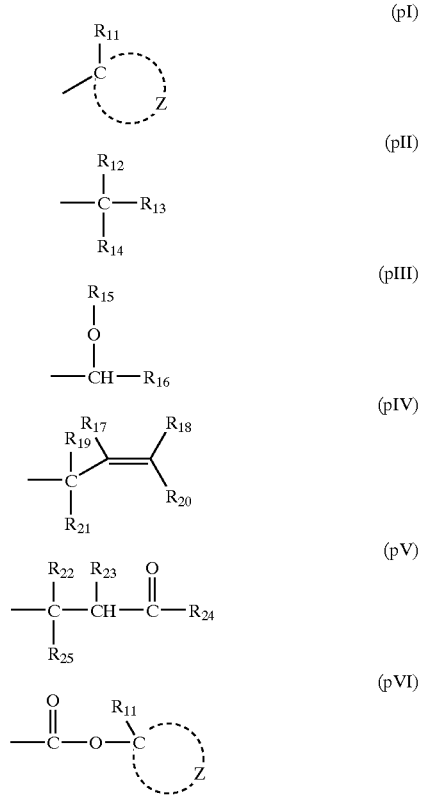

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{14}$ each independently represents a linear or branched alkyl group having from 1 to 4 carbon atoms or an alicyclic hydrocarbon group having from 1 to 4 carbon atoms, provided that at least one of $R_{12}$ to $R_{14}$ or either one of $R_{15}$ and $R_{16}$ represents an alicyclic hydrocarbon group; $R_{17}$ to $R_{21}$ each independently represents hydrogen atom, a linear or branched alkyl group having from 1 to 4 carbon atoms or an alicyclic hydrocarbon group having from 1 to 4 carbon atoms, provided that at least one of $R_{17}$ to $R_{21}$ represents an alicyclic hydrocarbon group and either one of $R_{19}$ and $R_{21}$ represents a linear or branched alkyl group having from 1 to 4 carbon atoms or an alicyclic hydrocarbon group having from 1 to 4 carbon atoms; and $R_{22}$ to $R_{25}$ each independently represents a linear or branched alkyl group having from 1 to 4 carbon atoms or an alicyclic hydrocarbon group having from 1 to 4 carbon atoms, provided that at least one of $R_{22}$ to $R_{25}$ represents an alicyclic hydrocarbon group.

(3) A positive photoresist composition as described in (2) above, wherein the alicyclic hydrocarbon structure-containing group represented by formula (pI), (pII), (pIII), (pIV), (pV) or (pVI) is a group represented by formula (II):

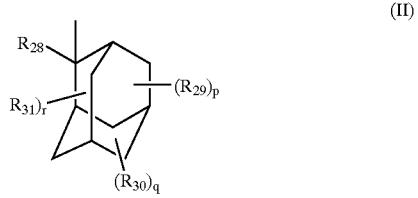

wherein $R_{28}$ represents an alkyl group which may have a substituent, $R_{29}$ to $R_{31}$, which may be the same or different, each represents a hydroxy group, a halogen atom, a carboxy group, an alkyl group which may have a substituent, a cycloalkyl group which may have a substituent, an alkenyl group which may have a substituent, an alkoxy group which may have a substituent, an alkoxycarbonyl group which may have a substituent or an acyl group which may have a substituent, and p, q and r each independently represents 0 or an integer of 1 to 3.

(4) The positive photoresist composition as described in any one of (1) to (3) above, wherein the resin (B) contains a repeating unit represented by the following formula (a):

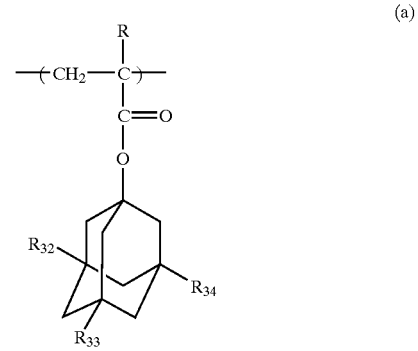

wherein R represents hydrogen atom, a halogen atom, a substituted or unsubstituted alkyl group having from 1 to 4 carbon atoms, and $R_{32}$ to $R_{34}$, which may be the same or different, each represents hydrogen atom or a hydroxyl group, provided that at least one of $R_{32}$ to $R_{34}$ represents a hydroxyl group.

(5) The positive photoresist composition as described in any one of (1) to (4) above, which further contains an acid diffusion inhibitor.

(6) The positive photoresist composition as described in any one of (1) to (5) above, wherein the compound (A) is a sulfonium salt compound of sulfonium or iodonium.

(7) The positive photoresist composition as described in any one of (1) to (5) above, wherein the compound (A) is a sulfonate compound of N-hydroxyimide or a disulfonyldiazomethane compound.

(8) The positive photoresist composition as described in any one of (1) to (7) above, wherein the exposure light used is a far ultraviolet ray at a wavelength of 150 to 220 nm.

(9) A positive photoresist composition for far ultraviolet exposure, comprising:

(A) a compound capable of generating an acid upon irradiation with actinic rays or radiation, (B) a resin capable of decomposing under the action of an acid to increase the solubility in alkali, containing a repeating unit having a group represented by the following formula (I), and (C) a fluorine-containing and/or silicon-containing surfactant:

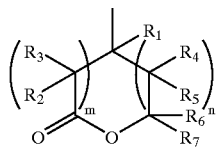

(I)

wherein $R_1$ represents hydrogen atom or an alkyl group having from 1 to 4 carbon atoms, which may have a substituent, $R_2$ to $R_7$, which may be the same or different, each represents hydrogen atom, an alkyl group which may have a substituent, a cycloalkyl group which may have a substituent or an alkenyl group which may have a substituent, provided that at least one of $R_6$ and $R_7$ is a group exclusive of hydrogen atom and $R_6$ and $R_7$ may combine to form a ring, and m and n each independently represents 0 or 1, provided that m and n are not 0 at the same time.

(10) The positive photoresist composition for far ultraviolet exposure as described in (9) above, wherein the resin (B) further contains a repeating unit having an alkali-soluble group protected by at least one group containing an alicyclic hydrocarbon structure represented by the following formula (pI), (pII), (pIII), (pIV), (pV) or (pVI):

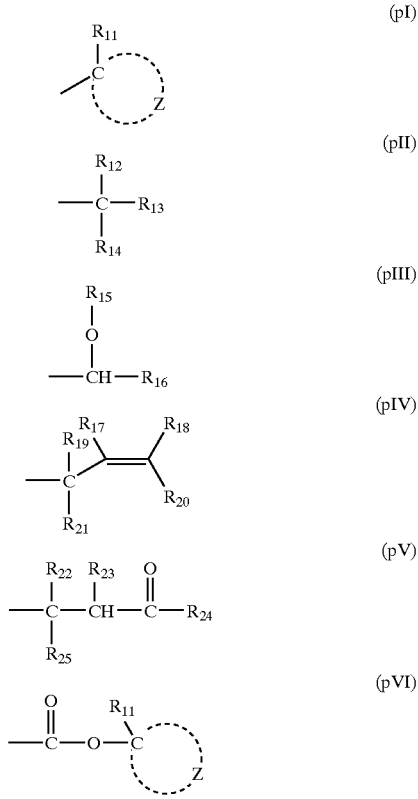

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represents a linear or branched alkyl group having from 1 to 4 carbon atoms or an alicyclic hydrocarbon group having from 1 to 4 carbon atoms, provided that at least one of $R_{12}$ to $R_{14}$ or either one of $R_{15}$ and $R_{16}$ represents an alicyclic hydrocarbon group; $R_{17}$ to $R_{21}$ each independently represents hydrogen atom, a linear or branched alkyl group having from 1 to 4 carbon atoms or an alicyclic hydrocarbon group having from 1 to 4 carbon atoms, provided that at least one of $R_{17}$ to $R_{21}$ represents an alicyclic hydrocarbon group and either one of $R_{19}$ and $R_{21}$ represents a linear or branched alkyl group having from 1 to 4 carbon atoms or an alicyclic hydrocarbon group having from 1 to 4 carbon atoms; and $R_{22}$ to $R_{25}$ each independently represents a linear or branched alkyl group having from 1 to 4 carbon atoms or an alicyclic hydrocarbon group having from 1 to 4 carbon atoms, provided that at least one of $R_{22}$ to $R_{25}$ represents an alicyclic hydrocarbon group.

(11) The positive photoresist composition for far ultraviolet exposure as described in (10) above, wherein the group containing an alicyclic hydrocarbon structure represented by the following formula (pI), (pII), (pIII), (pIV), (pV) or (pVI) is a group represented by the following formula (II):

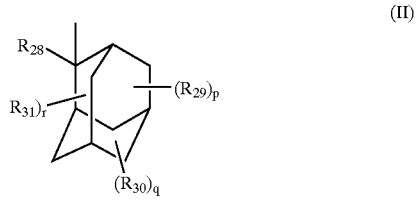

(II)

wherein $R_{28}$ represents an alkyl group which may have a substituent, $R_{29}$ to $R_{31}$, which may be the same or different, each represents a hydroxy group, a halogen atom, a carboxy group, an alkyl group which may have a substituent, a cycloalkyl group which may have a substituent, an alkenyl group which may have a substituent, an alkoxy group which may have a substituent, an alkoxycarbonyl group which may have a substituent or an acyl group which may have a substituent, and p, q and r each independently represents 0 or an integer of 1 to 3.

(12) The positive photoresist composition for far ultraviolet exposure as described in any one of (9) to (11) above, wherein the resin (B) contains a repeating unit represented by the following formula (a):

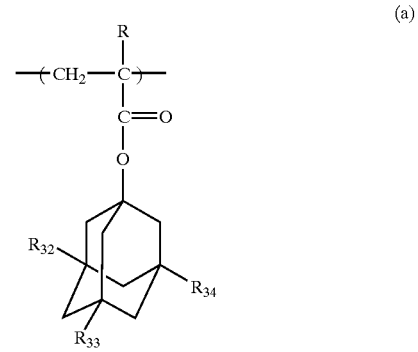

(a)

wherein R represents hydrogen atom, a halogen atom, a substituted or unsubstituted alkyl group having from 1 to 4 carbon atoms, and $R_{32}$ to $R_{34}$, which may be the same or different, each represents hydrogen atom or a hydroxyl group, provided that at least one of $R_{32}$ to $R_{34}$ represents a hydroxyl group.

(13) The positive photoresist composition for far ultraviolet exposure as described in any one of (9) to (12) above, which further contains an acid diffusion inhibitor.

(14) The positive photoresist composition for far ultraviolet exposure as described in any one of (9) to (12) above, wherein the acid diffusion inhibitor is a nitrogen-containing basic compound and the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2] octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

(15) The positive photoresist composition for far ultraviolet exposure as described in any one of (9) to (14) above, wherein the compound (A) is a sulfonic acid salt compound of sulfonium or iodonium.

(16) The positive photoresist composition for far ultraviolet exposure as described in any one of (9) to (14) above, wherein the compound (A) is a sulfonate compound of N-hydroxyimide or a disulfonyldiazomethane compound.

(17) The positive photoresist composition for far ultraviolet exposure as described in any one of (9) to (16) above, wherein the exposure light used is a far ultraviolet ray at a wavelength of 150 to 220 nm.

(18) A positive photoresist composition for far ultraviolet exposure, comprising:

(A) a compound capable of generating an acid upon irradiation with actinic rays or radiation, (B) a resin capable of decomposing under the action of an acid to increase the solubility in alkali, containing a repeating unit having a group represented by the following formula (I), and (D) a solvent containing the following solvent (a) in an amount of 60 to 90 wt % based on the entire solvent:

(a) at least one first solvent selected from propylene glycol monomethyl ether acetate, propylene glycol monomethyl ether propionate, methyl 3-methoxypropionate, ethyl 3-methoxypropionate, methyl 3-ethoxypropionate and ethyl 3-ethoxypropionate.

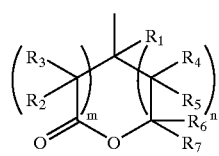

(I)

wherein $R_1$ represents hydrogen atom or an alkyl group having from 1 to 9 carbon atoms, which may have a substituent, $R_2$ to $R_7$, which may be the same or different, each represents hydrogen atom, an alkyl group which may have a substituent, a cycloalkyl group which may have a substituent or an alkenyl group which may have a substituent, provided that at least one of $R_6$ and $R_7$ is a group exclusive of hydrogen atom and $R_6$ and $R_7$ may combine to form a ring, and m and n each independently represents 0 or 1, provided that m and n are not 0 at the same time.

(19) The positive photoresist composition for far ultraviolet exposure as described in (18) above, wherein the resin (B) further contains a repeating unit having an alkali-soluble group protected by at least one group containing an alicyclic hydrocarbon structure represented by the following formula (pI), (pII), (pIII), (pIV), (pV) or (pVI):

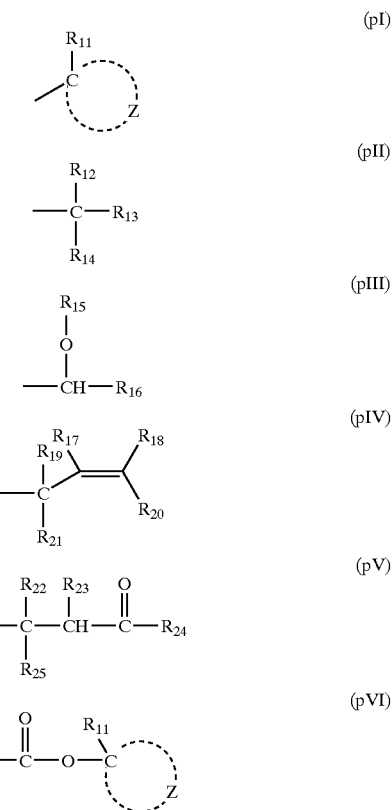

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represents a linear or branched alkyl group having from 1 to 4 carbon atoms or an alicyclic hydrocarbon group having from 1 to 4 carbon atoms, provided that at least one of $R_{12}$ to $R_{14}$ or either one of $R_{15}$ and $R_{16}$ represents an alicyclic hydrocarbon group; $R_{17}$ to $R_{21}$ each independently represents hydrogen atom, a linear or branched alkyl group having from 1 to 4 carbon atoms or an alicyclic hydrocarbon group having from 1 to 4 carbon atoms, provided that at least one of $R_{17}$ to $R_{21}$ represents an alicyclic hydrocarbon group and either one of $R_{19}$ and $R_{21}$ represents a linear or branched alkyl group having from 1 to 4 carbon atoms or an alicyclic hydrocarbon group having from 1 to 4 carbon atoms; and $R_{22}$ to $R_{25}$ each independently represents a linear or branched alkyl group having from 1 to 4 carbon atoms or an alicyclic hydrocarbon group having from 1 to 4 carbon atoms, provided that at least one of $R_{22}$ to $R_{25}$ represents an alicyclic hydrocarbon group.

(20) The positive photoresist composition for far ultraviolet exposure as described in (19) above, wherein the group containing an alicyclic hydrocarbon structure represented by the following formula (pI), (pII), (pIII), (pIV), (pV) or (pVI) is a group represented by the following formula (II):

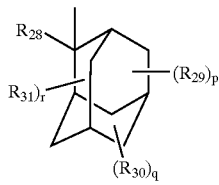

(II)

wherein $R_{28}$ represents an alkyl group which may have a substituent, $R_{29}$ to $R_{31}$, which may be the same or different, each represents a hydroxy group, a halogen atom, a carboxy group, an alkyl group which may have a substituent, a cycloalkyl group which may have a substituent, an alkenyl group which may have a substituent, an alkoxy group which may have a substituent, an alkoxycarbonyl group which may have a substituent or an acyl group which may have a substituent, and p, q and r each independently represents 0 or an integer of 1 to 3.

(21) The positive photoresist composition for far ultraviolet exposure as described in any one of (18) to (20) above, wherein the resin (B) contains a repeating unit represented by the following formula (a):

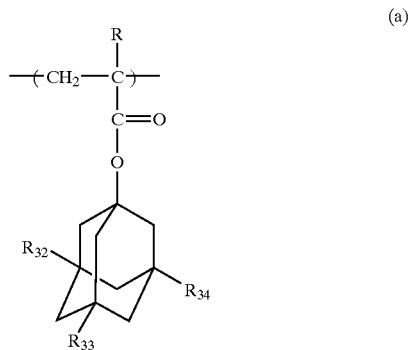

(a)

wherein R represents hydrogen atom, a halogen atom, a substituted or unsubstituted alkyl group having from 1 to 4 carbon atoms, and $R_{32}$ to $R_{34}$, which may be the same or different, each represents hydrogen atom or a hydroxyl group, provided that at least one of $R_{32}$ to $R_{34}$ represents a hydroxyl group.

(22) The positive photoresist composition for far ultraviolet exposure as described in any one of (18) to (21) above, which further contains an acid diffusion inhibitor.

(23) The positive photoresist composition for far ultraviolet exposure as described in any one of (18) to (22) above, wherein the compound (A) is a sulfonic acid salt compound of sulfonium or iodonium.

(24) The positive photoresist composition for far ultraviolet exposure as described in any one of (18) to (22) above, wherein the compound (A) is a sulfonate compound of N-hydroxyimide or a disulfonyldiazomethane compound.

(25) The positive photoresist composition for far ultraviolet exposure as described in any one of (18) to (24) above, wherein the exposure light used is a far ultraviolet ray at a wavelength of 150 to 220 nm.

DETAILED DESCRIPTION OF THE INVENTION

The compounds for use in the present invention are described in detail below.

(A) Compound Capable of Generating Acid Upon Irradiation with Actinic Rays or Radiation (Photo-acid Generator)

The photo-acid generator (A) for use in the present invention is a compound which generates an acid upon irradiation with actinic rays or radiation.

Examples of the photo-acid generator for use in the present invention include a photocationic polymerization initiator, a photoradical polymerization initiator, a photodecoloring agent for dyes, a photo-discoloring agent and a compound capable of generating an acid upon irradiation with a known ray used for microresist or the like (for example, ultraviolet or far ultraviolet ray of 200 to 400 nm, preferably g-line, h-line, i-line and KrF excimer laser ray), an ArF excimer laser ray (193 nm), an $F_2$ excimer laser ray (157 nm), an electron beam, an X ray, a molecular beam or an ion beam. These may be appropriately selected and used either individually or in combination.

Other examples of the photo-acid generator for use in the present invention include onium salts such as diazonium salt, ammonium salt, phosphonium salt, iodonium salt, sulfonium salt, selenonium salt and arsonium salt; organic halogen compounds; organic metals/organic halides; photo-acid generators having an o-nitrobenzyl type protective group; compounds capable of photochemically decomposing to generate a sulfonic acid, such as iminosulfonate; disulfone compounds; diazoketosulfone; and diazosulfone compounds.

In addition, compounds obtained by introducing the above-described group or compound capable of generating an acid upon irradiation with light into the main chain or a side chain of a polymer may also be used.

Furthermore, compounds capable of generating an acid upon irradiation of light described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778, European Patent 126, 712 and the like may also be used.

Out of these compounds capable of decomposing upon irradiation with actinic rays or radiation and thereby generating an acid, particularly effective compounds are described below.

(1) Oxazole Derivative Represented by Formula (PAG1) and S-Triazine Derivative Represented by Formula (PAG2), Each Substituted by Trihalomethyl Group:

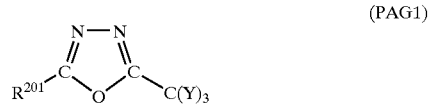

(PAG1)

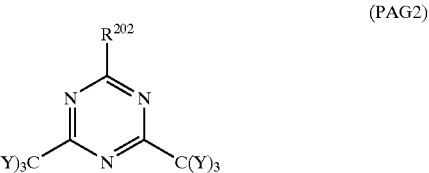

(PAG2)

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or $-C(Y)_3$, and Y represents chlorine atom or bromine atom.

Specific examples thereof include the following compounds, however, the present invention is by no means limited thereto.
(PAG1-1)
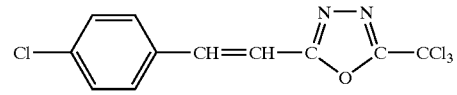
(PAG1-2)
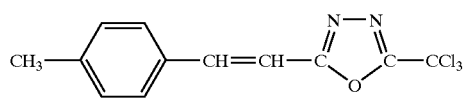
(PAG1-3)
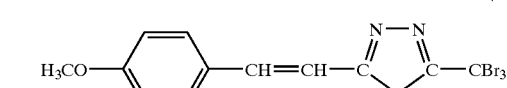
(PAG1-4)
(PAG1-5)
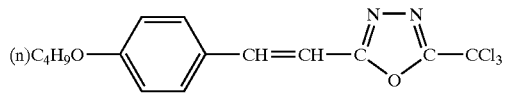
(PAG1-6)
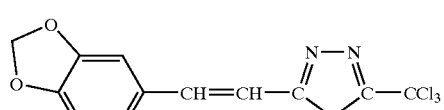
(PAG1-7)
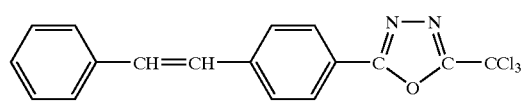
(PAG1-8)
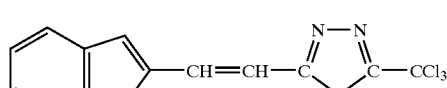
(PAG2-1)
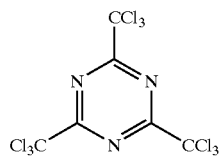
(PAG2-2)
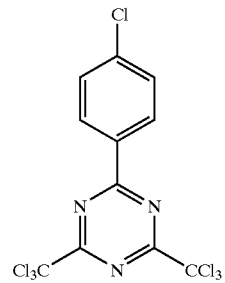
-continued
(PAG2-3)
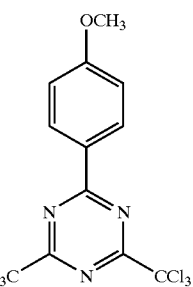
(PAG2-4)
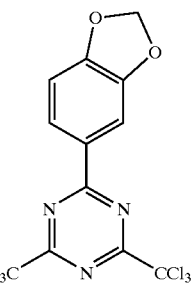
(PAG2-5)
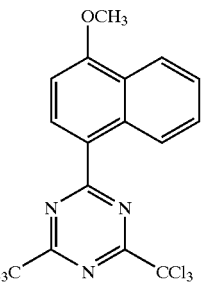
(PAG2-6)
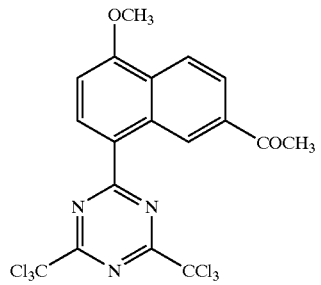
(PAG2-7)
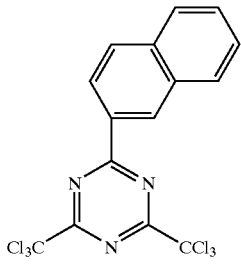

-continued (PAG2-8)

(PAG2-9)

(PAG2-10)

(2) Iodonium Salt Represented by Formula (PAG3) and Sulfonium Salt Represented by Formula (PAG4):

(PAG3)

(PAG4)

wherein $Ar^1$ and $Ar^2$ each independently represents a substituted or unsubstituted aryl group, $R^{203}$, $R^{204}$ and $R^{205}$ each independently represents a substituted or unsubstituted alkyl group or a substituted or unsubstituted aryl group, $Z^-$ represents a counter anion and examples thereof include $BF_4^-$, $AsF_2^-$, $PF_6^-$, $SbF_6^-$, $SiF_6^{2-}$, $ClO_4^-$, perfluoroalkane sulfonate anion such as $CF_3SO_3^-$, toluenesulfonate anion, substituted benzenesulfonate anion such as dodecylbenzenesulfonate anion and pentafluorobenzenesulfonate anion, condensed polynuclear aromatic sulfonate anion such as naphthalene-1-sulfonate anion and anthraquinone-sulfonate anion, and sulfonic acid group-containing dye, but the present invention is by no means limited thereto.

Two of $R^{203}$, $R^{204}$ and $R^{205}$, and $Ar^1$ and $Ar^2$ in respective pairs may be bonded through a single bond or a substituent.

Specific examples thereof include the following compounds, however, the present invention is by no means limited thereto.

(PAG3-1)

(PAG3-2)

(PAG3-3)

(PAG3-4)

(PAG3-5)

(PAG3-6)

(PAG3-7)

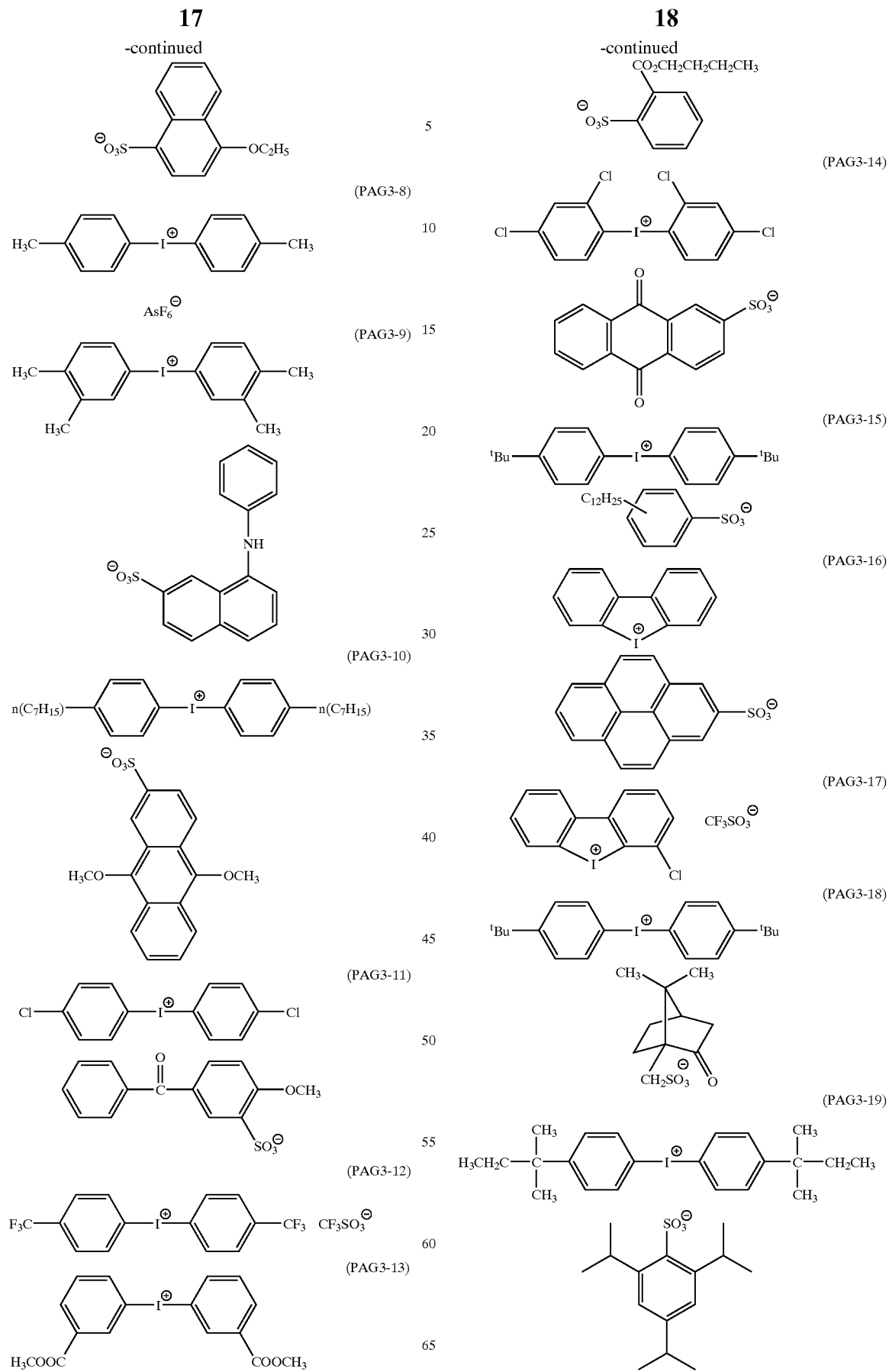

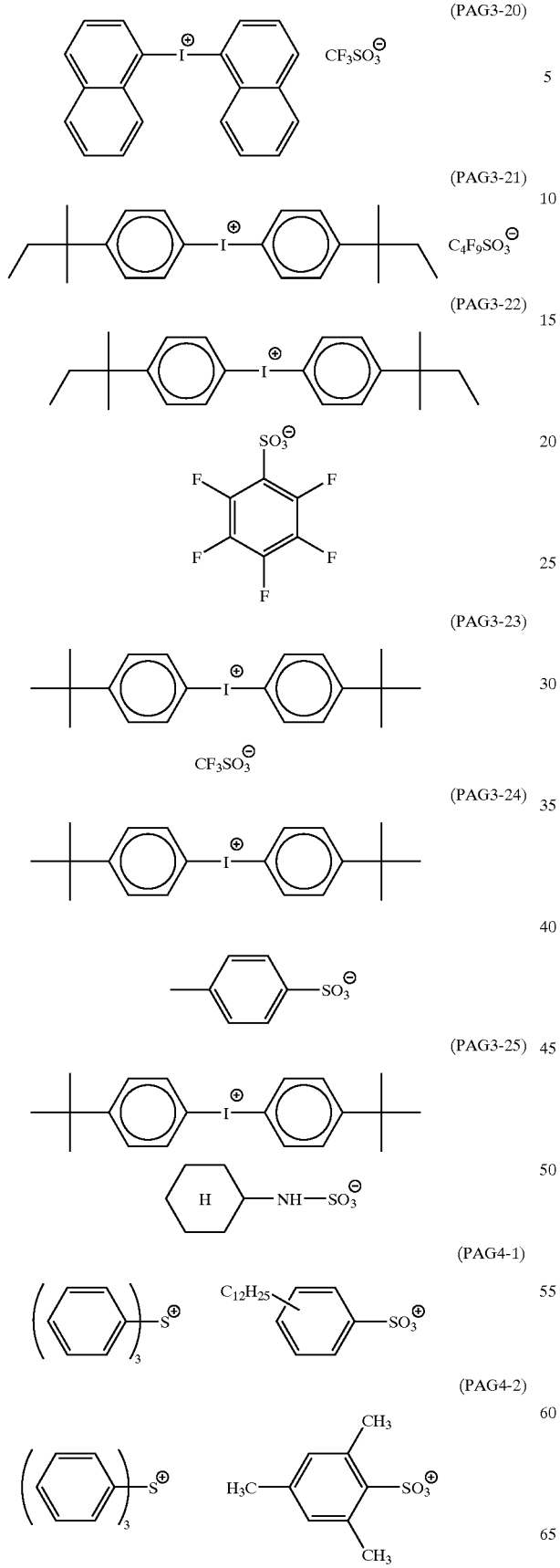
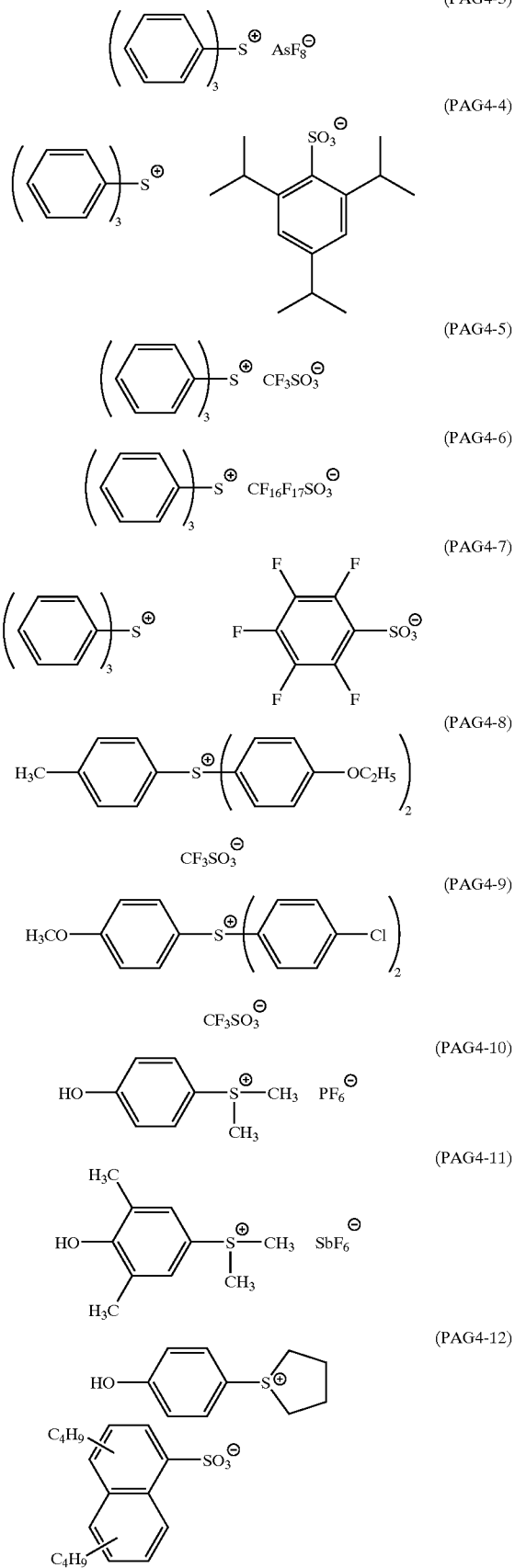

(PAG4-13)
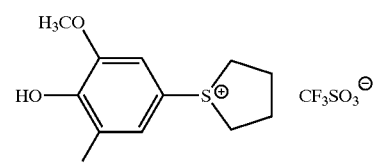
(PAG4-14)
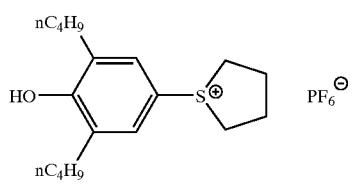
(PAG4-15)
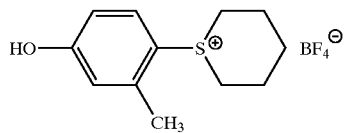
(PAG4-16)
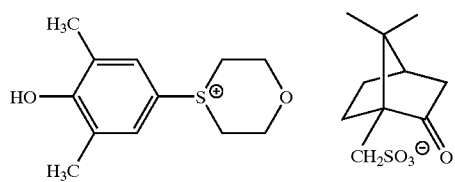
(PAG4-17)
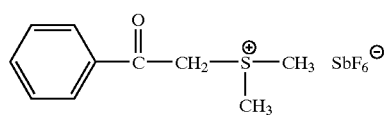
(PAG4-18)
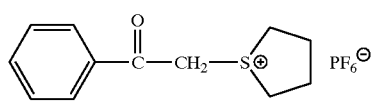
(PAG4-19)
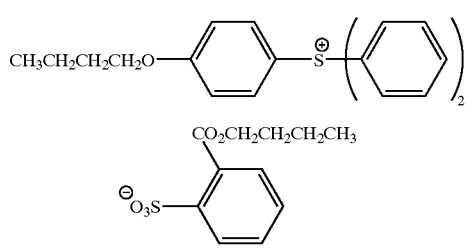
(PAG4-20)
(PAG4-21)
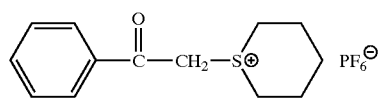
(PAG4-22)
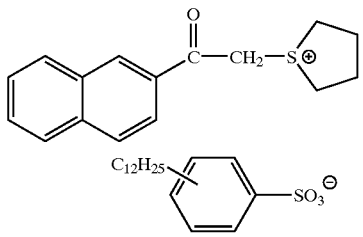
(PAG4-23)
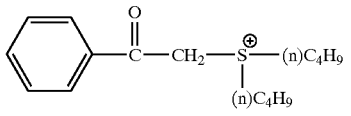
(PAG4-24)
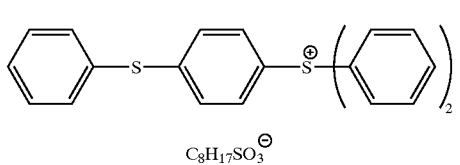
(PAG4-25)
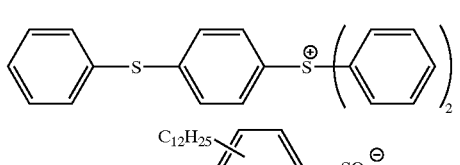
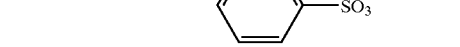
(PAG4-26)
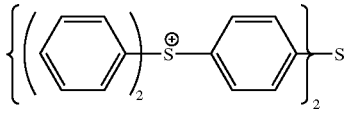
(PAG4-27)
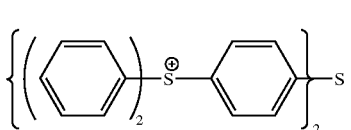
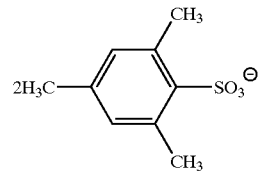
(PAG4-28)
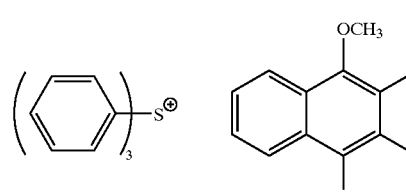
(PAG4-29)
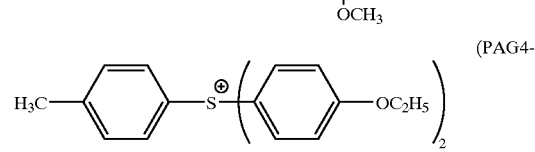

-continued

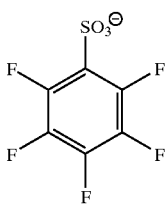
(PAG4-30)

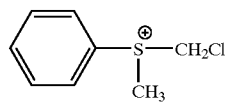
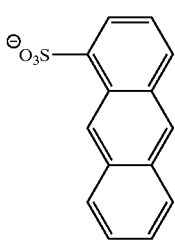
(PAG4-31)

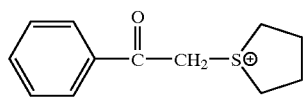
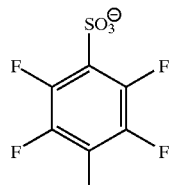
(PAG4-32)

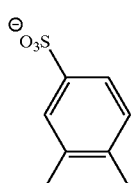
(PAG4-33)

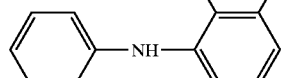

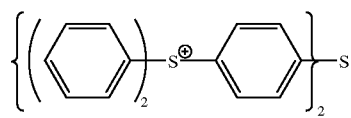
(PAG4-34)

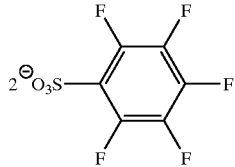

-continued

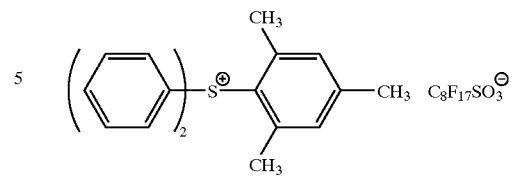
(PAG4-35)

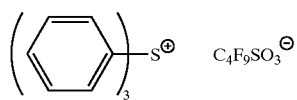
(PAG4-36)

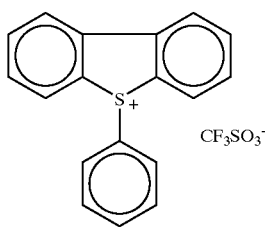
(PAG4-37)

The above-mentioned onium salts represented by formulae (PAG3) and (PAG4) are known and may be synthesized by a method described, for example, in J. W. Knapczyl et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polym. Chem. Ed.*, 18, 2677 (1980), U.S. Pat. Nos. 2,807,648 and 4,247,473, JP-A-53-101331.

(3) Disulfonic Acid Derivative Represented by Formula (PAG5) and Imidosulfonate Derivative Represented by Formula (PAG6):

$$Ar^3-SO_2-SO_2-Ar^4 \quad \text{(PAG5)}$$

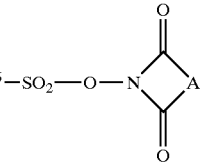
(PAG6)

wherein $Ar^3$ and $Ar^4$ each independently represents a substituted or unsubstituted aryl group, $R^{206}$ represents a substituted or unsubstituted alkyl group or a substituted or unsubstituted aryl group, and A represents a substituted or unsubstituted alkylene group, a substituted or unsubstituted alkenylene group or a substituted or unsubstituted arylene group.

Specific examples thereof include the following compounds, however, the present invention is by no means limited thereto.

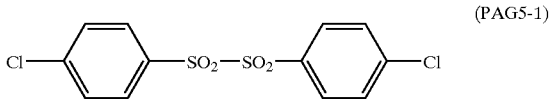
(PAG5-1)

(PAG5-2)
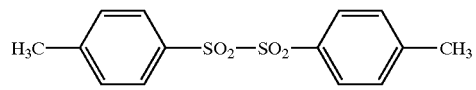
(PAG5-3)
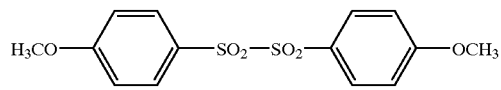
(PAG5-4)
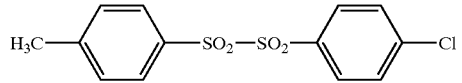
(PAG5-5)
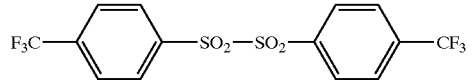
(PAG5-6)
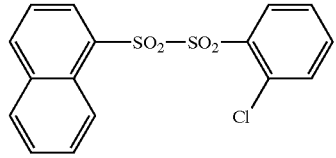
(PAG5-7)
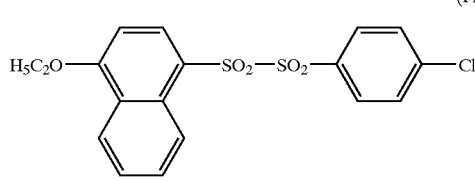
(PAG5-8)
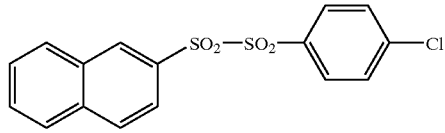
(PAG5-9)
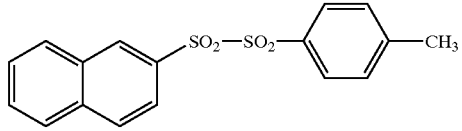
(PAG5-10)
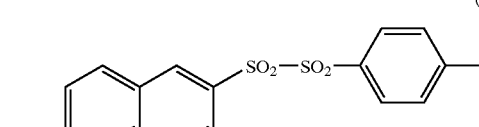
(PAG5-11)
(PAG5-12)
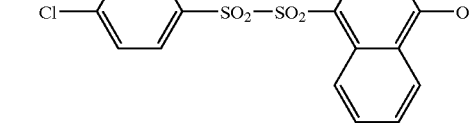
(PAG5-13)
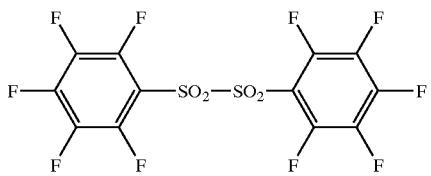
(PAG5-14)
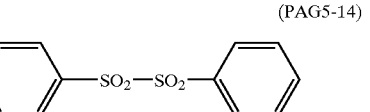
(PAG5-15)
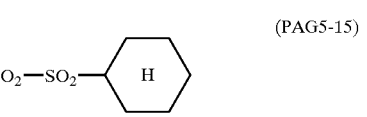
(PAG6-1)
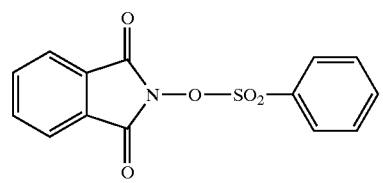
(PAG6-2)
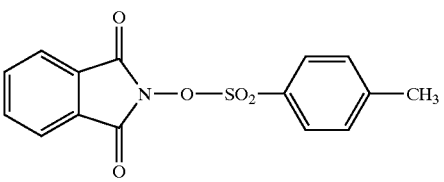
(PAG6-3)
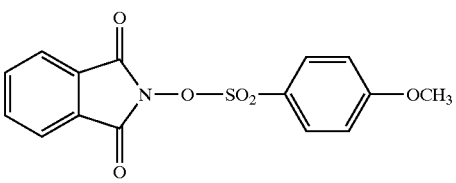
(PAG6-4)
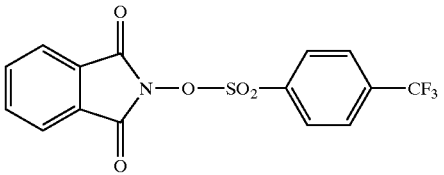
(PAG6-5)
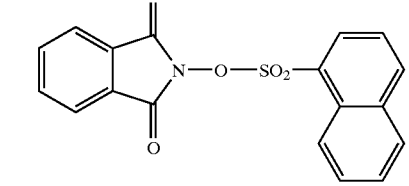

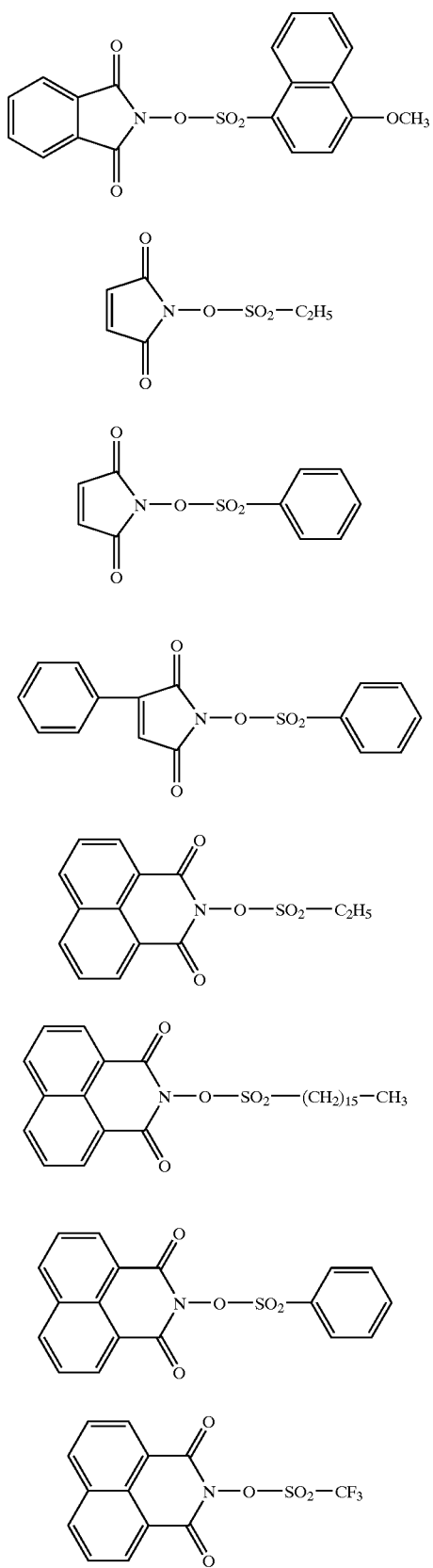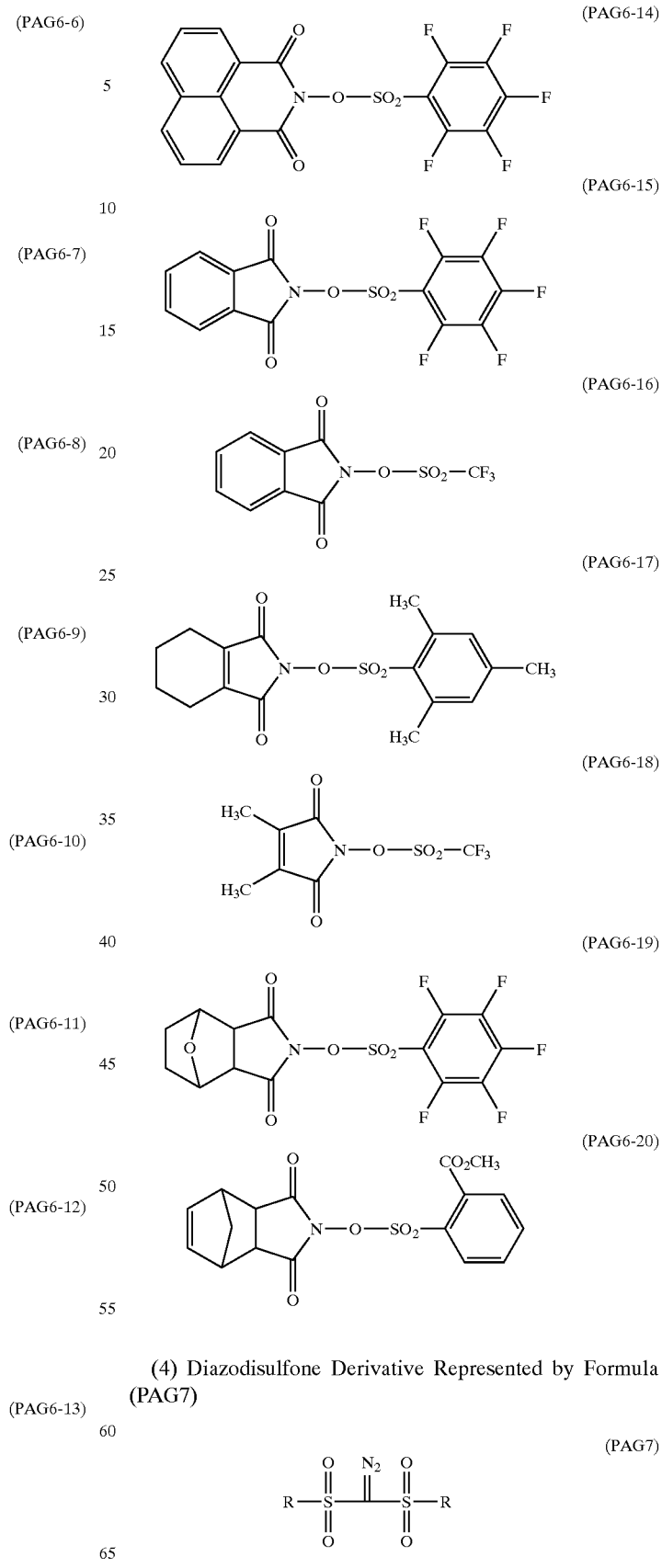
(4) Diazodisulfone Derivative Represented by Formula (PAG7)

wherein R represents a linear, branched or cyclic alkyl group or an aryl group which may be substituted.

Specific examples thereof include the following compounds, however, the present invention is not limited thereto.

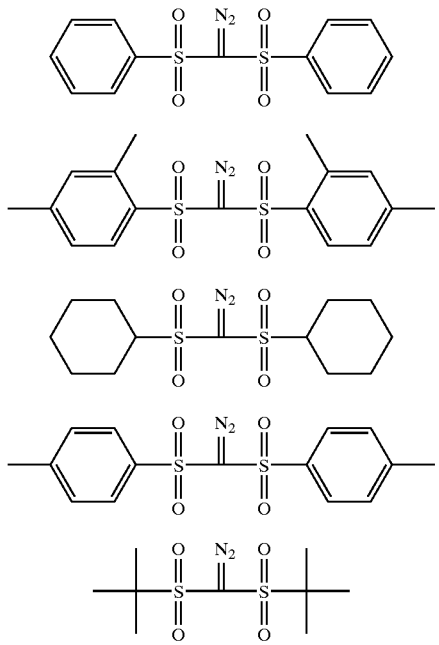

(PAG7-1)
(PAG7-2)
(PAG7-3)
(PAG7-4)
(PAG7-5)

In the present invention, the photo-acid generator is preferably a sulfonic acid salt compound of sulfonium or iodonium (more preferably a compound represented by formula (PAG3) or (PAG4)), a sulfonate compound of N-hydroxyimide (more preferably a compound represented by formula (PAG6)) or a disulfonyldiazomethane compound (more preferably a compound represented by formula (PAG7)). By using such a photo-acid generator, high sensitivity and excellent resolution can be obtained and the fine pattern formed can be highly improved in the edge roughness.

The photo-acid generator is usually added in an amount of, based on the solid content in the composition, 0.001 to 40 wt %, preferably 0.01 to 20 wt %, more preferably 0.1 to 5 wt %. If the amount of the photo-acid generator added is less than 0.001 wt %, the sensitivity decreases, whereas if the added amount exceeds 40 wt %, the resist is excessively increased in the light absorption to disadvantageously cause deterioration of the profile or narrowing of the process (particularly, bake) margin.

(B) Resin Capable of Decomposing Under Action of Acid to Increase Solubility in Alkali The resin (B) capable of increasing the solubility in alkali under the action of an acid (hereinafter sometimes simply referred to as a "resin (B)"), for use in the present invention, contains a repeating unit having a group represented by formula (I).

In formula (I), the alkyl group having from 1 to 4 carbon atoms represented by $R_1$, which may have a substituent, includes a linear or branched alkyl group having from 1 to 4 carbon atoms. Examples of the alkyl group include a methyl group, an ethyl group, an n-propyl group, an isopropyl group, an n-butyl group, an isobutyl group, a sec-butyl group and a tert-butyl group.

The alkyl group represented by $R_2$ to $R_7$ includes a linear or branched alkyl group which may have a substituent. The linear or branched alkyl group is preferably a linear or branched alkyl group having from 1 to 12 carbon atoms, more preferably a linear or branched alkyl group having from 1 to 10 carbon atoms, still more preferably a methyl group, an ethyl group, a propyl group, an isopropyl group, an n-butyl group, an isobutyl group, an sec-butyl group, a tert-butyl group, a pentyl group, a hexyl group, a heptyl group, an octyl group, a nonyl group or a decyl group.

The cycloalkyl group represented by $R_2$ to $R_7$ is preferably a cycloalkyl group having from 3 to 8 carbon atoms, such as cyclopropyl group, cyclopentyl group, cyclohexyl group, cycloheptyl group and cyclooctyl group.

The alkenyl group represented by $R_2$ to $R_7$ is preferably an alkenyl group having from 2 to 6 carbon atoms, such as vinyl group, propenyl group, butenyl group and hexenyl group.

Examples of the ring formed as a result of combining of $R_6$ and $R_7$ include 3- to 8-membered rings such as cyclopropane ring, cyclobutane ring, cyclopentane ring, cyclohexane ring and cyclooctane ring.

Examples of the substituent of these alkyl group, cycloalkyl group and alkenyl group include an alkoxy group having from 1 to 4 carbon atoms, a halogen atom (e.g., fluorine, chlorine, bromine, iodine), an acyl group, an acyloxy group, a cyano group, a hydroxy group, a carboxy group, an alkoxycarbonyl group and a nitro group.

In the present invention, at least one of $R_6$ and $R_7$ is a group exclusive of hydrogen atom, preferably an alkyl group having from 1 to 10 carbon atoms, a cycloalkyl group having 3 to 8 carbon atoms or an alkenyl group having 2 to 6 carbon atoms, more preferably an alkyl group having 1 to 6 carbon atoms.

In the present invention, $R_2$ to $R_4$ each is preferably an alkyl group having from 1 to 10 carbon atoms, a cycloalkyl group having from 3 to 8 carbon atoms or an alkenyl group having from 2 to 6 carbon atoms, more preferably an alkyl group having from 1 to 6 carbon atoms.

m and n each represents 0 or 1, provided that m and n are not 0 at the same time.

The repeating unit having a group represented by formula (I) is preferably a repeating unit represented by the following formula (AI):

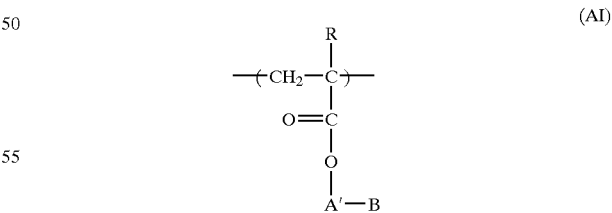

(AI)

wherein R has the same meaning as R in formula (a) which is described later, A' represents a single bond, an ether group, an ester group, a carbonyl group, an alkylene group or a divalent group comprising a combination thereof, and B represents a group represented by formula (I). Examples of the divalent group comprising the above-described combination, represented by A', include the groups represented by the following formulae:

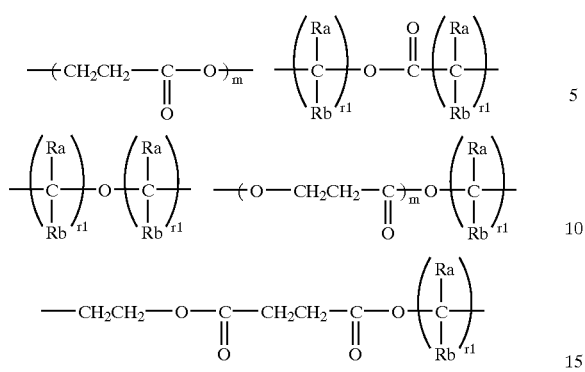
wherein Ra, Rb and r1 have the same meanings as defined later, and m is an integer of 1 to 3.
Specific examples of the repeating unit represented by formula (AI) are set forth below, however, the present invention is by no means limited thereto.
(I-1)
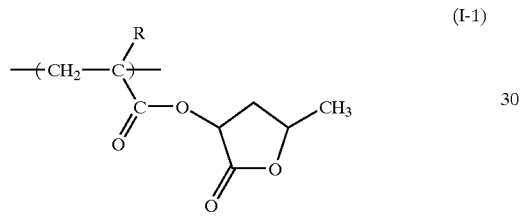
(I-2)
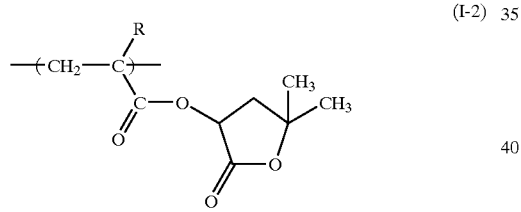
(I-3)
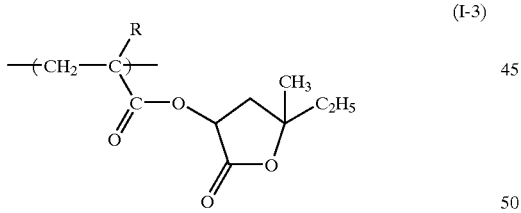
(I-4)
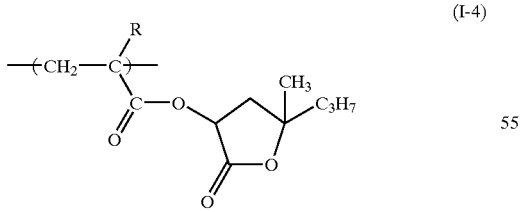
(I-5)
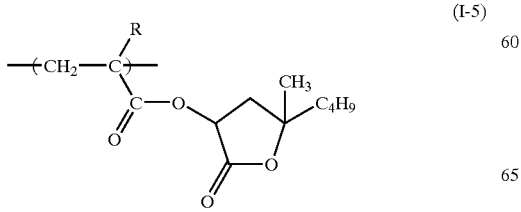
(I-6)
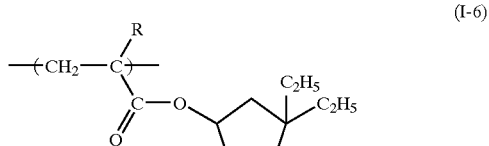
(I-7)
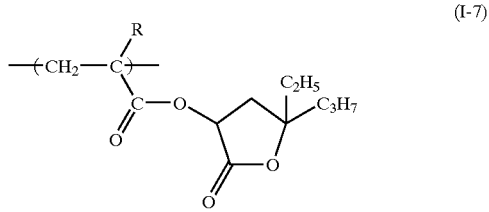
(I-8)
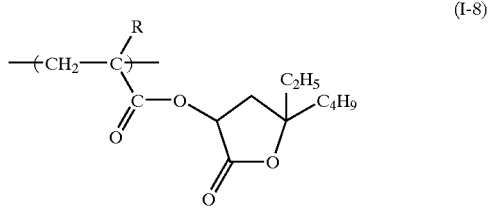
(I-9)
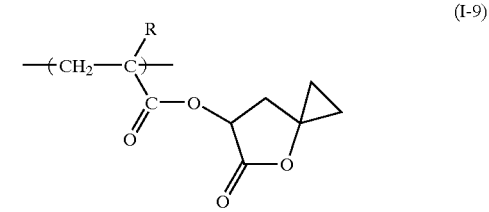
(I-10)
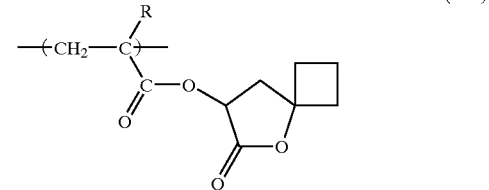
(I-11)
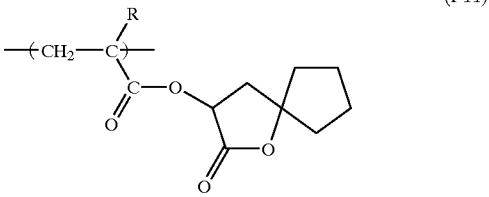
(I-12)
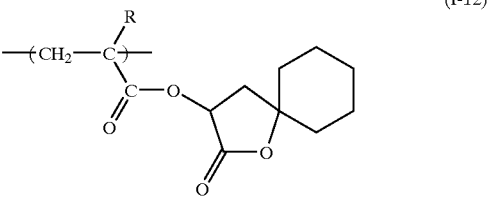
(I-13)
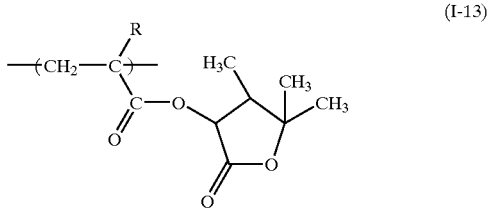

(I-14)
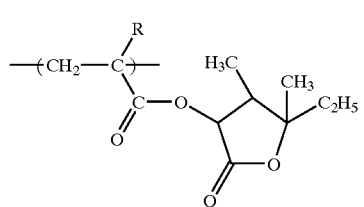
(I-15)
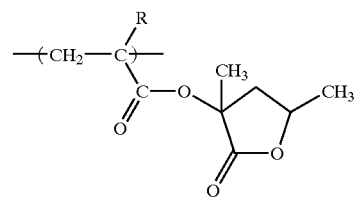
(I-16)
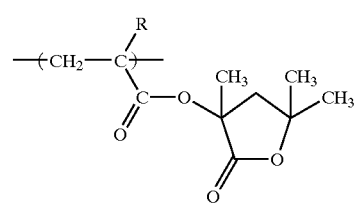
(I-17)
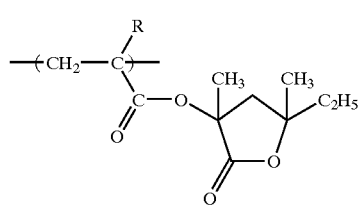
(I-18)
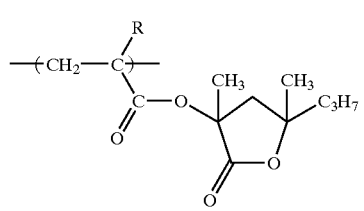
(I-19)
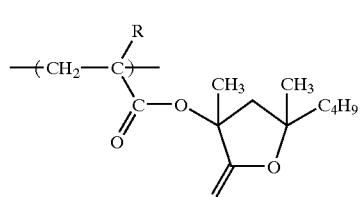
(I-20)
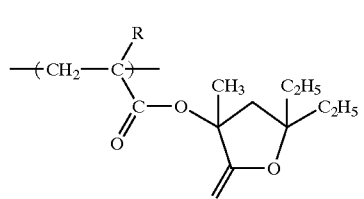
(I-21)
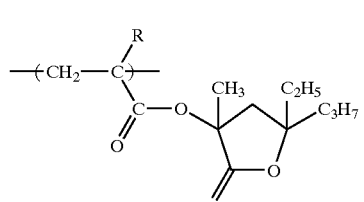
(I-22)
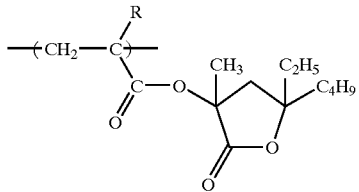
(I-23)
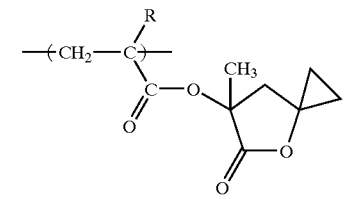
(I-24)
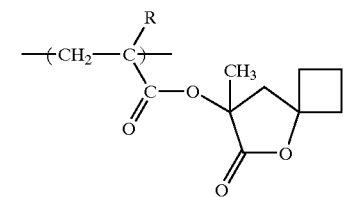
(I-25)
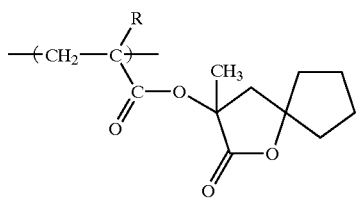
(I-26)
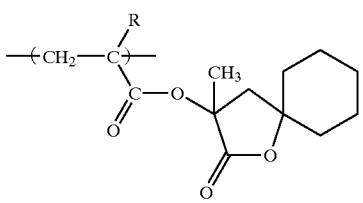
(I-27)
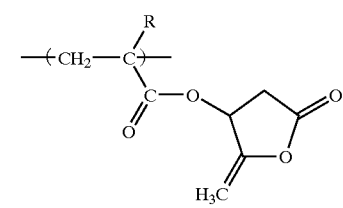
(I-28)
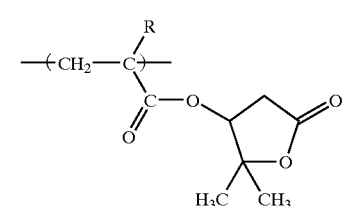
(I-29)
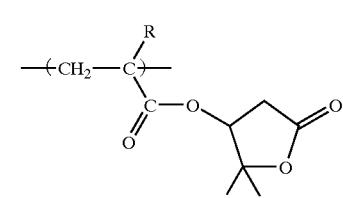

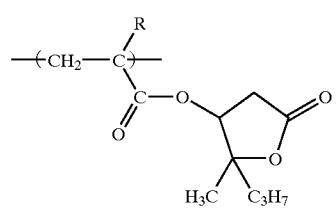 (I-30)
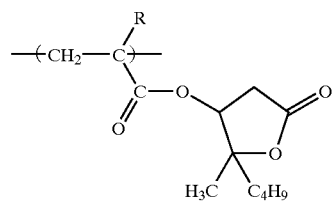 (I-31)
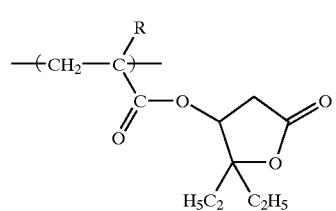 (I-32)
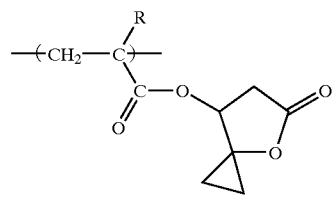 (I-33)
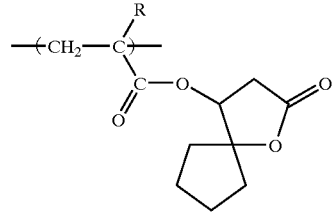 (I-34)
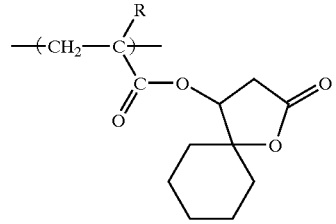 (I-35)
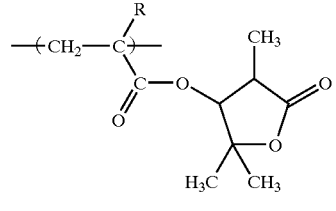 (I-36)
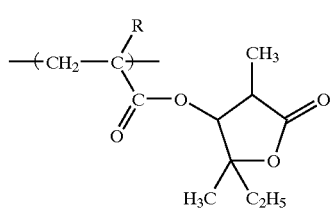 (I-37)
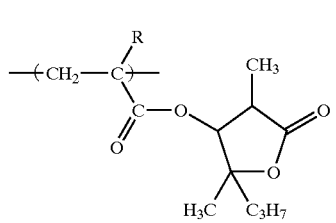 (I-38)
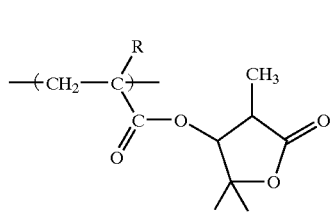 (I-39)
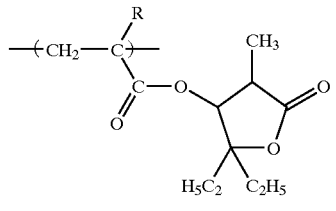 (I-40)
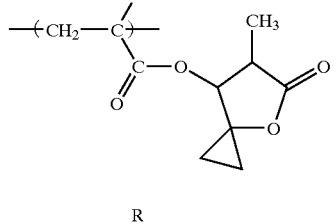 (I-41)
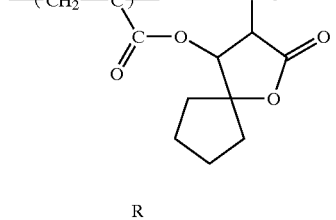 (I-42)
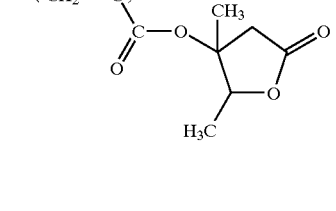 (I-43)

-continued

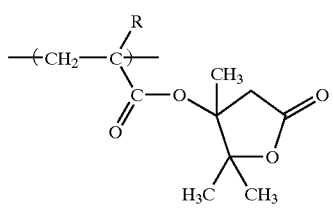 (I-44)

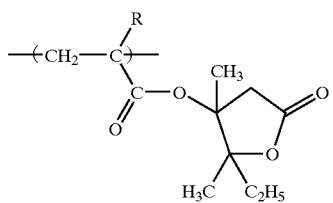 (I-45)

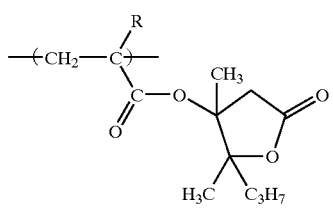 (I-46)

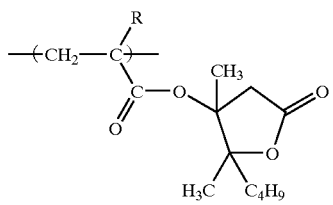 (I-47)

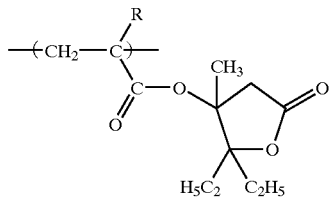 (I-48)

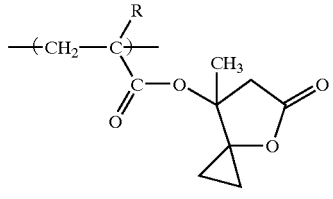 (I-49)

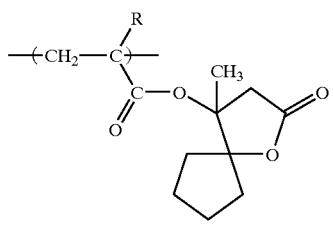 (I-50)

-continued

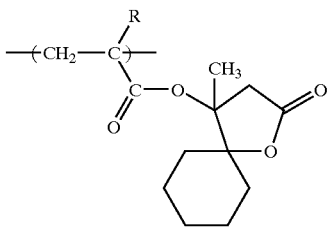 (I-51)

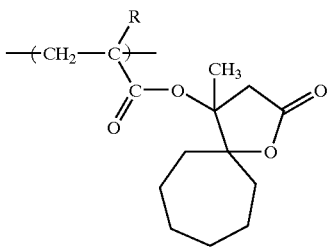 (I-52)

In the present invention, the resin (B) preferably contains a repeating unit having an alkali-soluble group protected by at least one group containing an alicyclic hydrocarbon structure represented by formula (pI), (pII), (pIII), (pIV), (pV) or (pVI), because the effect of the present invention can be more outstandingly brought out.

In formulae (pI) to (pVI), the alkyl group represented by $R_{12}$ to $R_{25}$ represents a linear or branched alkyl group having from 1 to 4 carbon atoms, which may be either substituted or unsubstituted. Examples of the alkyl group include a methyl group, an ethyl group, an n-propyl group, an isopropyl group, an n-butyl group, an isobutyl group, a sec-butyl group and a tert-butyl group.

Examples of the substituent of the alkyl group include an alkoxy group having from 1 to 4 carbon atoms, a halogen atom (e.g., fluorine, chlorine, bromine, iodine), an acyl group, an acyloxy group, a cyano group, a hydroxy group, a carboxy group, an alkoxycarbonyl group and a nitro group.

The alicyclic hydrocarbon group represented by $R_{11}$ to $R_{25}$ and the alicyclic hydrocarbon group formed by Z and the carbon atom may be either monocyclic or polycyclic. Specific examples thereof include a group having 5 to more carbon atoms having a monocyclo-, bicyclo-, tricyclo, tetracyclo-structure. The carbon atom number is preferably from 6 to 30, more preferably from 7 to 25. These alicyclic hydrocarbon group each may have a substituent.

Examples of the structure in the alicyclic moiety of the group containing an alicyclic hydrocarbon structure are shown below.

 (1)

 (2)

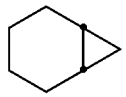 (3)

-continued
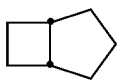
(4)
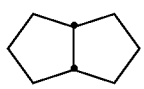
(5)
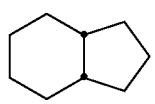
(6)
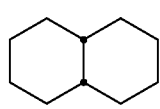
(7)
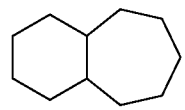
(8)
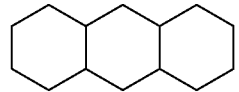
(9)
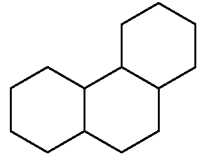
(10)
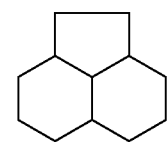
(11)
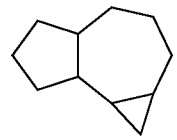
(12)
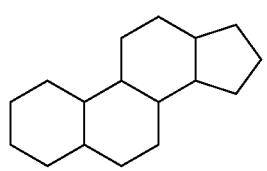
(13)
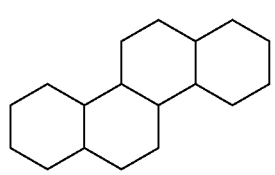
(14)
-continued
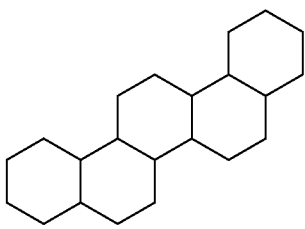
(15)
(16)
(17)
(18)
(19)
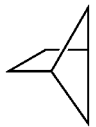
(20)
(21)
(22)
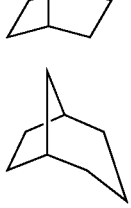
(23)
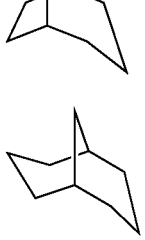
(24)
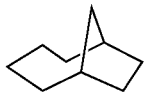
(25)
(26)

-continued

(27) 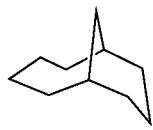

(28) 

(29) 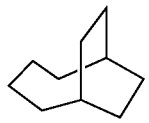

(30) 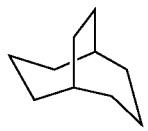

(31) 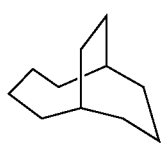

(32) 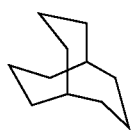

(33) 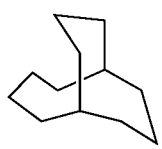

(34) 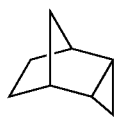

(35) 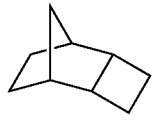

(36) 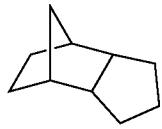

(37) 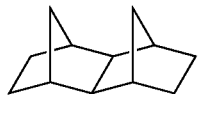

(38) 

-continued

(39) 

(40) 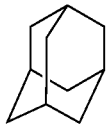

(41) 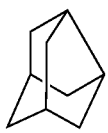

(42) 

(43) 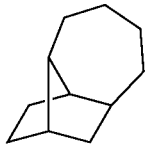

(44) 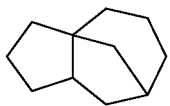

(45) 

(46) 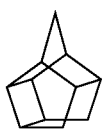

(47) 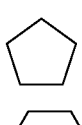

(48) 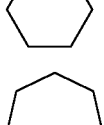

(49) 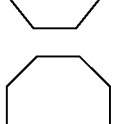

(50) 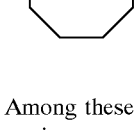

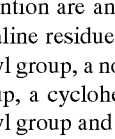

Among these alicyclic moieties, preferred in the present invention are an adamantyl group, a noradamantyl group, a decaline residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decaline residue, a norbornyl group, a cedrol group, a cyclohexyl group, a cycloheptyl group, a cyclooctyl group, a cyclodecanyl group and a cyclododecanyl group.

Examples of the substituent of the alicyclic hydrocarbon group include an alkyl group, a substituted alkyl group, a cycloalkyl group, an alkenyl group an acyl group, a halogen atom, a hydroxyl group, an alkoxy group, a carboxy group and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. Examples of the substituent of the substituted alkyl group include a hydroxyl group, a halogen atom and an alkoxy group.

Examples of the alkoxy group (inclusive of the alkoxy group of the alkoxycarbonyl group) include an alkoxy group having from 1 to 4 carbon atoms, such as methoxy group, ethoxy group, propoxy group and butoxy group.

Examples of the cycloalkyl group include a cyclopropyl group, a cyclopentyl group and a cyclohexyl group.

Examples of the alkenyl group include an alkenyl group having from 2 to 6 carbon atoms and specific examples thereof include a vinyl group, a propenyl group, an allyl group, a butenyl group, a pentenyl group and a hexenyl group.

Examples of the acyl group include an acetyl group, an ethylcarbonyl group and a propylcarbonyl group. Examples of the halogen atom include chlorine atom, bromine atom, iodine atom and fluorine atom.

Among the structures represented by formulae (pI) to (pVI), preferred is formula (pI), more preferred is a group represented by formula (II). Examples of the alkyl group represented by $R_{28}$ in formula (II) and examples of the halogen atom, alkyl group, cycloalkyl group, alkenyl group, alkoxy group, alkoxycarbonyl group and acyl group represented by any one of $R_{29}$ to $R_{31}$ include those described above as examples of the substituent of the alicyclic hydrocarbon group.

Examples of the alkali-soluble group protected by a structure represented by formula (pI), (pII), (pIII), (pIV), (pV) or (pVI) in the resin include various groups known in this technical field. Specific examples thereof include a carboxylic acid group, a sulfonic acid group, a phenol group and a thiol group. Among these, preferred are a carboxylic acid group and a sulfonic acid group.

Preferred examples of the alkali-soluble group protected by a structure represented by formula (pI), (pII), (pIII), (pIV), (pV) or (pVI) in the resin include the groups represented by the following formulae (pVII) to (pXI):

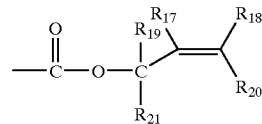
(pVII)

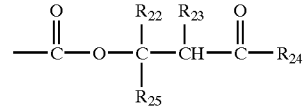
(pVIII)

(pIX)

(pX)

(pXI)

wherein $R_{11}$ to $R_{25}$ and Z have the same meanings as defined above.

The repeating unit having an alkali-soluble group protected by a structure represented by formula (pI), (pII), (pIII), (pIV), (pV) or (pVI), constituting the resin is preferably a repeating unit represented by the following formula (pA):

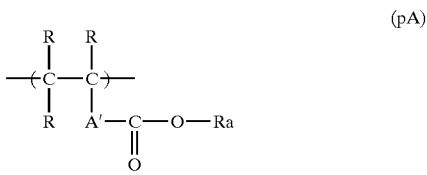
(pA)

In formula (pA), R represents hydrogen atom, a halogen atom or a substituted or unsubstituted, linear or branched alkyl group having from 1 to 4 carbon atoms, the plurality of R groups may be the same or different, and examples of the halogen atom and the alkyl group represented by R are the same as the examples of R in formula (a).

A' has the same meaning as defined above.

Ra represents any one group of (pI), (pII), (pIII), (pIV), (pV) and (pVI).

Specific examples of the monomer corresponding to the repeating unit represented by formula (pA) are set forth below.

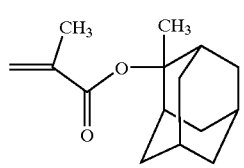
1

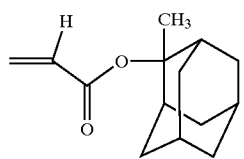
2

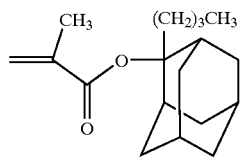
3

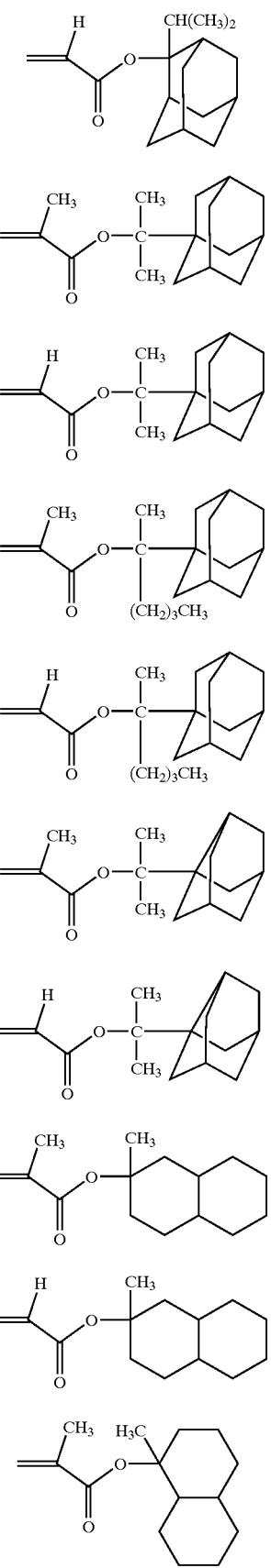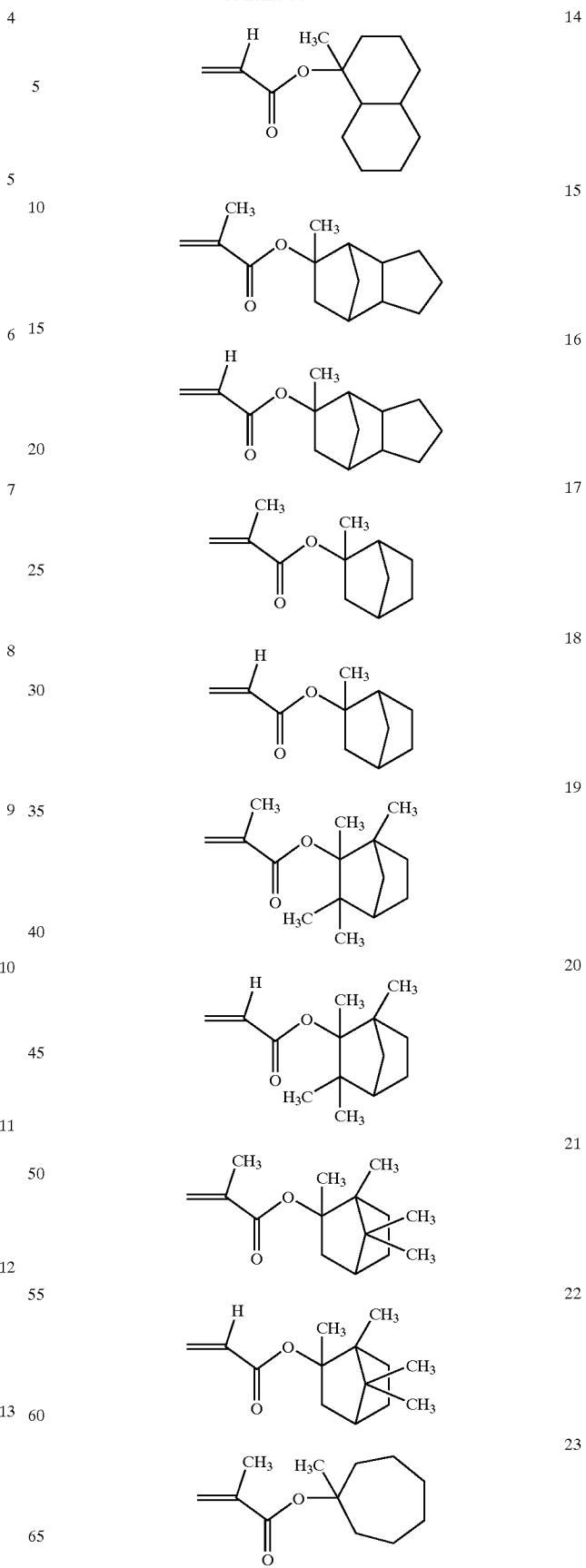

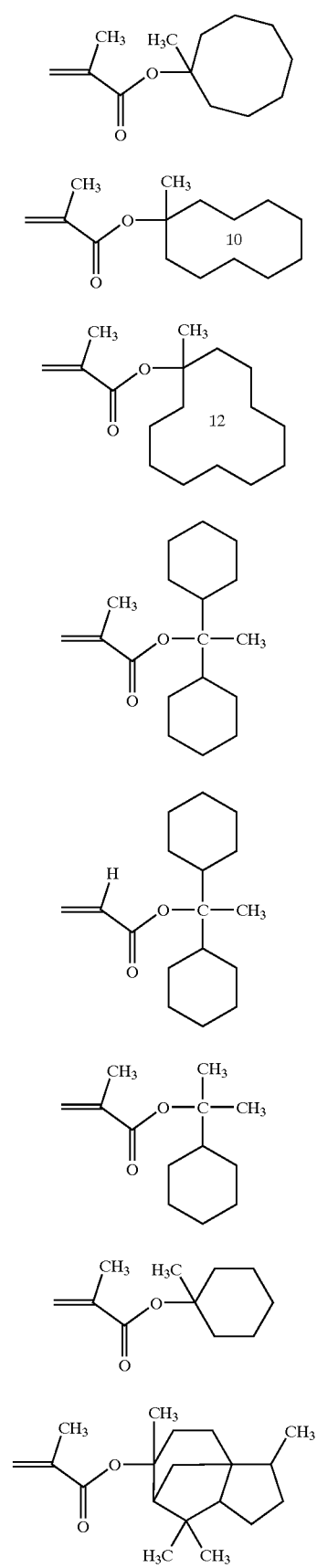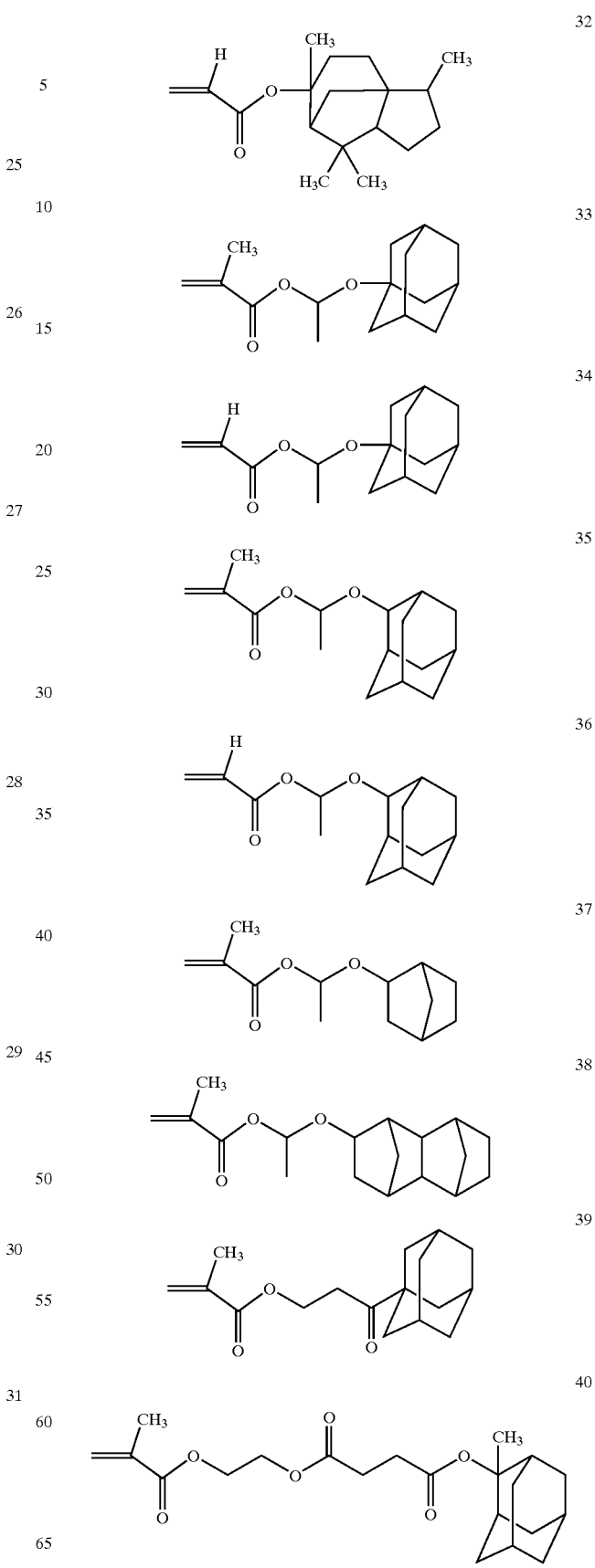

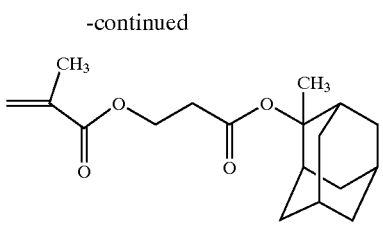

41

The resin (B) may further contain another repeating unit.

The resin (B) for use in the present invention preferably contains, as another copolymerization component, the repeating unit represented by formula (a), because the developability or the adhesive property to a substrate is improved. Examples of the alkyl group which may have a substituent, represented by R in formula (a), are the same as the examples of $R_1$ in formula (I). Examples of the halogen atom represented by R include fluorine atom, chlorine atom, bromine atom and iodine atom. In formula (a), at least one of $R_{32}$ to $R_{34}$ is a hydroxyl group, preferably a dihydroxy form or a monohydroxy form, more preferably a monohydroxy form.

The resin (B) for use in the present invention preferably further contains, as another copolymerization component, a repeating unit represented by the following formula (III-a), (III-b), (III-c) or (III-d), because the releasability of the exposure part between patterns at the development is improved and the resolution of the contact whole pattern is improved.

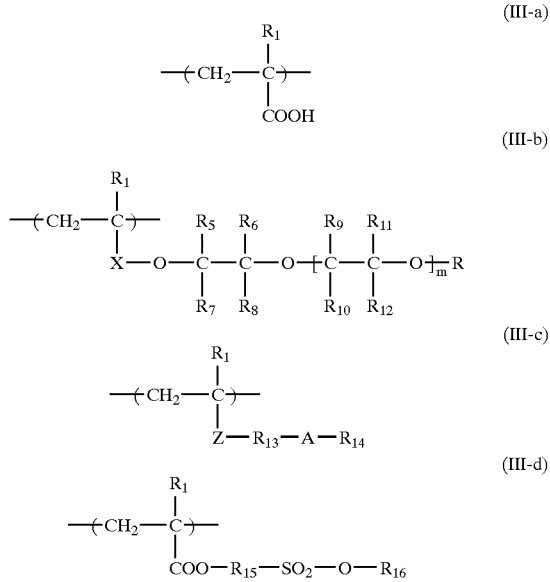

wherein $R_1$ has the same meaning as R defined above, $R_5$ to $R_{12}$ each independently represents hydrogen atom or an alkyl group which may have a substituent, R represents hydrogen atom, an alkyl group which may have a substituent, a cyclic alkyl group which may have a substituent, an aryl group which may have a substituent or an aralkyl group which may have a substituent, m represents an integer of 1 to 10, X represents a single bond, an alkylene group which may have a substituent, a cyclic alkylene group which may have a substituent, an arylene group which may have a substituent, or a divalent group which comprises one group or a combination of two or more groups selected from the group consisting of an ether group, a thioether group, a carbonyl group, an ester group, an amido group, a sulfonamido group, a urethane group and a urea group and which does not decompose under the action of an acid, Z represents a single bond, an ether group, an ester group, an amido group, an alkylene group or a divalent group comprising a combination thereof, $R_{13}$ represents a single bond, an alkylene group, an arylene group or a divalent group comprising a combination thereof, $R_{15}$ represents an alkylene group, an arylene group or a divalent group comprising a combination thereof, $R_{14}$ represents an alkyl group which may have a substituent, a cyclic alkyl group which may have a substituent, an aryl group which may have a substituent or an aralkyl group which may have a substituent, $R_{16}$ represents hydrogen atom, an alkyl group which may have a substituent, a cyclic alkyl group which may have a substituent, an alkenyl group which may have a substituent, an aryl group which may have a substituent or an aralkyl group which may have a substituent, and A represents any one of the functional groups shown below:

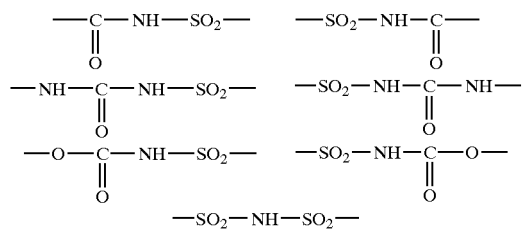

Examples of the alkyl group represented by any one of $R_5$ to $R_{12}$, R, $R_{14}$ and $R_{16}$ include a linear or branched alkyl group which may have a substituent. The linear or branched alkyl group is preferably a linear or branched alkyl group having from 1 to 12 carbon atoms, more preferably a linear or branched alkyl group having from 1 to 10 carbon atoms, still more preferably a methyl group, an ethyl group, a propyl group, an isopropyl group, an n-butyl group, an isobutyl group, a sec-butyl group, a tert-butyl group, a pentyl group, a hexyl group, a heptyl group, an octyl group, a nonyl group or a decyl group.

Examples of the cyclic alkyl group represented by R, $R_{14}$ or $R_{16}$ include a cyclic alkyl group having from 3 to 30 carbon atoms and specific examples thereof include a cyclopropyl group, a cyclopentyl group, a cyclohexyl group, an adamantyl group, a norbornyl group, a boronyl group, a tricyclodecanyl group, a dicyclopentenyl group, a norbornane epoxy group, a menthyl group, an isomenthyl group, a neomenthyl group, a tetracyclododecanyl group and a steroid residue.

Examples of the aryl group represented by R, $R_{14}$ or $R_{16}$ include an aryl group having from 6 to 20 carbon atoms, which may have a substituent. Specific examples thereof include a phenyl group, a tolyl group and a naphthyl group.

Examples of the aralkyl group represented by R, $R_{14}$ or $R_{16}$ include an aralkyl group having from 7 to 20 carbon atoms, which may have a substituent. Specific examples thereof include a benzyl group, a phenethyl group and a cumyl group.

Examples of the alkenyl group represented by $R_{16}$ include an alkenyl group having from 2 to 6 carbon atoms. Specific examples thereof include a vinyl group, a propenyl group, an allyl group, a butenyl group, a pentenyl group, a hexenyl group, a cyclopentenyl group, a cyclohexenyl group, a 3-oxocyclohexenyl group, a 3-oxocyclopentenyl group and a 3-oxoindenyl group. Among these, the cyclic alkenyl groups each may contain oxygen atom.

Examples of the linking group X include an alkylene group which may have a substituent, a cyclic alkylene group which may have a substituent, an arylene group which may have a substituent, or a divalent group which comprises one group or a combination of two or more groups selected from the group consisting of an ether group, a thioether group, a carbonyl group, an ester group, an amido group, a sulfonamido group, a urethane group and a urea group and which does not decompose under the action of an acid.

Z represents a single bond, an ether group, an ester group, an amido group, an alkylene group or a divalent group comprising a combination thereof. $R_{13}$ represents a single bond, an alkylene group, an arylene group or a divalent group comprising a combination thereof. $R_{15}$ represents an alkylene group, an arylene group or a divalent group comprising a combination thereof.

Examples of the arylene group represented by X, $R_{13}$ or $R_{15}$ include an arylene group having from 6 to 10 carbon atoms, which may have a substituent. Specific examples thereof include a phenylene group, a tolylene group and a naphthylene group.

Examples of the cyclic alkylene group represented by X include the above-described cyclic alkyl groups which are divalent.

Examples of the alkylene group represented by X, Z, $R_{13}$ or $R_{15}$ include a group represented by the following formula:

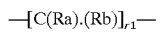

wherein Ra and Rb, which may be the same or different, each represents hydrogen atom, an alkyl group, a substituted alkyl group, a halogen atom, a hydroxyl group or an alkoxy group. The alkyl group is preferably a lower alkyl group such as methyl group, ethyl group, propyl group, isopropyl group and butyl group, more preferably a methyl group, an ethyl group, a propyl group or an isopropyl group. Examples of the substituent of the substituted alkyl group include a hydroxyl group, a halogen atom and an alkoxy group. Examples of the alkoxy group include an alkoxy group having from 1 to 4 carbon atoms, such as methoxy group, ethoxy group, propoxy group and butoxy group. Examples of the halogen atom include chlorine atom, bromine atom, fluorine atom and iodine atom. r1 represents an integer of 1 to 10.

Specific examples of the linking group X are set forth below, however, the present invention is by no means limited thereto.

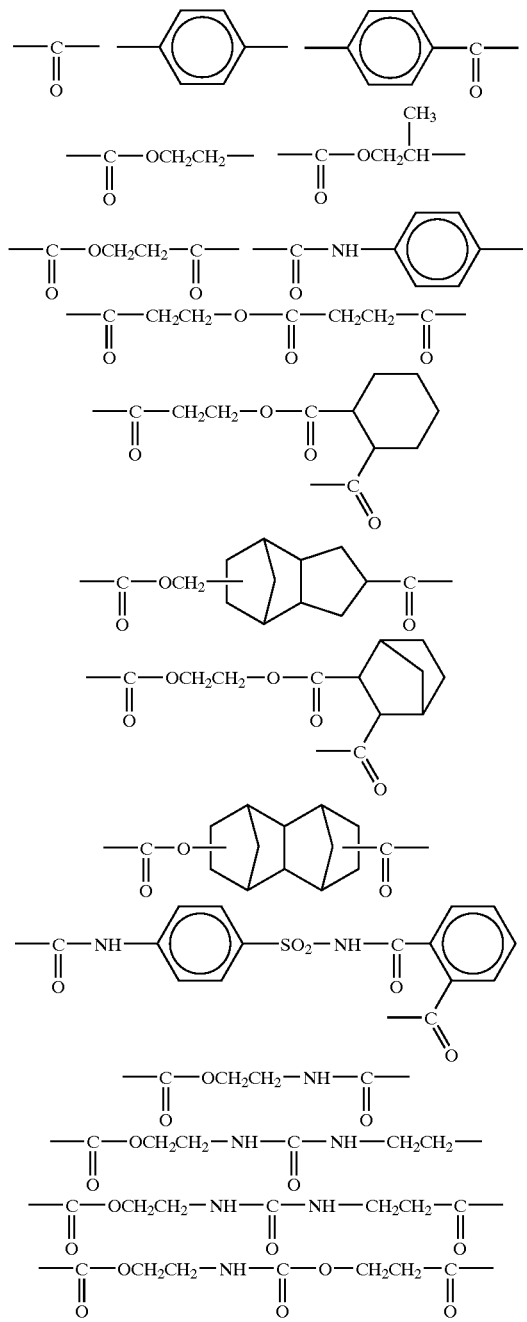

Examples of the substituent in the above-described alkyl group, cyclic alkyl group, alkenyl group, aryl group, aralkyl group, alkylene group, cyclic alkylene group and arylene group include a carboxyl group, an acyloxy group, a cyano group, an alkyl group, a substituted alkyl group, a halogen atom, a hydroxyl group, an alkoxy group, an acetylamido group, an alkoxycarbonyl group and an acyl group. Examples of the alkyl group include a lower alkyl group such as methyl group, ethyl group, propyl group, isopropyl group, butyl group, cyclopropyl group, cyclobutyl group and cyclopentyl group. Examples of the substituent of the substituted alkyl group include a hydroxyl group, a halogen atom and an alkoxy group. Examples of the alkoxy group include an alkoxy group having from 1 to 4 carbon atoms, such as methoxy group, ethoxy group, propoxy group and butoxy group. Examples of the acyloxy group include an acetoxy group. Examples of the halogen atom include chlorine atom, bromine atom, fluorine atom and iodine atom.

Specific examples of the structure of the side chain in formula (III-b) are set forth below, where specific examples of the structure of the terminal moiety exclusive of X are shown, however, the present invention is by no means limited thereto.

—O—CH$_2$CH$_2$—O—CH$_2$CH$_2$—OH
—O—CH$_2$CH$_2$—O—CH$_2$CH$_2$—O—CH$_3$
—O—CH$_2$CH$_2$—O—CH$_2$CH$_2$—O—CH$_2$CH$_3$
—O—CH$_2$CH$_2$—O—CH$_2$CH$_2$—O—CH$_2$CH$_2$—OH
—O—CH$_2$CH$_2$—O—CH$_2$CH$_2$—O—CH$_2$CH$_2$—O—CH$_3$
—O—CH$_2$CH$_2$—O—CH$_2$CH$_2$—O—CH$_2$CH$_2$—O—CH$_2$CH$_3$

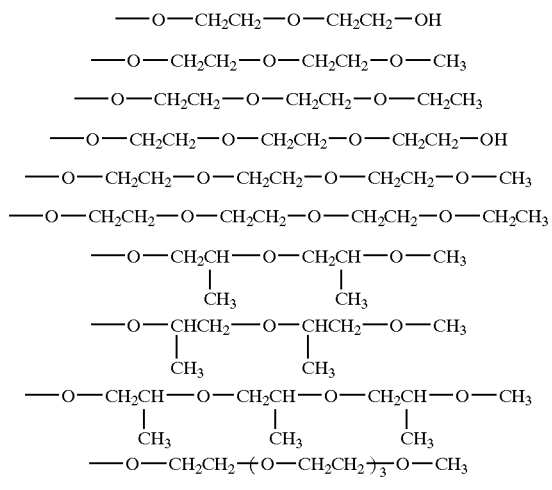

—O—CH$_2$CH$_2$—(O—CH$_2$CH$_2$)$_3$—O—CH$_3$
—O—CH$_2$CH$_2$—(O—CH$_2$CH$_2$)$_4$—O—CH$_3$

Specific examples of the monomer corresponding to the repeating structural unit represented by formula (III-c) are set forth below, however, the present invention is by no means limited thereto.

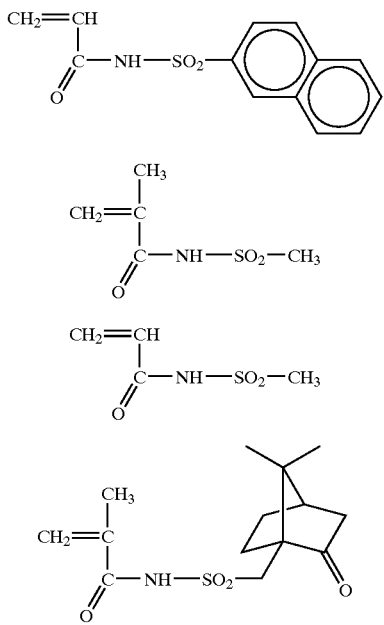

(5) 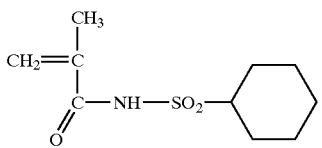

(6) 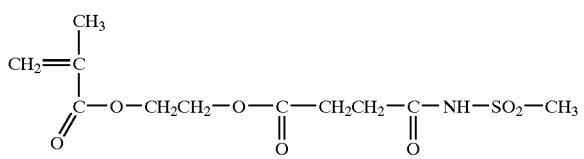

(7) 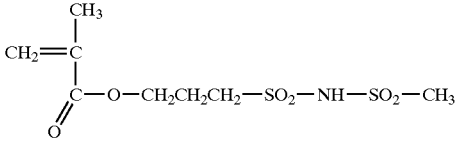

(8) 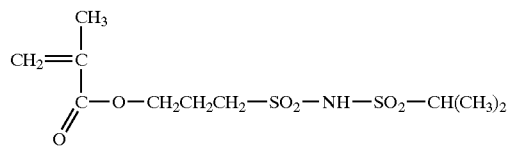

(9) 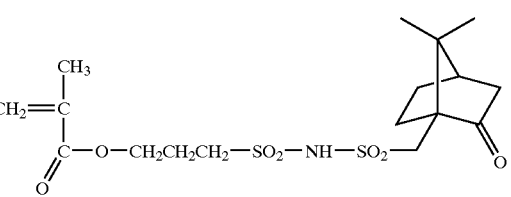

(10) 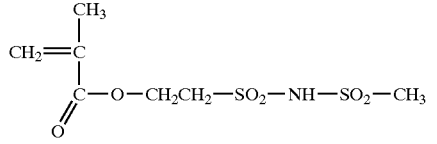

(11) 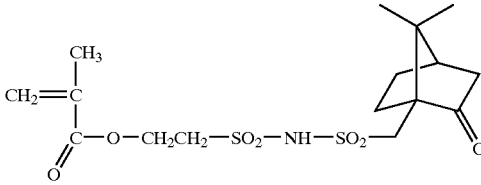

(12) 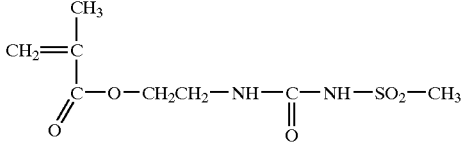

(13) 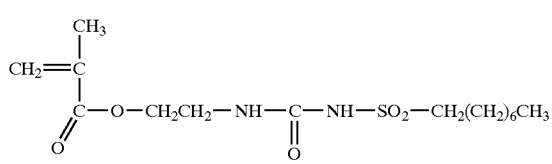

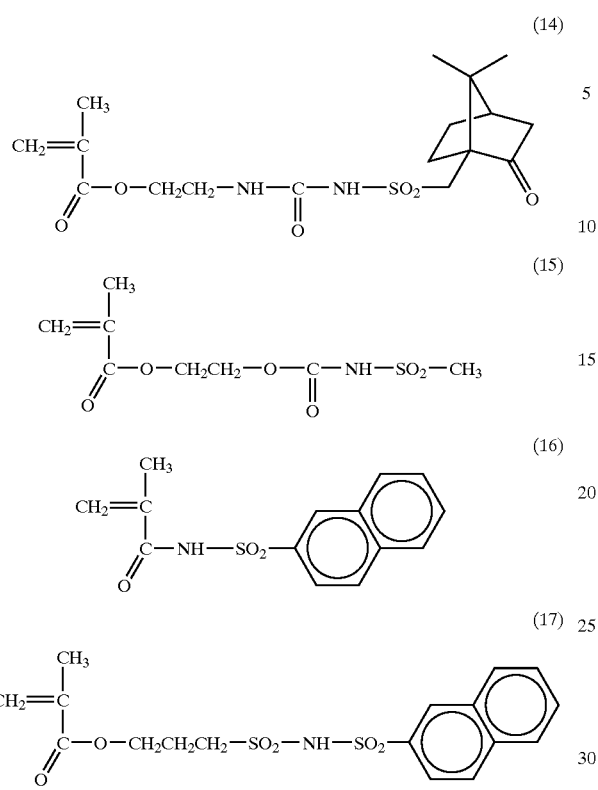
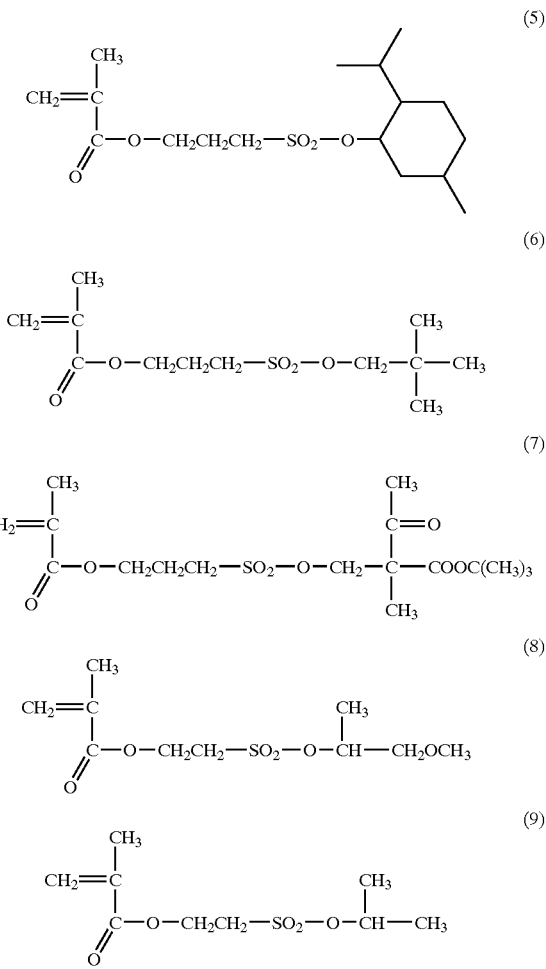
Specific examples of the repeating structural unit represented by formula (III-d) are set forth below, however, the present invention is by no means limited thereto.
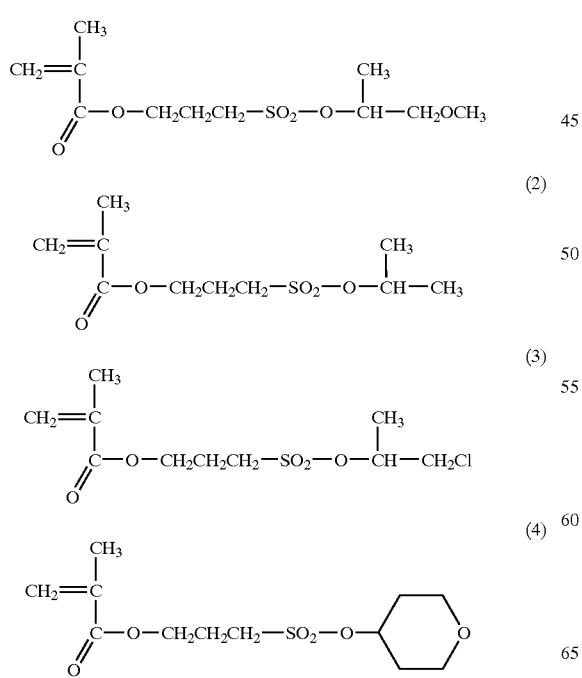

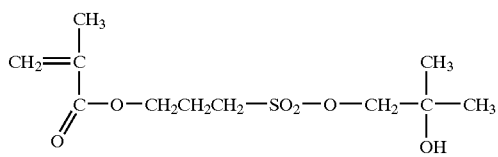

(14)

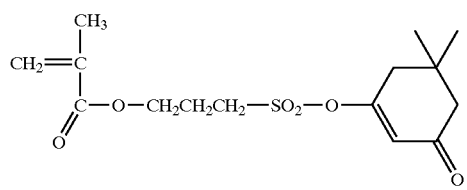

(15)

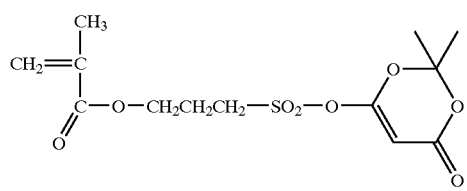

(16)

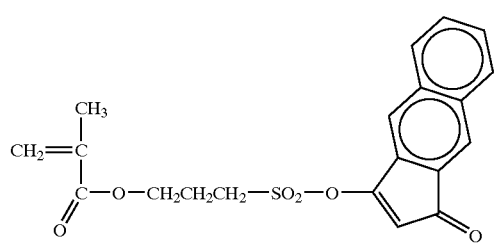

(17)

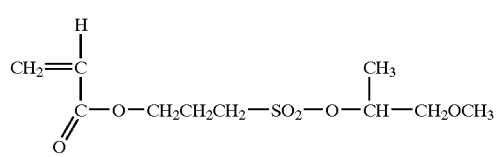

(18)

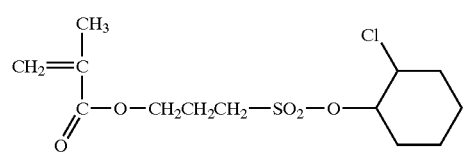

(19)

In formula (III-b), $R_5$ to $R_{12}$ each is preferably hydrogen atom or a methyl group. R is preferably hydrogen atom or an alkyl group having from 1 to 4 carbon atoms. m is preferably a number of 1 to 6.

In formula (III-c), $R_{13}$ is preferably a single bond or an alkylene group such as methylene group, ethylene group, propylene group and butylene group. $R_{14}$ is preferably an alkyl group having from 1 to 10 carbon atoms, such as methyl group and ethyl group, a cyclic alkyl group such as cyclopropyl group, cyclohexyl group and camphor residue, a naphthyl group or a naphthylmethyl group. Z is preferably a single bond, an ether bond, an ester bond, an alkylene group having from 1 to 6 carbon atoms or a combination thereof, more preferably a single bond or an ester bond.

In formula (III-d), $R_{15}$ is preferably an alkylene group having from 1 to 4 carbon atoms. $R_{16}$ is preferably an alkyl group having from 1 to 8 carbon atoms, such as methyl group which may have a substituent, ethyl group which may have a substituent, propyl group which may have a substituent, isopropyl group which may have a substituent, butyl group which may have a substituent, neopentyl group which may have a substituent and octyl group which may have a substituent, a cyclohexyl group, an adamantyl group, a norbornyl group, a boronyl group, an isoboronyl group, a menthyl group, a morphoryl group, a 4-oxocyclohexyl group, a phenyl group which may have a substituent, a toluyl group which may have a substituent, a mesityl group which may have a substituent, a naphthyl group which may have a substituent or a camphor residue which may have a substituent. The substituent of these groups is preferably a halogen atom such as fluorine atom, or an alkoxy group having from 1 to 4 carbon atoms.

In the present invention, among the repeating units represented by formulae (III-a) to (III-d), those represented by formulae (III-b) and (III-d) are preferred.

The resin (B) may be used, in addition to the above-described use, as a copolymer with a monomer repeating unit of various types for the purpose of controlling the dry etching resistance, the suitability for standard developer, the adhesion to a substrate, the resist profile and the general factors required for the resist, such as resolution, heat resistance and sensitivity.

Examples of such a repeating unit include the repeating units corresponding to the following monomers, however, the present invention is by no means limited thereto.

By virtue of this repeating unit, the capabilities required for the resin, particularly (1) solubility in the coating solvent, (2) film-forming property (glass transition point), (3) alkali developability, (4) film thickness loss (selection of hydrophilic/hydrophobic or alkali-soluble group), (5) adhesion to a substrate in the unexposed area and (6) dry etching resistance, can be subtly controlled.

Examples of this copolymerization monomer include compounds having one addition-polymerizable unsaturated bond selected from acrylic acid esters, methacrylic acid esters, acrylamides, methacrylamides, allyl compounds, vinyl ethers and vinyl esters.

Specific examples thereof include acrylic acid esters such as alkyl (the alkyl group preferably has from 1 to 10 carbon atoms) acrylates (e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate);

methacrylic acid esters such as alkyl (the alkyl group preferably has from 1 to 10 carbon atoms) methacrylates (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate);

acrylamides such as acrylamide, N-alkylacrylamides (where the alkyl group has from 1 to 10 carbon atoms, such as methyl group, ethyl group, propyl group, butyl group, tert-butyl group, heptyl group, octyl group, cyclohexyl group and hydroxyethyl group), N,N-dialkylacrylamides (where the alkyl group has from 1 to 10 carbon atoms, such as methyl group, ethyl group, butyl group, isobutyl group, ethylhexyl group and cyclohexyl group), N-hydroxyethyl-N-methylacrylamide and N-2-acetamidoethyl-N-acetylacrylamide;

methacrylamides such as methacrylamide, N-alkylmethacrylamides (where the alkyl group has from 1 to 10carbon atoms, such as methyl group, ethyl group, tert-butyl group, ethylhexyl group, hydroxyethyl group and cyclohexyl group), N,N-dialkylmethacrylamides (where the alkyl group is an ethyl group, a propyl group or a butyl group) and N-hydroxyethyl-N-methylmethacrylamide;

allyl compounds such as allyl esters (e.g., allyl acetate, allyl caproate, allyl caprate, allyl laurate, allyl palmitate, allyl stearate, allyl benzoate, allyl acetoacetate, allyl lactate) and allyloxy ethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-p-phenyl butyrate and vinyl chlorohexylcarboxylate;

dialkyl itaconates (e.g., dimethyl itaconate, diethyl itaconate, dibutyl itaconate); dialkyl esters of fumaric acid (e.g., dibutyl fumarate) and monoalkyl esters of fumaric acid; and acrylic acid, methacrylic acid, crotonic acid, itaconic acid, maleic acid anhydride, maleimide, acrylonitrile, methacrylonitrile and maleylonitrile. Other than these, addition-polymerizable unsaturated compounds capable of copolymerizing with the above-described various repeating units may be used.

In the resin (B) the content in molar ratio of each repeating unit may be appropriately selected so as to control the acid value, the dry etching resistance of the resist, the suitability for the standard developer, the adhesion to a substrate, the defocus latitude depended on line pitch of the resist profile, and general properties required for the resist, such as resolution, heat resistance and sensitivity.

The content of the repeating unit represented by formula (I) in the resin (B) is from 30 to 70 mol %, preferably from 35 to 65 mol %, more preferably from 40 to 60 mol %, based on all repeating units.

The content of the repeating unit having a group represented by formula (pI), (pII), (pIII), (pIV), (pV) or (pVI) is usually from 20 to 75 mol %, preferably from 25 to 70 mol %, more preferably from 30 to 65 mol %, based on all repeating units.

The content of the repeating unit represented by formula (a) in the resin (B) is usually from 0 to 70 mol %, preferably from 10 to 40 mol %, more preferably from 15 to 30 mol %, based on all repeating units.

The content of the repeating unit represented by any one of formulae (IIIa) to (III-d) in the resin (B) is usually from 0.1 to 30 mol %, preferably from 0.5 to 25 mol %, more preferably from 1 to 20 mol %, based on all repeating units.

The content of the repeating unit based on the monomer as another copolymerization component in the resin may also be appropriately selected according to the desired resist performance, however, in general, it is preferably 99 mol % or less, more preferably 90 mol % or less, still more preferably 80 mol % or less, based on the total molar number of the repeating unit containing a group represented by formula (I) and the repeating unit having a group represented by formula (pI), (pII), (pIII), (pIV), (pV) or (pVI).

The resin (B) preferably has a weight average molecular weight Mw on a polystyrene basis by gel permeation chromatography, of 1,000 to 1,000,000, more preferably 1,500 to 500,000, still more preferably 2,000 to 200,000, particularly preferably 2,500 to 100,000. As the weight-average molecular weight is larger, the heat resistance increases but the developability decreases. Therefore, the Mw is controlled to a preferred range by taking account of the balance therebetween.

The resin (B) for use in the present invention can be synthesized according to an ordinary method, for example, by a radical polymerization method.

Specific examples of the resin (B) for use in the present invention are set forth below, however, the present invention is by no means limited thereto.

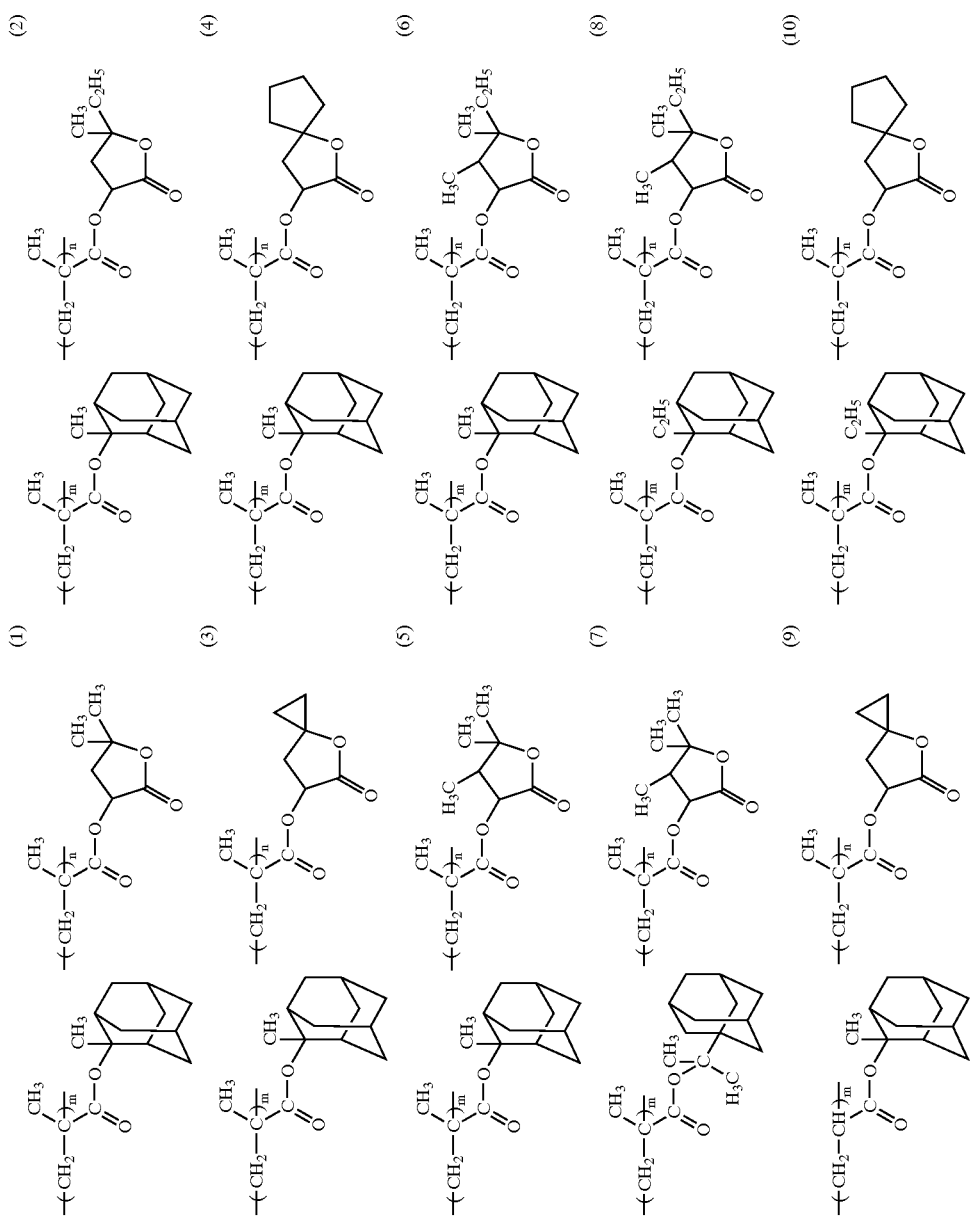

-continued
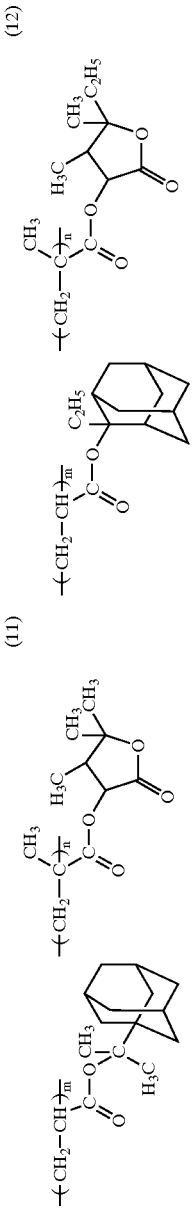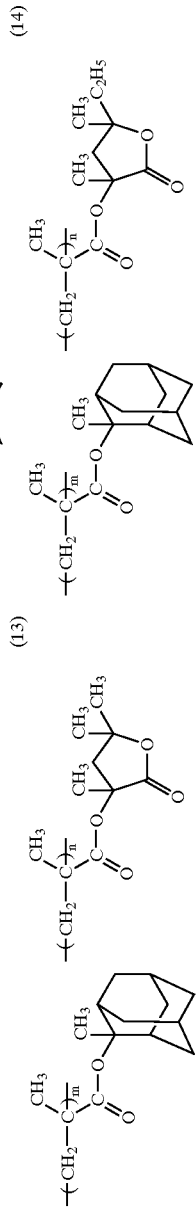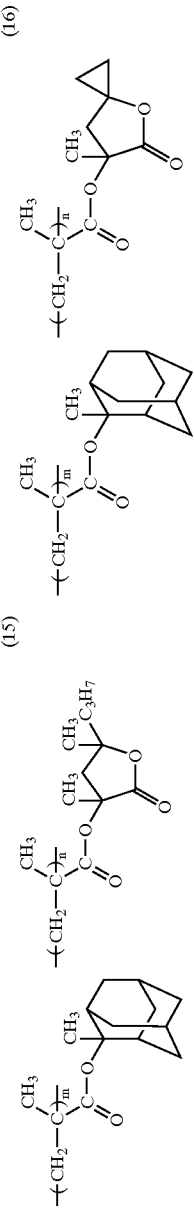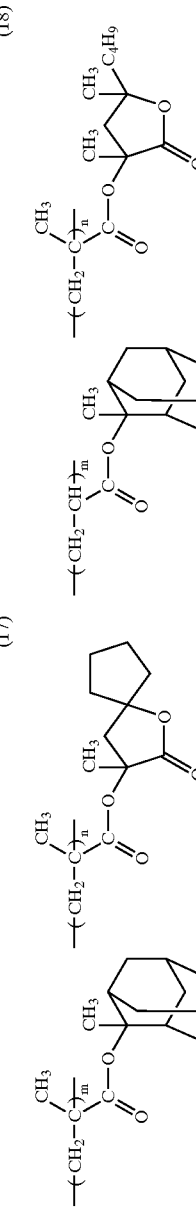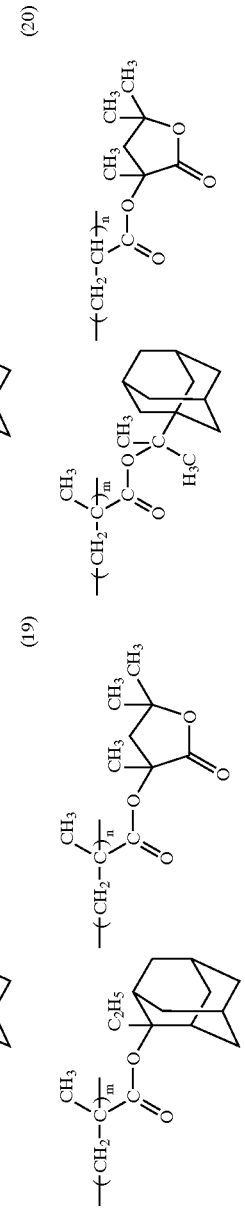

-continued

-continued
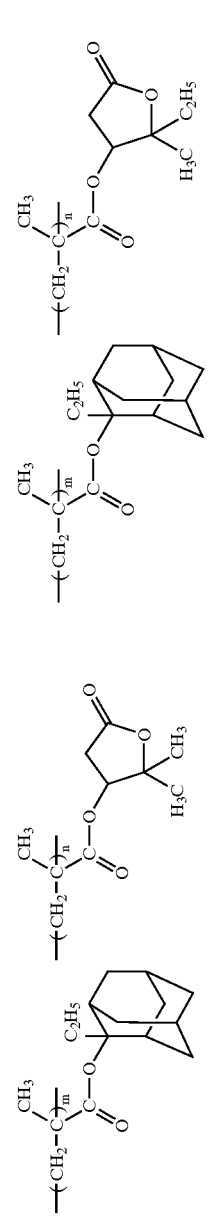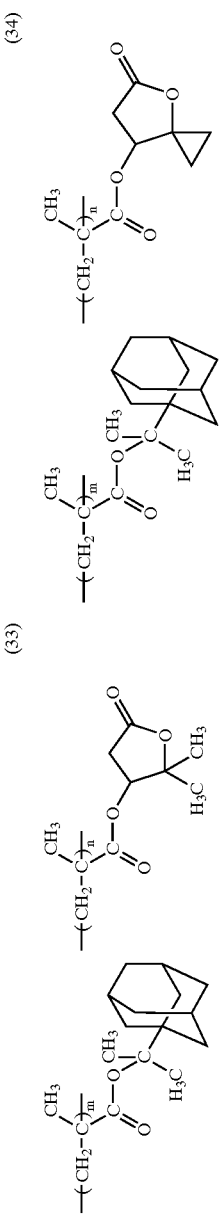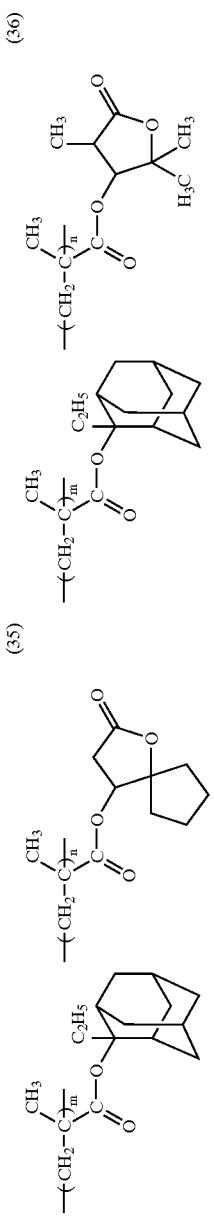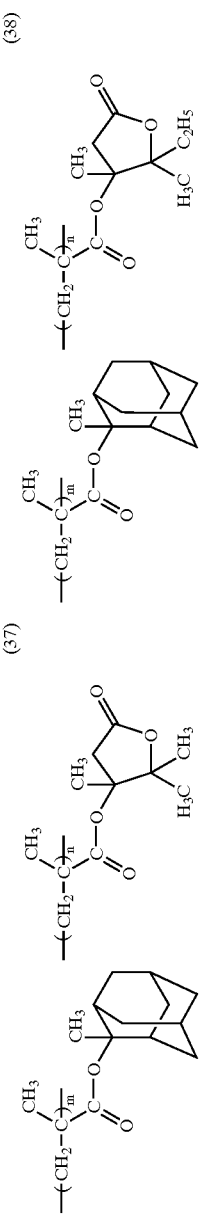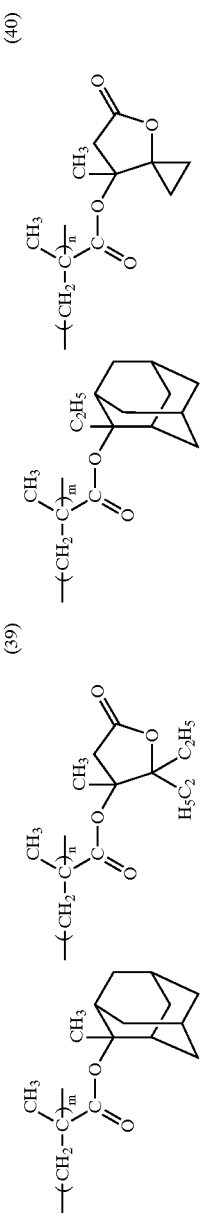

-continued

(50) (51) (52) (53) (54)
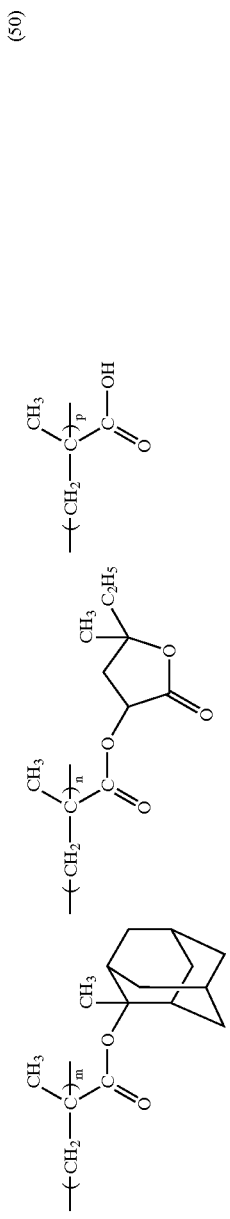
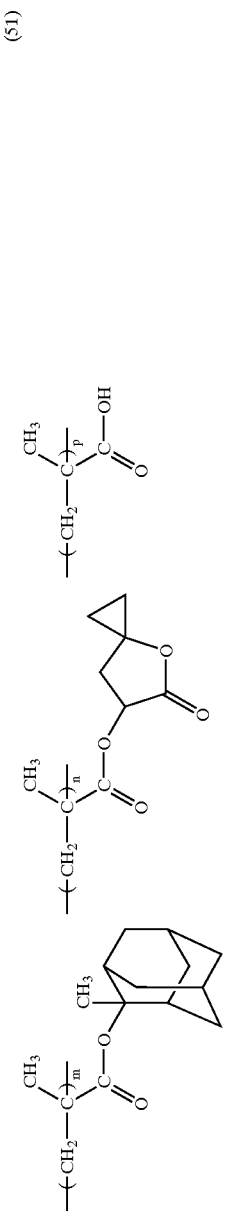
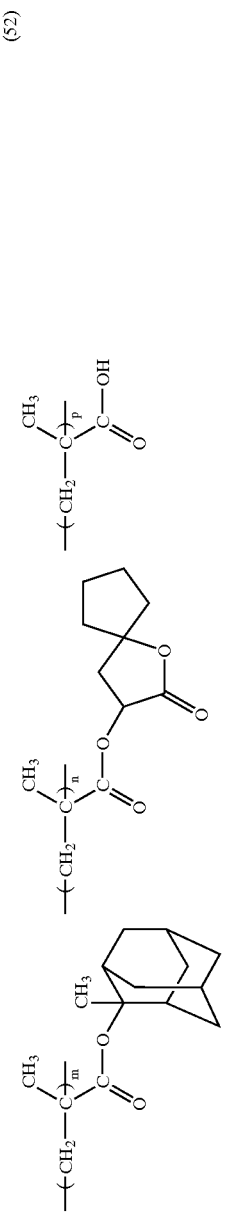
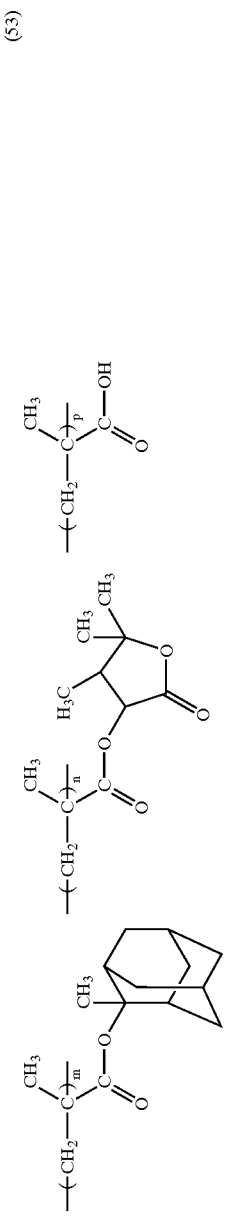
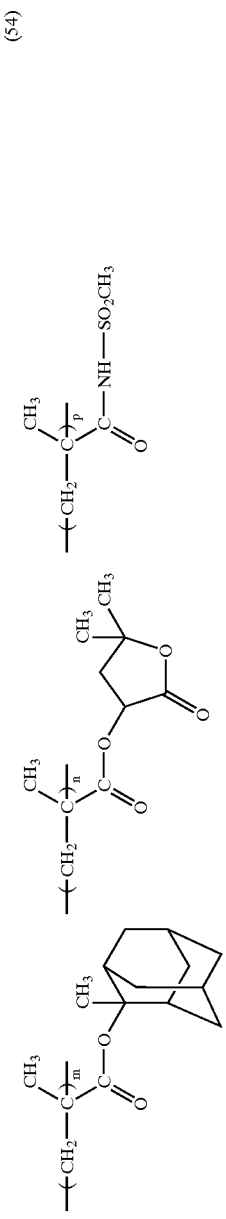

-continued
(55)
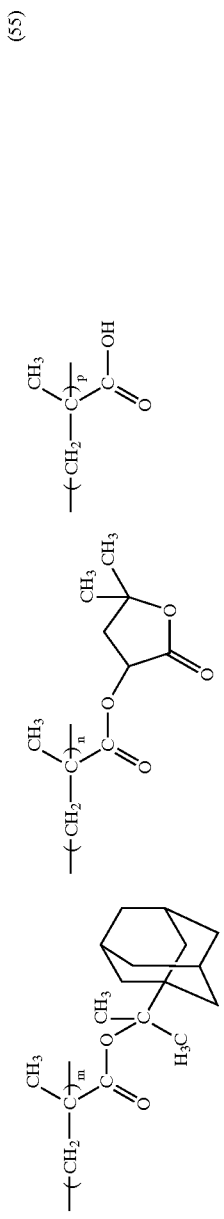
(56)
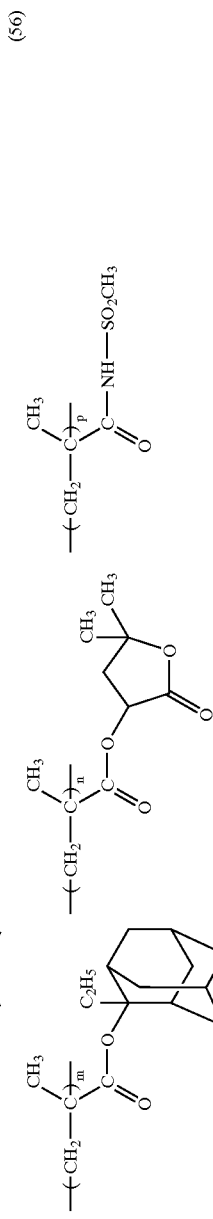
(57)
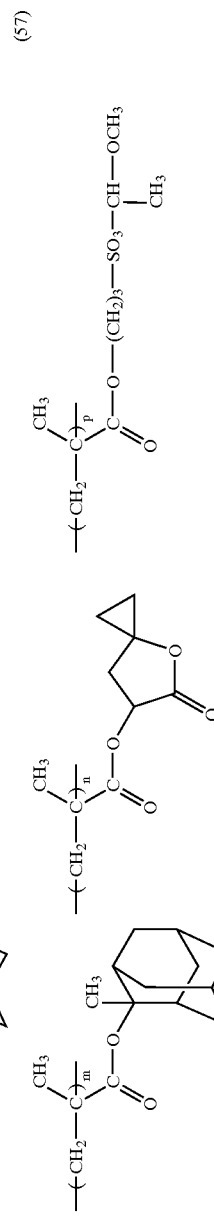
(58)
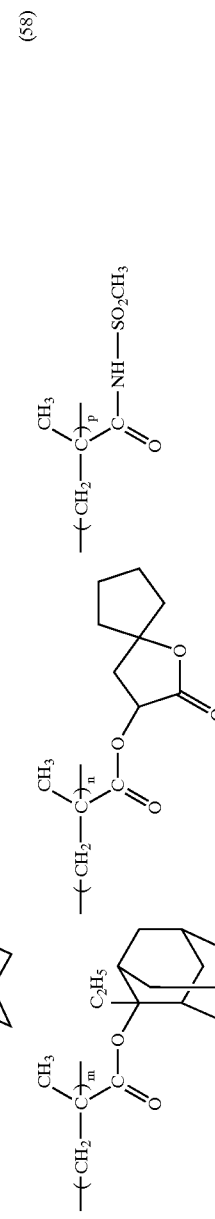
(59)
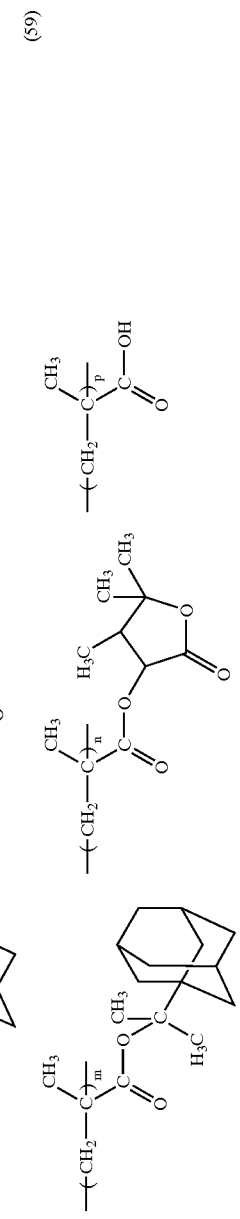

-continued
(60) 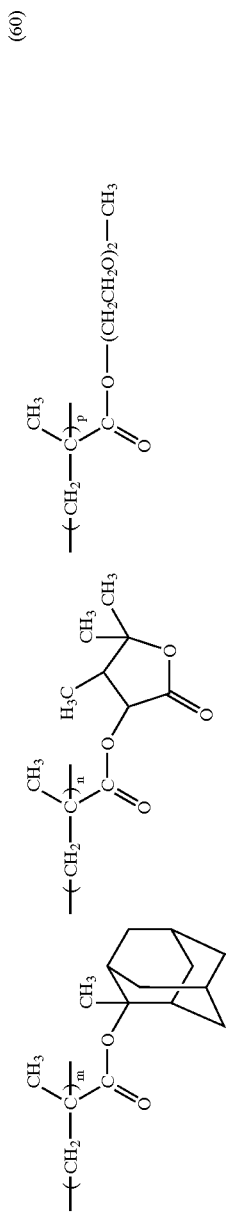
(61) 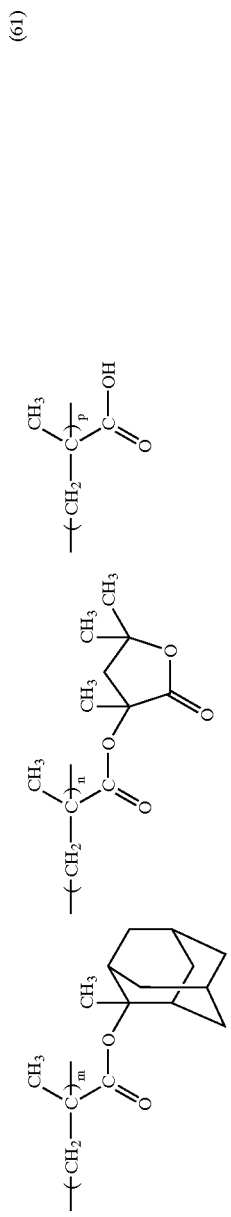
(62) 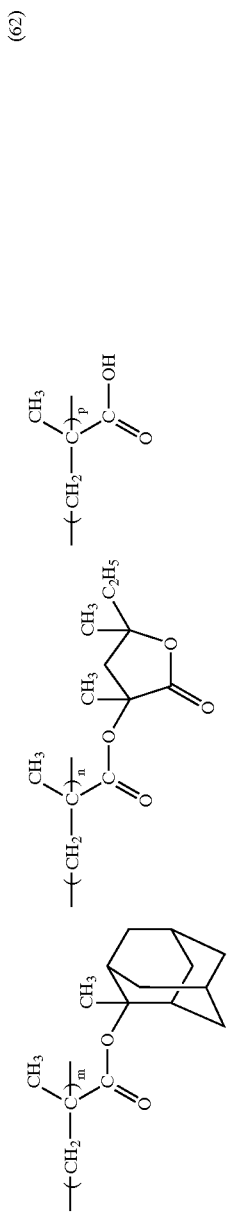
(63) 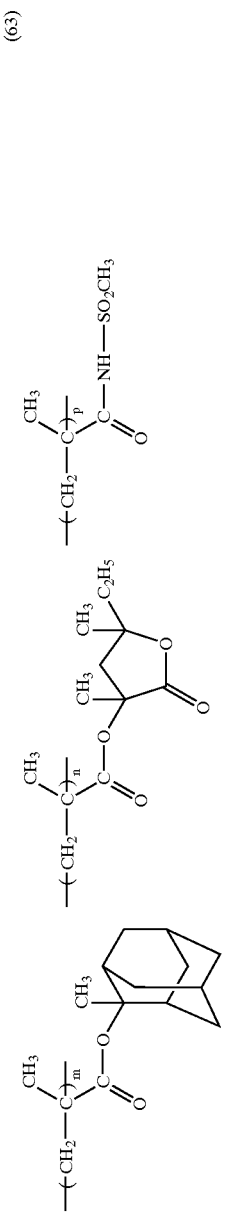
(64) 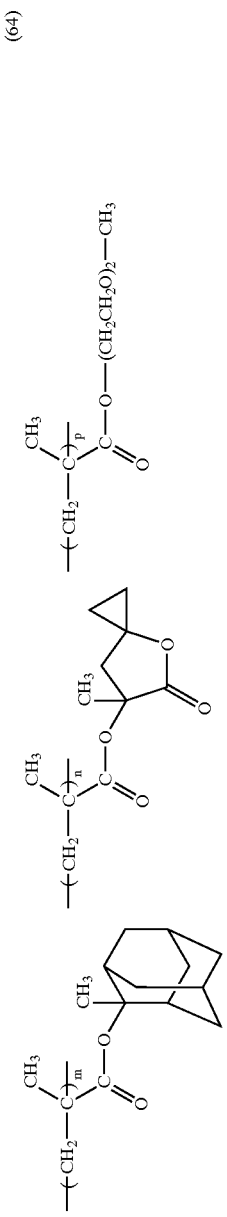

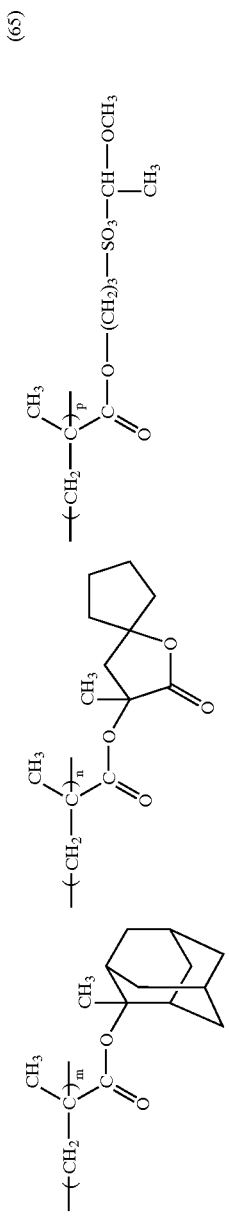
(65)
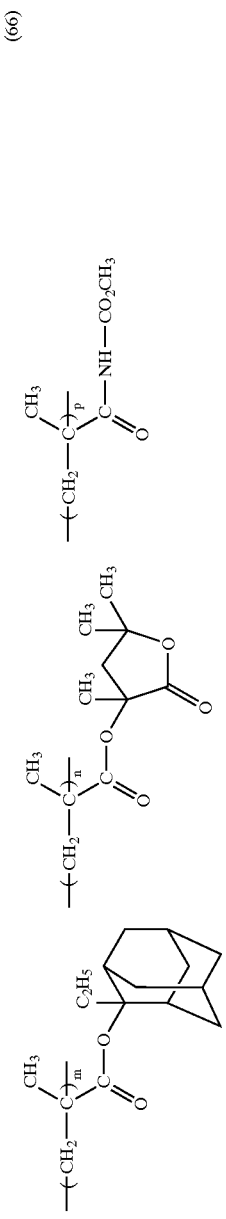
(66)
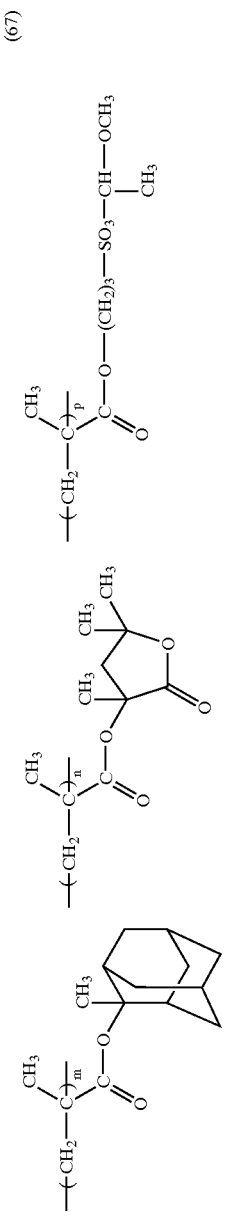
(67)
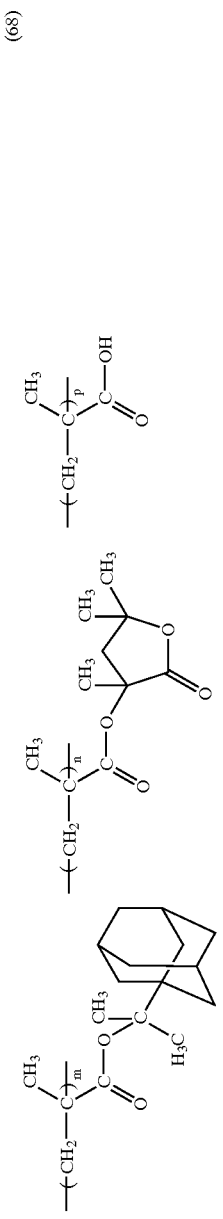
(68)
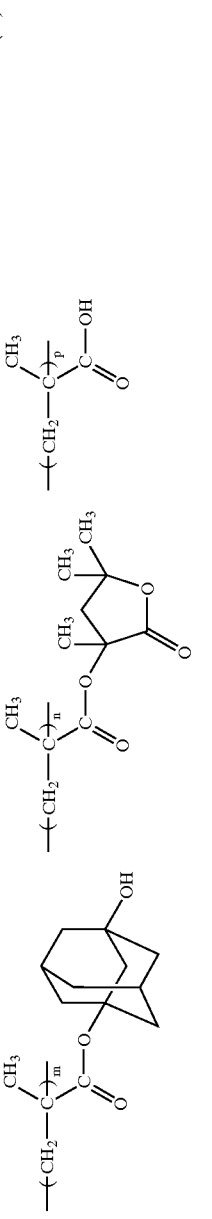
(69)

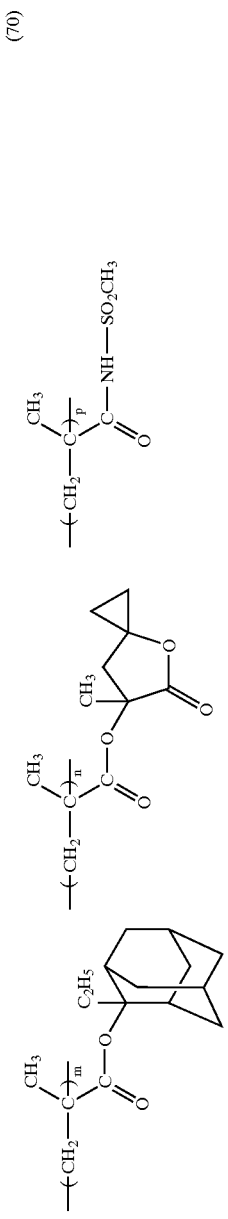
(70)
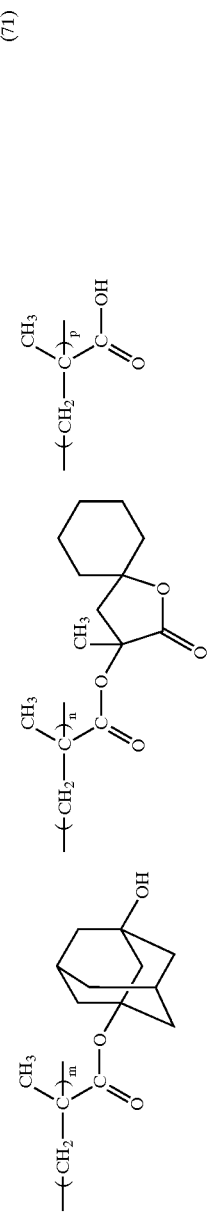
(71)
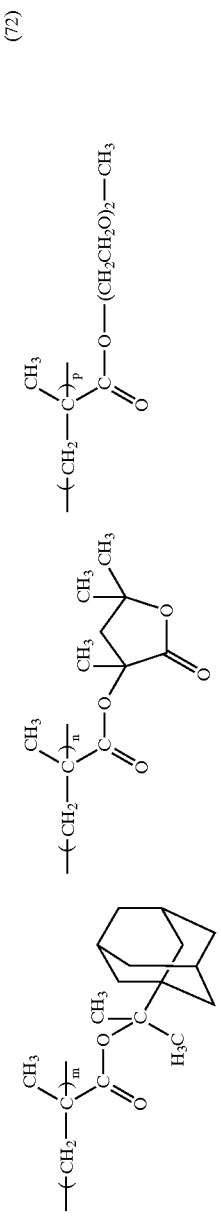
(72)
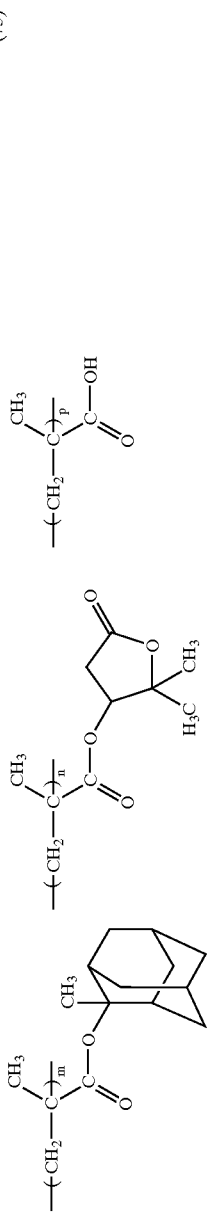
(73)
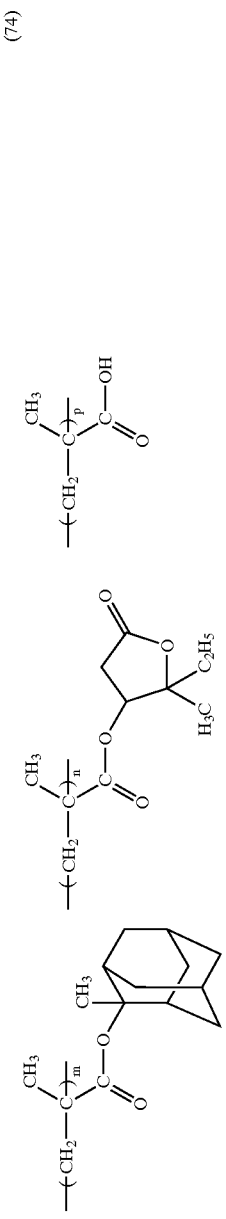
(74)

-continued
(75) 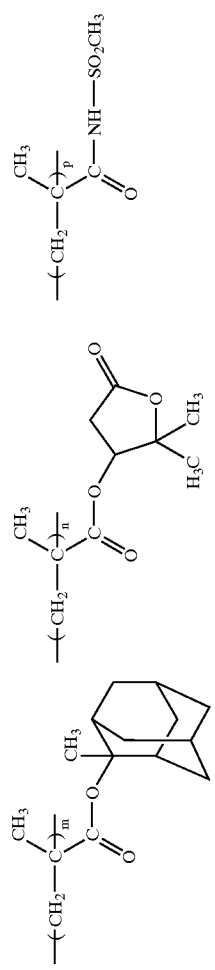
(76) 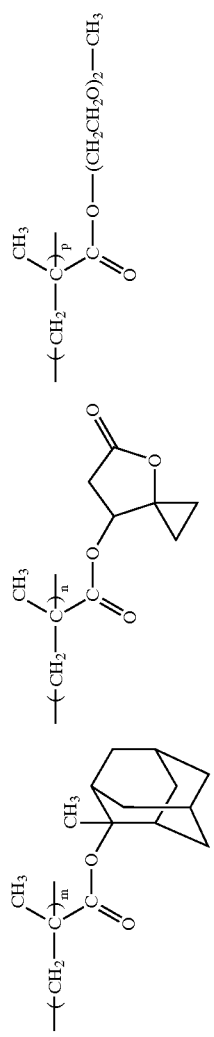
(77) 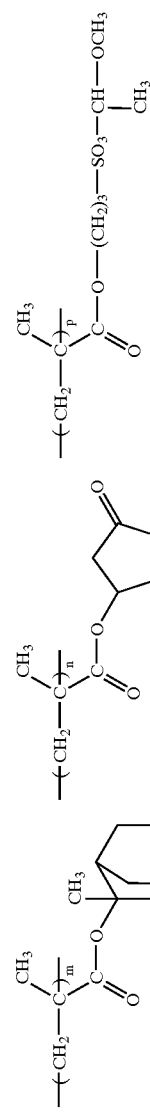
(78) 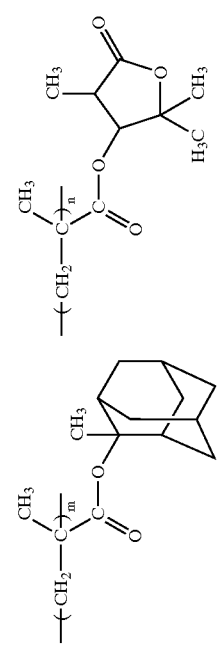
(79) 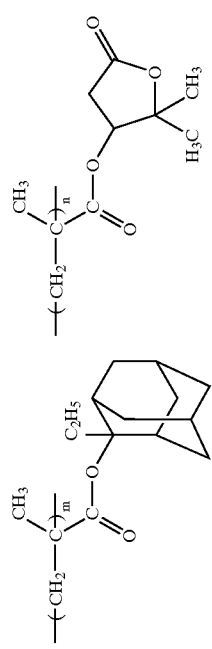

-continued
(80) 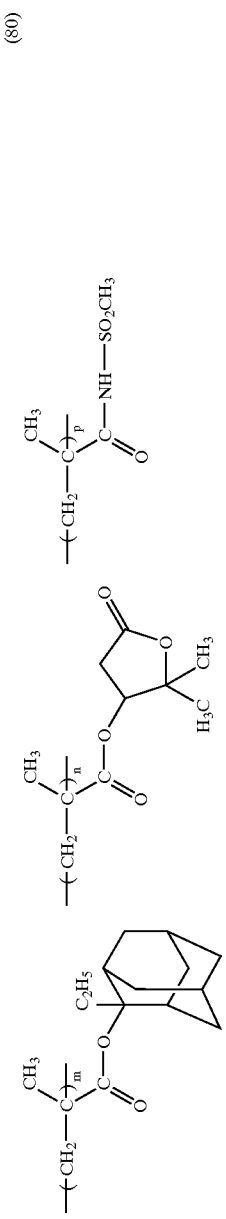
(81) 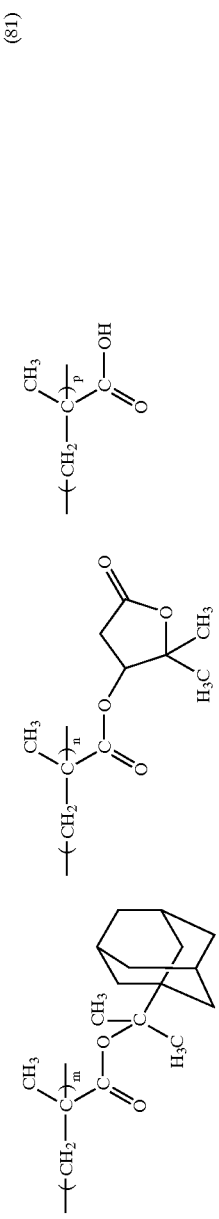
(82) 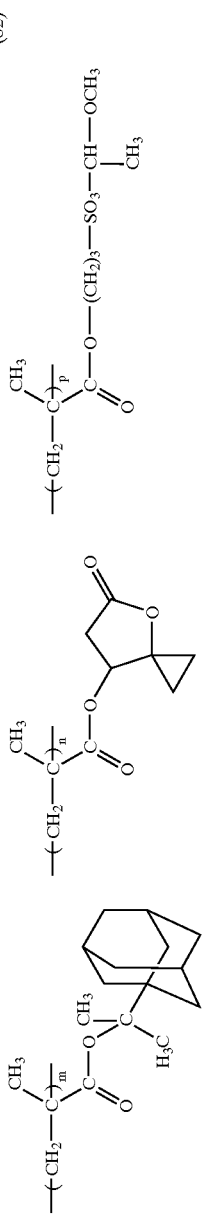
(83) 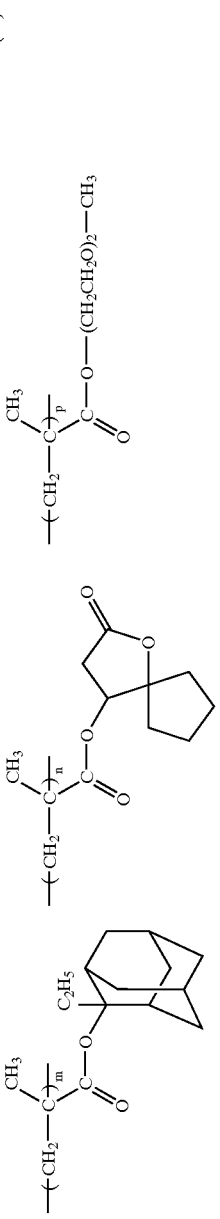
(84) 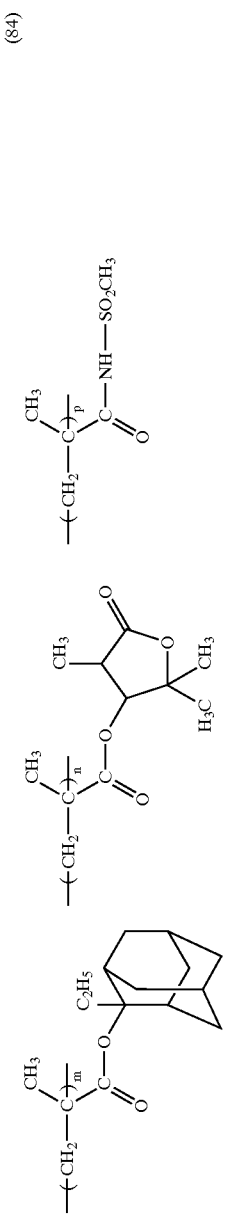

-continued
(85) 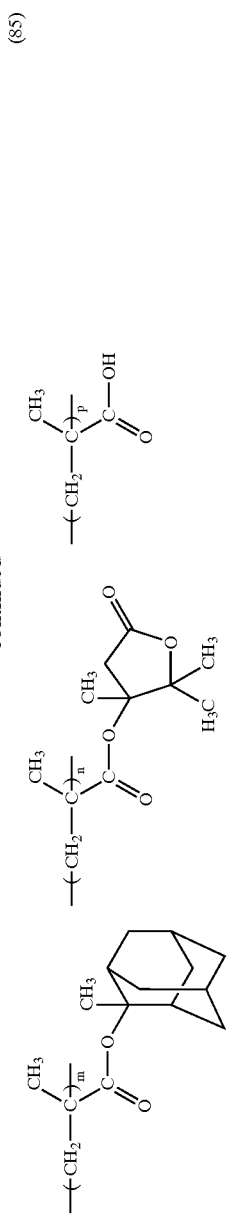
(86) 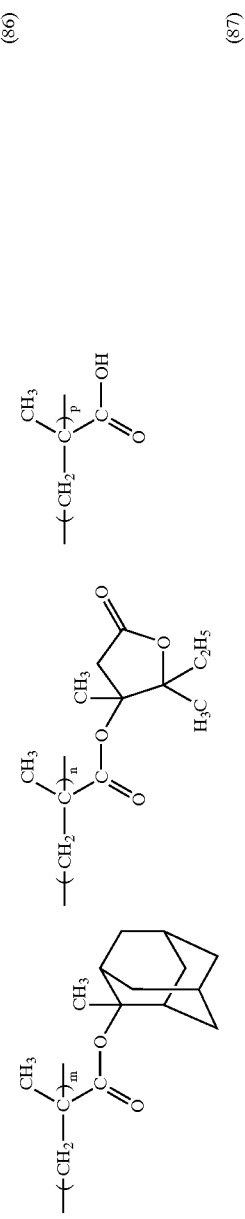
(87) 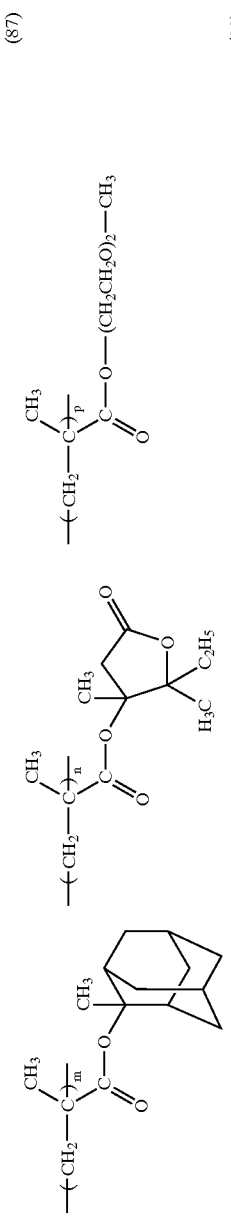
(88) 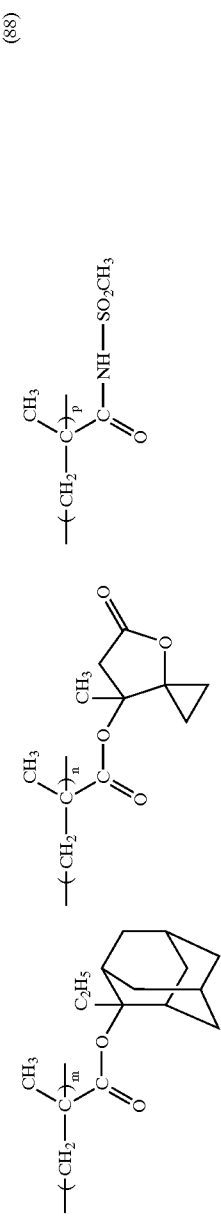
(89) 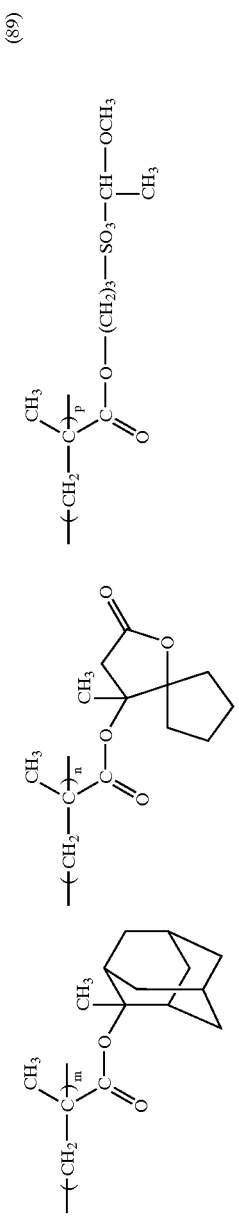

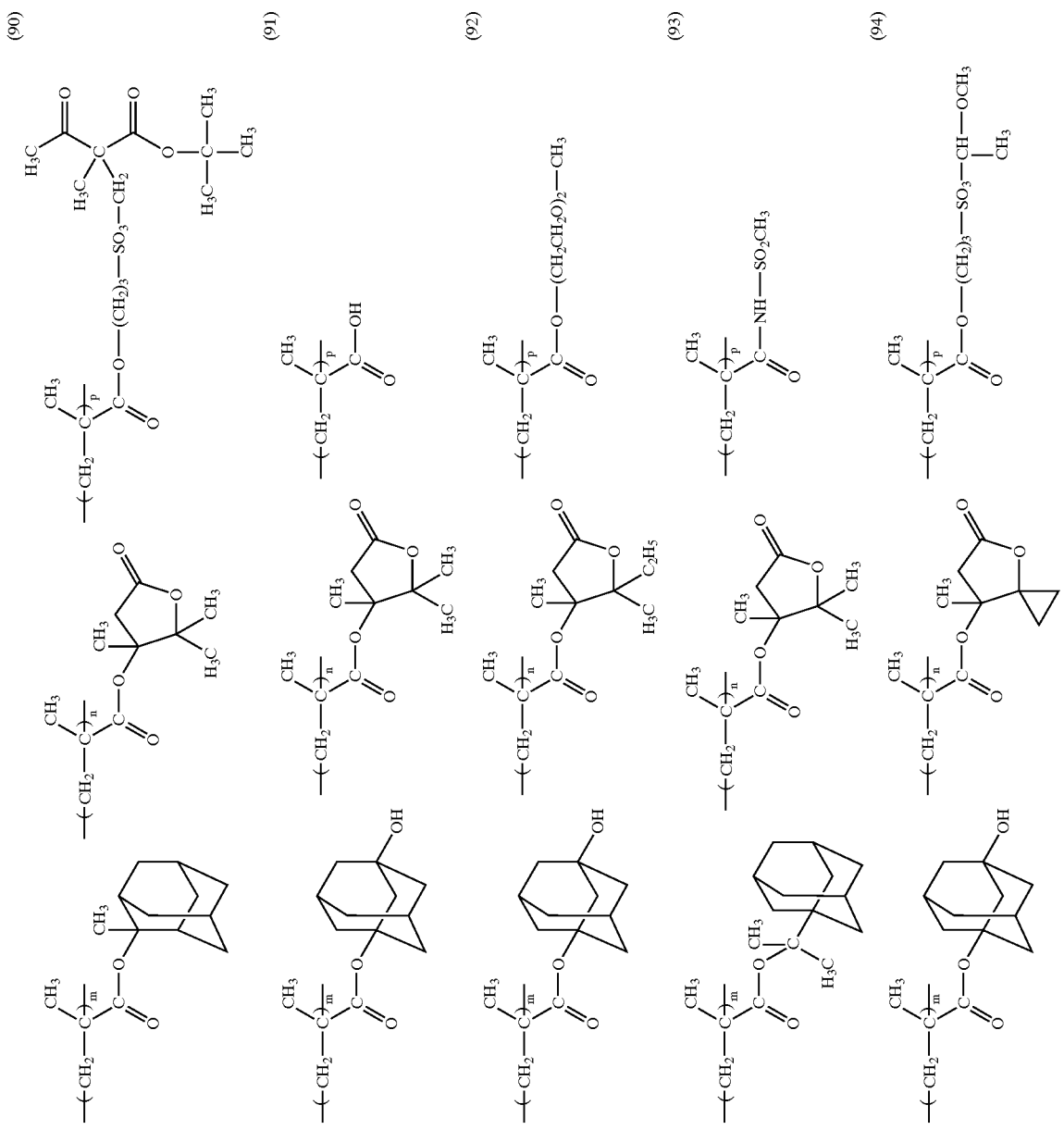

-continued
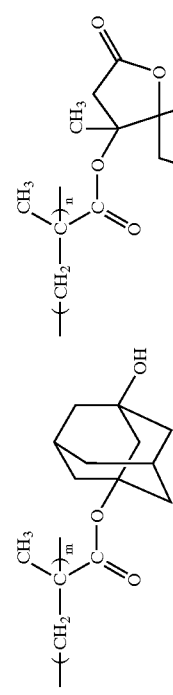
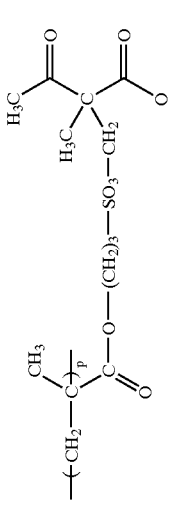
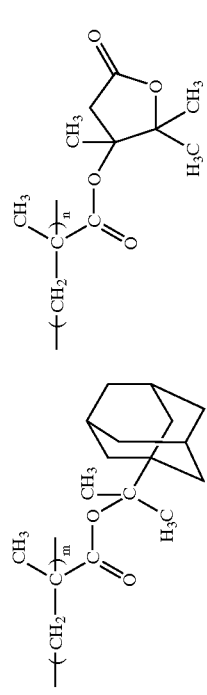
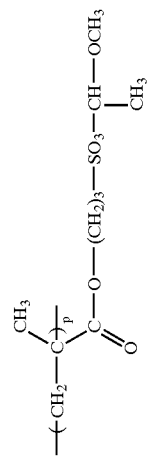

In the positive photoresist composition for far ultraviolet exposure of the present invention, the amount of the resin (B) added in the entire composition is preferably from 40 to 99.99 wt %, more preferably from 50 to 99.97 wt %, based on all solid contents in the resist.

The positive resist composition of the present invention may further contain, if desired, an acid-decomposable dissolution inhibiting compound, a dye, a plasticizer, a photosensitizer, an organic basic compound and a compound capable of accelerating the dissolution in a developer.

The positive photoresist composition of the present invention preferably contains (C) a fluorine-containing surfactant and/or a silicon-containing surfactant.

The positive photoresist composition of the present invention may contain one or more of a fluorine-containing surfactant, a silicon-containing surfactant and a surfactant containing both fluorine atom and silicon atom.

Examples of the surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. Also, the commercially available surfactants described below each may be used as it is.

Examples of the commercially available surfactants which can be used include fluorine-containing surfactants and silicon-containing surfactants, such as Eftop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), and Surflon S-382, SC101, 102, 103, 104, 105 and 106 (produced by Asahi Glass Co., Ltd.). Also, a polysiloxane polymer KP-341 (produced by Shin-Etsu Chemical Co., Ltd.) may be used as a silicon-containing surfactant.

The amount of the surfactant blended is usually from 0.001 to 2 wt %, preferably from 0.01 to 1 wt %, based on the solid content in the composition of the present invention. These surfactants may be used either individually or in combination.

Specific examples of other surfactants which can be used include nonionic surfactants including polyoxyethylene alkyl ethers such as polyoxyethylene lauryl ether, polyoxyethylene stearyl ether, polyoxyethylene cetyl ether and polyoxyethylene oleyl ether; polyoxyethylene alkyl aryl ethers such as polyoxyethylene octyl phenol ether and polyoxyethylene nonyl phenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The amount of this surfactant blended is usually 2 parts by weight or less, preferably 1 part by weight or less, per 100 parts by weight of the solid content in the composition of the present invention.

The acid diffusion inhibitor for use in the present invention is preferably added so as to inhibit the fluctuation of sensitivity and resolution in aging from the exposure until heating and development. This is preferably an organic basic compound. Examples of the organic basic compound include a nitrogen-containing basic compound having the following structure:

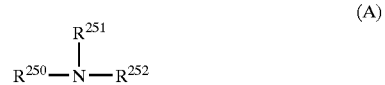
(A)

wherein $R^{250}$, $R^{251}$ and $R^{252}$, which may be the same or different, each represents hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, provided that $R^{251}$ and $R^{252}$ may be combined with each other to form a ring.

(B)

(C)

(D)

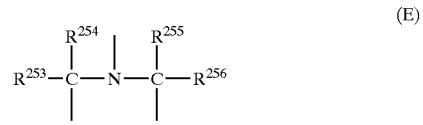
(E)

(wherein $R^{253}$, $R^{254}$, $R^{255}$ and $R^{256}$, which may be the same or different, each represents an alkyl group having from 1 to 6 carbon atoms).

The compound is more preferably a nitrogen-containing basic compound having two or more nitrogen atoms different in the chemical environment within one molecule, still more preferably a compound having both a substituted or unsubstituted amino group and a ring structure containing nitrogen atom or a compound having an alkylamino group. Specific preferred examples thereof include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Specific examples of preferred compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)

pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]-5-nonene, 1,8-diazabicyclo[5.4.0]-7-undecene, 2,4,5-triphenylimidazole, N-methylmorpholine, N-ethylmorpholine, N-hydroxyethylmorpholine, N-benzylmorpholine, tertiary morpholine derivatives such as cyclohexylmorpholinoethylthiourea (CHMETU), and hindered amines described in JP-A-11-52575 (for example, those described in [0005] of this patent publication), however, the present invention is by no means limited thereto.

Specific examples of more preferred compounds include 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2,6,6-pentamethyl-4-pyperidyl) sebacate.

Among these compounds, 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, CHMETU and bis(1,2,2,6,6-pentamethyl-4-piperidyl) sebacate are preferred.

These nitrogen-containing basic compounds may be used either individually or in combination of two or more thereof. The amount of the nitrogen-containing basic compound used is usually from 0.001 to 10 wt %, preferably from 0.01 to 5 wt %, based on the solid content of the entire photosensitive resin composition. If the amount used is less than 0.001 wt %, the effect resulting from the addition of the nitrogen-containing basic compound may not be obtained, whereas if it exceeds 10 wt %, the sensitivity is liable to decrease or the developability in the unexposed area is readily worsened.

The positive resist composition of the present invention is dissolved in a solvent capable of dissolving the above-described components and then coated on a support. The solvent used here is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone or tetrahydrofuran. These solvents are used individually or in combination.

Among these solvents, preferred are 2-heptanone, γ-butyrolactone, ethylene glycol monomethyl ether, ethylene glycol monoethyl ether, ethylene glycol monoethyl ether acetate, propylene glycol monomethyl ether, propylene glycol monomethyl ether, methyl lactate, ethyl lactate, methyl methoxypropionate, ethyl ethoxypropionate, N-methylpyrrolidone and tetrahydrofuran.

In the present invention, the first solvent (D) is preferably mixed with the following solvent and used as a whole solvent. The solvent mixed is preferably ethylene dichloride, cyclohexanone, cyclopentanone, γ-butyrolactone, methyl ethyl ketone, methyl amyl ketone, methyl isobutyl ketone, ethyl amyl ketone, ethylene glycol monomethyl ether acetate, ethylene glycol monoethyl ether, 2-methoxyethyl acetate, ethylene glycol monoethyl ether acetate, propylene glycol monomethyl ether, toluene, ethyl acetate, propyl acetate, isopropyl acetate, butyl acetate, isobutyl acetate, methyl lactate, ethyl lactate, propyl lactate, butyl lactate, methyl pyruvate, ethyl pyruvate, propyl pyruvate, N,N-dimethylformamide, N,N-dimethylacetamide, dimethyl sulfoxide, N,N,N',N'-tetramethylurea, N-methylpyrrolidone, tetrahydrofuran, ethylene carbonate, propylene carbonate, methyl β-methoxyisobutyrate, ethyl butyrate, propyl butyrate or diacetone alcohol. At least one of these solvents is added to the solvent (D).

Among these solvents used in combination with the first solvent (D), preferred are γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, N-methylpyrrolidone, methyl amyl ketone, ethyl amyl ketone, butyl acetate, isobutyl acetate, methyl pyruvate, ethyl pyruvate and tetrahydrofuran.

The first solvent (D) is used in an amount of 60 to 90 wt %, preferably 65 to 85 wt %, more preferably 70 to 85 wt %, based on the whole solvent.

The thus-prepared positive resist composition of the present invention is coated on a substrate to form a thin film. The coated film preferably has a thickness of 0.2 to 1.2 $\mu$m. In the present invention, if desired, a commercially available inorganic or organic anti reflection coating may be used.

Examples of the anti reflection coating which can be used include the inorganic film type such as titanium, titanium dioxide, titanium nitride, chromium oxide, carbon and α-silicon, and the organic film type comprising a light absorbent and a polymer material. In the former case, equipment such as vacuum evaporation apparatus, CVD apparatus and sputtering apparatus is necessary for the film formation. Examples of the organic anti reflection coating include a film comprising a condensation product of a diphenylamine derivative and a formaldehyde-modified melamine resin, an alkali-soluble resin and a light absorbent described in JP-B-7-69611, a reactant of a maleic acid anhydride copolymer and a diamine-type light absorbent described in U.S. Pat. No. 5,294,680, a film containing a resin binder and a methylol melamine-base heat cross-linking agent described in JP-A-6-118631, an acrylic resin-type anti reflection coating having a carboxylic acid group, an epoxy group and a light-absorbing group within the same molecule described in JP-A-6-118656, a film comprising methylolmelamine and a benzophenone-base light absorbent described in JP-A-8-87115, and a polyvinyl alcohol resin having added thereto a low-molecular weight light absorbent described in JP-A-8-179509.

In addition, organic anti reflection coating such as DUV30 series and DUV-40 series produced by Brewer Science, and AC-2 and AC-3 produced by Shipley may also be used.

The resist solution is coated on a substrate (for example, silicon/silicon dioxide coating, and if desired, after providing the above-described anti reflection coating on the substrate) used in the production of precision integrated circuit devices by an appropriate coating method such as spinner and coater, exposed through a predetermined mask, and then developed by baking, whereby a good resist pattern can be obtained. The exposure light used here is preferably light at a wavelength of 150 to 250 nm. More specifically, a KrF excimer laser (248 nm), an ArF excimer laser (193 nm), an $F_2$ excimer laser (157 nm), an X ray, an electron beam and the like may be used.

The developer which can be used is an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcoholamine such as dimetylethanolamine and triethanolamine, a quaternary ammonium salt such as tetramethylammonium hydroxide and tetraethylammonium hydroxide, and a cyclic amine such as pyrrole and piperidine.

Furthermore, to this alkaline aqueous solution, an alcohol and a surfactant may be added each in an appropriate amount.

EXAMPLES

The present invention is described in greater detail below by referring to the Examples, however, the present invention should not be construed as being limited thereto.

Synthesis Example (1)
Synthesis of Resin (1) of the Present Invention:

2-Methyl-2-adamantyl methacrylate and 4,4-dimethyl-2-γ-butyrolactone methacrylate were charged in a molar ratio of 50/50 and dissolved in N,N-dimethylacetamide/tetrahydrofuran (5/5) to prepare 100 ml of a solution having a solid concentration of 20%. To this solution, 3 mol % of V-65 produced by Wako Pure Chemical Industries, Ltd. was added and the resulting solution was added dropwise to 10 ml of N,N-dimethylacetamide heated at 60° C., over 3 hours in a nitrogen atmosphere. After the completion of dropwise addition, the reaction solution was heated for 3 hours and again, 1 mol % of V-65 was added, followed by stirring for 3 hours. After the completion of reaction, the reaction solution was cooled to room temperature and crystallized with 3 liter of distilled water and the white powder precipitated was recovered.

The polymer compositional ratio determined by $C^{13}$ NMR was 52/48. The weight-average molecular weight in terms of the standard polystyrene determined by GPC was 8,200.

Synthesis Examples 2 to 16
Synthesis of Resins (2) to (16) of the Present Invention:

Resins 2 to 16 each having a compositional ratio and a weight-average molecular weight shown in Table 1 below were synthesized in the same manner as in Synthesis Example 1 above.

TABLE 1

| Synthesis Example | Resin of the Invention (Resin No.) | Compositional Ratio (by mol), m/n or m/n/p | Molecular Weight |
|---|---|---|---|
| 2 | (2) | 51/49 | 7,500 |
| 3 | (5) | 53/47 | 9,600 |
| 4 | (8) | 50/50 | 6,400 |
| 5 | (13) | 51/49 | 8,400 |
| 6 | (21) | 54/46 | 10,300 |
| 7 | (31) | 52/48 | 8,800 |
| 8 | (42) | 51/49 | 10,500 |
| 9 | (49) | 47/45/8 | 8,900 |
| 10 | (55) | 49/42/9 | 9,200 |
| 11 | (61) | 48/42/10 | 7,900 |
| 12 | (65) | 50/43/7 | 8,300 |
| 13 | (66) | 44/44/12 | 10,900 |
| 14 | (69) | 43/47/10 | 8,700 |
| 15 | (85) | 45/45/10 | 9,200 |
| 16 | (95) | 47/45/8 | 7,800 |

Examples 1 to 16 and Comparative Example 1
[Preparation and Evaluation of Photosensitive Compositions]

1.4 g of the resin synthesized in Synthesis Examples above and 0.2 g of a photo-acid generator were mixed and dissolved in propylene glycol monomethyl ether acetate each to a concentration of 14 wt % as the solid content. The resulting solution was filtered through a 0.1-$\mu$m microfilter to prepare positive resists of Examples 1 to 16. The resins and the photoacid-generators used of the present invention are shown in Table 2 below.

Separately, a positive resist for comparison was prepared using Resin (A4) synthesized in the same manner as in the synthesis described at page 8 of JP-A-10-274852.

(Evaluation Test)

The thus-obtained positive photoresist solutions each was coated on a silicon wafer using a spin coater and dried at 130° C. for 90 seconds to form a positive photoresist film having a thickness of about 0.4 $\mu$m. The resist film formed was exposed by an ArF excimer laser (exposed by an ArF stepper at a wavelength of 193 nm with NA=0.6, manufactured by ISI), heat-treated at 120° C. for 90 seconds, developed with an aqueous 2.38% tetramethylammonium hydroxide solution and rinsed with distilled water to obtain a resist pattern profile.

These were evaluated as follows on the sensitivity, resolution and edge roughness. The evaluation results are shown in Table 2.

[Sensitivity]

The sensitivity was evaluated by the minimum exposure amount necessary for reproducing a 0.15-$\mu$m line-and-space pattern.

[Resolution]

The resolution was evaluated by the limiting resolution which can be reproduced with the minimum exposure amount for reproducing a 0.15-$\mu$m mask pattern at a line-and-space pattern.

[Edge Roughness]

The edge roughness was measured for the edge roughness of an isolated pattern using an end measuring scanning-type electron microscope (SEM). The line pattern edge was detected at a plurality of positions within the measuring monitor and the dispersion (3σ) of the detected positions was used as an index for edge roughness. The smaller value is more preferred.

TABLE 2

| Examples | Resin of the Invention | Photo-Acid Generator | Sensitivity (mJ/cm$^2$) | Resolution ($\mu$m) | Edge Roughness (nm) |
|---|---|---|---|---|---|
| 1 | (1) | PAG4-5 | 19 | 0.13 | 12 |
| 2 | (2) | PAG4-5 | 17 | 0.13 | 11 |
| 3 | (5) | PAG3-23 | 20 | 0.13 | 12 |
| 4 | (8) | PAG4-5 | 13 | 0.13 | 13 |
| 5 | (13) | PAG4-7 | 12 | 0.13 | 10 |
| 6 | (21) | PAG3-23 | 21 | 0.13 | 11 |
| 7 | (31) | PAG4-5 | 18 | 0.13 | 12 |
| 8 | (42) | PAG7-4 | 20 | 0.13 | 13 |
| 9 | (49) | PAG4-5 | 17 | 0.13 | 14 |
| 10 | (55) | PAG3-23 | 22 | 0.14 | 12 |
| 11 | (61) | PAG3-22 | 9 | 0.13 | 11 |
| 12 | (65) | PAG6-19 | 19 | 0.14 | 10 |
| 13 | (66) | PAG7-4 | 17 | 0.13 | 13 |
| 14 | (69) | PAG3-23 | 19 | 0.13 | 14 |
| 15 | (85) | PAG4-5 | 12 | 0.13 | 12 |
| 16 | (95) | PAG4-5 | 14 | 0.14 | 11 |
| Comparative Example 1 | (A4) | PAG4-5 | 32 | 0.15 | 28 |

As apparent from the results in Table 2, the positive resist compositions of the present invention are all in a satisfactory level, namely, they are suitable for the lithography using a far ultraviolet ray as in the ArF excimer laser exposure.

Examples 17 to 32 and Comparative Examples 2 and 3

[Preparation and Evaluation of Photosensitive Compositions]

1.4 g of the resin synthesized in Synthesis Example above, 0.05 g of a photo-acid generator, 2.5 mg of an organic basic compound and a surfactant (the amount added was 0.1 wt % based on the entire solid content of the composition) were mixed, dissolved in a propylene glycol monomethyl ether acetate to a concentration of 14 wt % as the solid content, and then filtered through a 0.1-$\mu$m microfilter to prepare positive resists of Examples 17 to 32. The resin, the photo-acid generator, the organic basic compound and the surfactant used of the present invention are shown in Table 3 below.

The surfactants and the organic basic compounds shown in Table 3 denote the followings.

The surfactants used are:
W1: Megafac F176 (produced by Dainippon Ink & Chemicals, Inc.) (fluorine-containing surfactant)
W2: Megafac R08 (produced by Dainippon Ink & Chemicals, Inc.) (fluorine and silicone-containing surfactant)
W3: polysiloxane polymer KP-341 (produced by Shin-Etsu Chemical Co., Ltd.)
W4: polyoxyethylene nonyl phenyl ether Amines are:
N1: 1,5-diazabicyclo[4.3.0]-5-nonene (DBN),
N2: bis(1,2,2,6,6-pentamethyl-4-piperidyl) sebacate,
N3: tri-n-butylamine.

Separately, a positive resist for comparison was prepared using Resin (A4) synthesized in the same manner as in the synthesis described at page 8 of JP-A-10-274852.

(Evaluation Tests)

The thus-obtained positive photoresist solutions each was coated on a silicon wafer using a spin coater and dried at 130° C. for 90 seconds to form a positive photoresist film having a thickness of about 0.4 $\mu$m. The resist film formed was exposed by an ArF excimer laser (exposed by an ArF stepper at a wavelength of 193 nm with NA=0.6, manufactured by ISI), heat-treated at 120° C. for 90 seconds, developed with an aqueous 2.38% tetramethylammonium hydroxide solution and rinsed with distilled water to obtain a resist pattern profile.

[Number of Development Failures]

Each resist film was coated on a 6-inch bare Si substrate to have a thickness of 0.5 $\mu$m and dried on a vacuum adsorption-type hot plate at 140° C. for 60 seconds. Thereafter, each film was exposed through a test mask of a 0.35 $\mu$m contact hole pattern (hole duty ratio=1:3) by Nikon Stepper NSR-1505EX and after the exposure, heat-treated at 120° C. for 90 seconds. Subsequently, each film was paddle-developed with 2.38% TMAH (aqueous tetramethylammonium hydroxide solution) for 60 seconds, wished with pure water for 30 seconds, and then spin-dried. The thus-obtained samples each was subjected to the measurement of the number of development failures using KLA-2112 Machine manufactured by KLA Tenkol K.K. and the primary data value obtained was used as the number of development failures.

[Generation of Development Residue (Scumming)]

The degree of development residue in the case of a resist pattern having a line width of 0.22 $\mu$m was used for the evaluation. When the residue was not observed, the rating was ○, and when a fairly large amount of residue was observed, the rating was X.

[Defocus Latitude Depended on Line Pitch]

In a line-and-space pattern having a line width of 0.22 $\mu$m (dense pattern) and in an isolated line pattern (sparse pattern), the overlap range of the focus depth was determined with a tolerance of 0.22 $\mu$m±10%. The larger range reveals better defocus latitude depended on line pitch.

[Edge Roughness]

The edge roughness was measured for the edge roughness of an isolated pattern using an end measuring scanning-type electron microscope (SEM). The line pattern edge was detected at a plurality of positions within the measuring monitor and the dispersion (3σ) of the detected positions was used as an index for edge roughness. The smaller value is more preferred.

The evaluation results are shown in Table 3.

TABLE 3

| Example | Acid-Decomposable Resin | Photo-Acid Generator | Surfactant | Organic Basic Compound | Number of Development Failures | Scum | Defocus Latitude Depended on Line Pitch | Edge Roughness (nm) |
|---|---|---|---|---|---|---|---|---|
| 17 | (1) | PAG4-5 | W1 | 1 | 25 | ○ | 1.0 | 12 |
| 18 | (2) | PAG4-5 | W2 | 2 | 30 | ○ | 1.0 | 11 |
| 19 | (5) | PAG3-23 | W3 | 1 | 25 | ○ | 1.0 | 10 |
| 20 | (8) | PAG4-5 | W1 | 2 | 20 | ○ | 0.8 | 12 |
| 21 | (13) | PAG4-7 | W1 | 1 | 30 | ○ | 1.0 | 13 |
| 22 | (21) | PAG3-23 | W1 | 3 | 35 | ○ | 0.7 | 10 |
| 23 | (31) | PAG4-5 | W2 | 1 | 25 | ○ | 1.0 | 12 |
| 24 | (42) | PAG7-4 | W1 | 1 | 20 | ○ | 1.1 | 11 |
| 25 | (49) | PAG4-5 | W3 | 2 | 15 | ○ | 1.0 | 14 |
| 26 | (55) | PAG3-23 | W2 | 3 | 20 | ○ | 0.8 | 12 |
| 27 | (61) | PAG3-22 | W3 | 1 | 15 | ○ | 1.0 | 10 |
| 28 | (65) | PAG6-19 | W1 | 2 | 25 | ○ | 0.7 | 11 |
| 29 | (66) | PAG7-4 | W1 | 1 | 20 | ○ | 1.0 | 13 |
| 30 | (69) | PAG3-23 | W2 | 1 | 30 | ○ | 0.8 | 12 |
| 31 | (85) | PAG4-5 | W2 | 2 | 25 | ○ | 1.0 | 11 |
| 32 | (95) | PAG4-5 | W3 | 3 | 30 | ○ | 1.0 | 12 |
| Comparative Example 2 | (A4) | PAG4-5 | none | 2 | 12,000 | X | 0.2 | 28 |
| Comparative Example 3 | (A4) | PAG4-5 | W4 | 3 | 350 | ○ | 0.4 | 26 |

As apparent from the results in Table 3, the samples of Comparative Examples have problems in the number of development failures, the generation of scumming, the defocus latitude depended on line pitch and the edge roughness. On the other hand, the positive resist compositions of the present invention are in a satisfactory level in all of these points, namely, they are suitable for the lithography using a far ultraviolet ray as in the ArF excimer laser exposure.

Examples 33 to 48 and Comparative Example 4
[Preparation and Evaluation of Photosensitive Compositions]

1.4 g of a resin shown in Table 4, which was synthesized in Synthesis Examples above, 0.03 g of a photo-acid generator, 1.5 mg of 4-dimethylaminopyridine and 0.05 g of Megafac F176 (produced by Dainippon Ink & Chemicals Inc.) were mixed, dissolved in a solvent shown in Table 4 to a concentration of 14 wt % as the solid content, and then filtered through a 0.1-$\mu$m microfilter to prepare positive resists of Examples 33 to 48.

The solvents shown in Table 4 denote the followings.
The solvents are:
S1: propylene glycol monomethyl ether acetate
S2: propylene glycol monomethyl ether propionate
S3: methyl 3-methoxypropionate
S4: ethyl 3-ethoxypropionate
S5: ethyl lactate
S6: methyl amyl ketone
S7: butyl acetate
S8: $\gamma$-butyrolactone
S9: propylene carbonate
S10: ethyl pyruvate In Examples and Comparative Example, triphenylsulfonium triflate was used as the photo-acid generator. Separately, a positive resist for comparison was prepared using Resin (A4) synthesized in the same manner as in the synthesis described at page 8 of JP-A-10-274852.

(Evaluation Tests)

The thus-obtained positive photoresist solutions each was coated on a silicon wafer using a spin coater and dried at 130° C. for 90 second to form a positive photoresist film having a thickness of about 0.4 $\mu$m. The resist film formed was exposed by an ArF excimer laser (exposed by an ArF stepper at a wavelength of 193 nm with NA=0.6, manufactured by ISI), heat-treated at 120° C. for 90 seconds, developed with an aqueous 2.38% tetramethylammonium hydroxide solution and rinsed with distilled water to obtain a resist pattern profile.

These were evaluated as follows on the development failure, the edge roughness and the defocus latitude depended on line pitch.

[Number of Development Failures]

Each resist film was coated on a 6-inch bare Si substrate to have a thickness of 0.5 $\mu$m and dried on a vacuum adsorption-type hot plate at 140° C. for 60 seconds. Thereafter, each film was exposed through a test mask of a 0.35-$\mu$m contact hole pattern (hole duty ratio=1:3) by Nikon Stepper NSR-1505EX and after the exposure, heat-treated at 120° C. for 90 seconds. Subsequently, each film was paddle-developed with 2.38% TMAH (aqueous tetramethylammonium hydroxide solution) for 60 seconds, wished with pure water for 30 seconds, and then spin-dried. The thus-obtained samples each was subjected to the measurement of the number of development failures using KLA-2112 Machine manufactured by KLA Tenkol K.K. and the primary data value obtained was used as the number of development failures.

[Edge Roughness]

The edge roughness was measured for the edge roughness of an isolated pattern using an end measuring scanning-type electron microscope (SEM). The line pattern edge was detected at a plurality of positions within the measuring monitor and the dispersion (3$\sigma$) of the detected positions was used as an index for edge roughness. The smaller value is more preferred.

[Defocus Latitude Depended on Line Pitch]

In a line-and-space pattern having a line width of 0.22 $\mu$m (dense pattern) and in an isolated line pattern (sparse pattern), the overlap range of focus depth was determined with a tolerance of 0.22 $\mu$m±10%. The larger range reveals better defocus latitude depended on line pitch.

The evaluation results are shown in Table 4.

TABLE 4

| Example | Acid-Decomposable Resin | Solvent (weight ratio) | Number of Development Failures | Edge Roughness (nm) | Defocus Latitude Depended on Line Pitch |
|---|---|---|---|---|---|
| 33 | (1) | S1/S5(80/20) | 65 | 12 | 1.0 |
| 34 | (2) | S2/S6(70/30) | 75 | 14 | 1.0 |
| 35 | (5) | S3/S5(75/25) | 50 | 11 | 0.8 |
| 36 | (8) | S4/S6(70/30) | 70 | 13 | 1.1 |
| 37 | (13) | S1/S6(65/35) | 80 | 10 | 1.0 |
| 38 | (21) | S1/S8(90/10) | 65 | 15 | 1.2 |
| 39 | (31) | S1/S9(90/10) | 55 | 12 | 1.0 |
| 40 | (42) | S2/S5(70/30) | 70 | 13 | 1.1 |
| 41 | (49) | S2/S7(75/25) | 80 | 11 | 0.8 |
| 42 | (55) | S2/S10(80/20) | 75 | 14 | 1.0 |
| 43 | (61) | S3/S6(80/20) | 60 | 17 | 1.2 |
| 44 | (65) | S3/S8(85/15) | 65 | 12 | 1.1 |
| 45 | (66) | S3/S9(90/10) | 70 | 15 | 1.0 |
| 46 | (69) | S4/S5(60/40) | 60 | 13 | 1.0 |
| 47 | (85) | S4/S7(65/35) | 80 | 11 | 0.8 |
| 48 | (95) | S4/S10(70/30) | 55 | 16 | 1.0 |
| Comparative Example 4 | (A4) | S1 | 500 | 28 | 0.4 |

As apparent from the results in Table 4, the samples of the present invention are in a satisfactory level in all points, namely, they are suitable for the lithography using a far ultraviolet ray as in the ArF excimer laser exposure.

The present invention can provide a positive resist composition suitable of a far ultraviolet ray, particularly an ArF excimer laser ray, excellent in the sensitivity, resolution and edge roughness, and capable of providing an excellent resist pattern profile.

The positive photoresist composition for far ultraviolet exposure of the present invention can be suitably applied to light in the far ultraviolet wavelength region particularly from 150 to 220 nm, favored with excellent properties in the sensitivity, resolution, dry etching resistance and adhesion to a substrate, and prevented from the generation of development failures, scumming and edge roughness, and also can provide a good resist pattern profile highly satisfied with respect to the defocus latitude depended on line pitch and the edge roughness.

What is claimed is:

1. A positive photoresist composition comprising:

(A) a compound capable of generating an acid upon irradiation with actinic rays or radiation and (B) a resin capable of decomposing under the action of an acid to increase the solubility in alkali, containing a repeating unit represented by the following formula (AI):

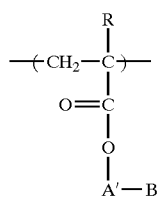

(AI)

wherein R represents hydrogen atom, a halogen atom, a substituted or unsubstituted alkyl group having from 1 to 4 carbon atoms, A' represents a single bond and B represents a group represented by formula (I):

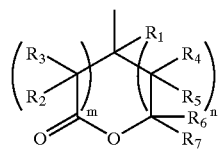

(I)

wherein $R_1$ represents hydrogen atom or an alkyl group having from 1 to 4 carbon atoms, which may have a substituent, $R_2$ to $R_7$, which may be the same or different, each represents hydrogen atom, an alkyl group which may have a substituent, a cycloalkyl group which may have a substituent or an alkenyl group which may have a substituent, provided that at least one of $R_6$ and $R_7$ is not a hydrogen atom and $R_6$ and $R_7$ may combine to form a ring, and m and n each independently represents 0 or 1, provided that m and n are not 0 at the same time.

2. The positive photoresist composition as claimed in claim 1, wherein the resin (B) further contains a repeating unit having an alkali-soluble group protected by at least one group containing an alicyclic hydrocarbon structure represented by the following formula (pI), (pII), (pIII), (pIV), (pV) or (pVI):

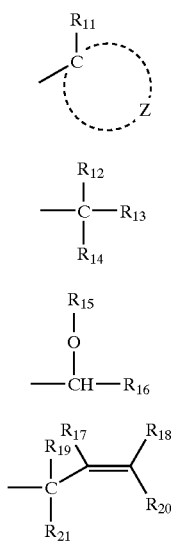

(pI)

(pII)

(pIII)

(pIV)

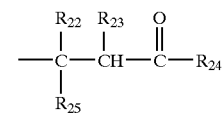

(pV)

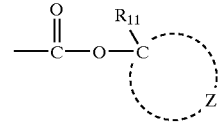

(pVI)

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represents a linear or branched alkyl group having from 1 to 4 carbon atoms or an alicyclic hydrocarbon group, provided that at least one of $R_{12}$ to $R_{14}$ or either one of $R_{15}$ and $R_{16}$ represents an alicyclic hydrocarbon group; $R_{17}$ to $R_{21}$ each independently represents hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and either one of $R_{19}$ and $R_{21}$ represents a linear or branched alkyl group having from 1 to 4 carbon atoms or an alicyclic hydrocarbon group; and $R_{22}$ to $R_{25}$ each independently represents a linear or branched alkyl group having from 1 to 4 carbon atoms or an alicyclic hydrocarbon group, provided that at least one of $R_{22}$ to $R_{25}$ represents an alicyclic hydrocarbon group.

3. A positive photoresist composition as claimed in claim 2, wherein the alicyclic hydrocarbon structure-containing group represented by formula (pI), (pII), (pIII), (pIV), (pV) or (pVI) is a group represented by formula (II):

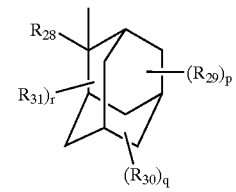

(II)

wherein $R_{28}$ represents an alkyl group which may have a substituent, $R_{29}$ to $R_{31}$, which may be the same or different, each represents a hydroxy group, a halogen atom, a carboxy group, an alkyl group which may have a substituent, a cycloalkyl group which may have a substituent, an alkenyl group which may have a substituent, an alkoxy group which may have a substituent, an alkoxycarbonyl group which may have a substituent or an acyl group which may have a substituent, and p, q and r each independently represents 0 or an integer of 1 to 3.

4. The positive photoresist composition as claimed in claim 1, wherein the resin (B) contains a repeating unit represented by the following formula (a):

(a)

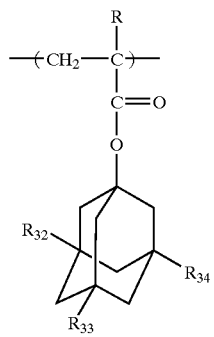

wherein R represents hydrogen atom, a halogen atom, a substituted or unsubstituted alkyl group having from 1 to 4 carbon atoms, and $R_{32}$ to $R_{34}$, which may be the same or different, each represents hydrogen atom or a hydroxyl group, provided that at least one of $R_{32}$ to $R_{34}$ represents a hydroxyl group.

5. The positive photoresist composition as claimed in claim 1, which further contains an acid diffusion inhibitor.

6. The positive photoresist composition as claimed in claim 1, wherein the compound (A) is a sulfonium salt compound of sulfonium or iodonium.

7. The positive photoresist composition as in claim 1, wherein the compound (A) is a sulfonate compound of N-hydroxyimide or a disulfonyldiazomethane compound.

8. The positive photoresist composition as claimed in claim 1, wherein the exposure light used is a far ultraviolet ray at a wavelength of 150 to 220 nm.

9. A positive photoresist composition for far ultraviolet exposure, comprising:

(A) a compound capable of generating an acid upon irradiation with actinic rays or radiation, (B) a resin capable of decomposing under the action of an acid to increase the solubility in alkali, containing a repeating unit having a group represented by the following formula (I), and (C) a fluorine-containing and/or silicon-containing surfactant:

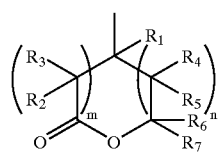

(I)

wherein $R_1$ represents hydrogen atom or an alkyl group having from 1 to 4 carbon atoms, which may have a substituent, $R_2$ to $R_7$, which may be the same or different, each represents hydrogen atom, an alkyl group which may have a substituent, a cycloalkyl group which may have a substituent or an alkenyl group which may have a substituent, provided that at least one of $R_6$ to $R_7$ is not a hydrogen atom and $R_6$ and $R_7$ may combine to form a ring, and m and n each independently represents 0 or 1, provided that m and n are not 0 at the same time.

10. The positive photoresist composition for far ultraviolet exposure as claimed in claim 9, wherein the resin (B) further contains a repeating unit having an alkali-soluble group protected by at least one group containing an alicyclic hydrocarbon structure represented by the following formula (pI), (pII), (pIII), (pIV), (pV) or (pVI):

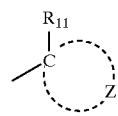 (pI)

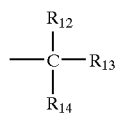 (pII)

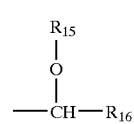 (pIII)

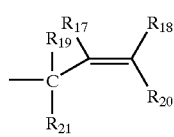 (pIV)

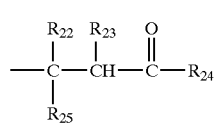 (pV)

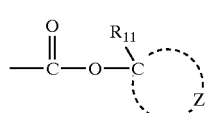 (pVI)

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represents a linear or branched alkyl group having from 1 to 4 carbon atoms or an alicyclic hydrocarbon group, provided that at least one of $R_{12}$ to $R_{14}$ or either one of $R_{15}$ and $R_{16}$ represents an alicyclic hydrocarbon group; $R_{17}$ to $R_{21}$ each independently represents hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and either one of $R_{19}$ and $R_{21}$ represents a linear or branched alkyl group having from 1 to 4 carbon atoms or an alicyclic hydrocarbon group; and $R_{22}$ to $R_{25}$ each independently represents linear or branched alkyl group having from 1 to 4 carbon atoms or an alicyclic hydrocarbon group, provided that at least one of $R_{22}$ to $R_{25}$ represents an alicyclic hydrocarbon group.

11. The positive photoresist composition for far ultraviolet exposure as claimed in claim 10, wherein the group containing an alicyclic hydrocarbon structure represented by the formula (pI), (pII), (pIII), (pIV), (pV) or (pVI) is a group represented by the following formula (II):

(II)

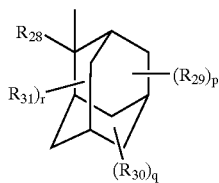

wherein $R_{28}$ represents an alkyl group which may be have a substituent, $R_{29}$ to $R_{31}$, which may be the same or different, each represents a hydroxy group, a halogen atom, a carboxy group, an alkyl group which may have a substituent, a cycloalkyl group which may have a substituent, an alkenyl group which may have a substituent, an alkoxy group which may have a substituent, an alkoxycarbonyl group which may have a substituent or an acyl group which may have a substituent, and p, q and r each independently represents 0 or an integer of 1 to 3.

12. The positive photoresist composition for far ultraviolet exposure as claimed in claim 9, wherein the resin (B) contains a repeating unit represented by the following formula (a):

(a)

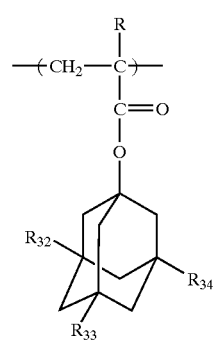

wherein R represents hydrogen atom, a halogen atom, a substituted or unsubstituted alkyl group having from 1 to 4 carbon atoms, and $R_{32}$ to $R_{34}$, which may be the same or different, each represents hydrogen atom or a hydroxyl group, provided that at least one of $R_{32}$ to $R_{34}$ represents a hydroxyl group.

13. The positive photoresist composition for far ultraviolet exposure as claimed in claim 9, which further contains an acid diffusion inhibitor.

14. The positive photoresist composition for far ultraviolet exposure as claimed in claim 9, wherein the acid diffusion inhibitor is a nitrogen-containing basic compound and the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

15. The positive photoresist composition for far ultraviolet exposure as claimed in claim 9, wherein the compound (A) is a sulfonic acid salt compound of sulfonium or iodonium.

16. The positive photoresist composition for far ultraviolet exposure as claimed in claim 9, wherein the compound (A) is a sulfonate compound of N-hydroxyimide or a disulfonyldiazomethane compound.

17. The positive photoresist composition for far ultraviolet exposure as claimed in claim 9, wherein the exposure light used is a far ultraviolet ray at a wavelength of 150 to 220 nm.

18. A positive photoresist composition for far ultraviolet exposure, comprising:

(A) a compound capable of generating an acid upon irradiation with actinic rays or radiation, (B) a resin capable of decomposing under the action of an acid to increase the solubility in alkali, containing a repeating unit represented by the following formula (AI), and (D) a solvent containing the following solvent (a) in an amount of 60% to 90 wt % based on the entire solvent:

(a) at least one first solvent selected from propylene glycol monomethyl ether acetate, propylene glycol monomethyl ether propionate, methyl 3-methoxypropionate, ethyl 3-methoxypropionate, methyl 3-ethoxypropionate and ethyl 3-ethyoxypropionate;

(AI)

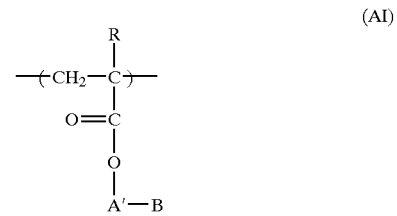

wherein R represents hydrogen atom, a halogen atom, a substituted or unsubstituted alkyl group having from 1 to 4 carbon atoms, A' represents a single bond and B represents a group represented by formula (I):

(I)

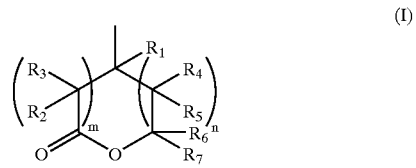

wherein $R_1$ represents hydrogen atom or an alkyl group having from 1 to 4 carbon atoms, which may have a substituent, $R_2$ to $R_7$, which may be the same or different, each represents hydrogen atom, an alkyl group which may be substituent, a cycloalkyl group which may have a substituent or an alkenyl group which may have a substituent, provided that at least one of $R_6$ and $R_7$ is not a hydrogen atom and $R_6$ and $R_7$ may combine to form a ring, and m and n each independently represents 0 or 1, provided that m and n are not 0 at the same time.

19. The positive photoresist composition for far ultraviolet exposure as claimed in claim 18, wherein the resin (B) further contains a repeating unit having an alkali-soluble group protected by at least one group containing an alicyclic hydrocarbon structure represented by the following formula (pI), (pII), (pIII), (pIV), (pV) or (pVI):

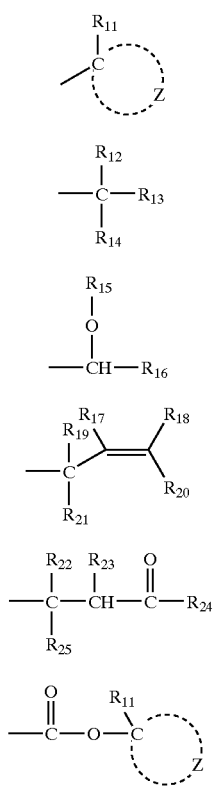

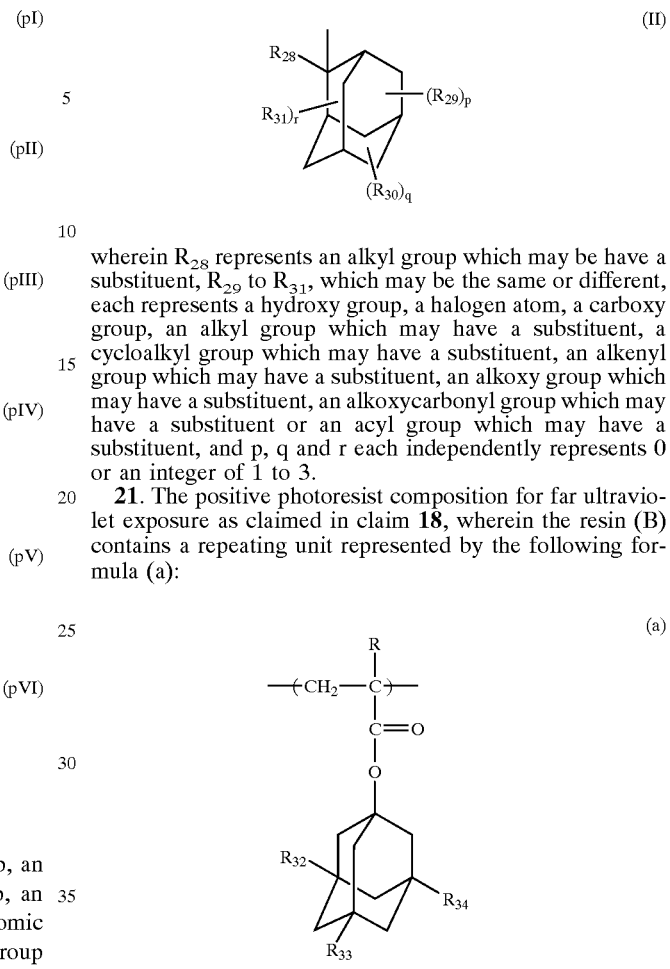

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represents a linear or branched alkyl group having from 1 to 4 carbon atoms or an alicyclic hydrocarbon group, provided that at least one of $R_{12}$ to $R_{14}$ or either one of $R_{15}$ and $R_{16}$ represents an alicyclic hydrocarbon group; $R_{17}$ to $R_{21}$ each independently represents hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and either one of $R_{19}$ and $R_{21}$ represents a linear or branched alkyl group having from 1 to 4 carbon atoms or an alicyclic hydrocarbon group; and $R_{22}$ to $R_{25}$ each independently represents a linear or branched alkyl group having from 1 to 4 carbon atoms or an alicyclic hydrocarbon group, provided that at least one of $R_{22}$ to $R_{25}$ represents an alicyclic hydrocarbon group.

20. The positive photoresist composition for far ultraviolet exposure as claimed in claim 19, wherein the group containing an alicyclic hydrocarbon structure represented by the formula (pI), (pII), (pIII), (pIV), (pV) or (pVI) is a group represented by the following formula (II):

wherein $R_{28}$ represents an alkyl group which may be have a substituent, $R_{29}$ to $R_{31}$, which may be the same or different, each represents a hydroxy group, a halogen atom, a carboxy group, an alkyl group which may have a substituent, a cycloalkyl group which may have a substituent, an alkenyl group which may have a substituent, an alkoxy group which may have a substituent, an alkoxycarbonyl group which may have a substituent or an acyl group which may have a substituent, and p, q and r each independently represents 0 or an integer of 1 to 3.

21. The positive photoresist composition for far ultraviolet exposure as claimed in claim 18, wherein the resin (B) contains a repeating unit represented by the following formula (a):

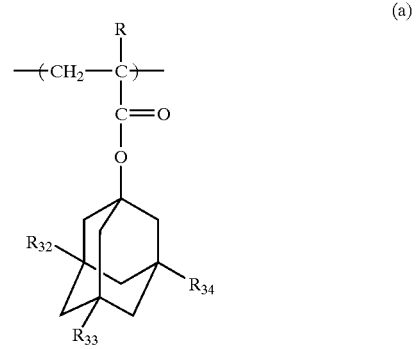

wherein R represents hydrogen atom, a halogen atom, a substituted or unsubstituted alkyl group having from 1 to 4 carbon atoms, and $R_{32}$ to $R_{34}$, which may be the same or different, each represents hydrogen atom or a hydroxyl group, provided that at least one of $R_{32}$ to $R_{34}$ represents a hydroxyl group.

22. The positive photoresist composition for far ultraviolet exposure as claimed in claim 18, which further contains an acid diffusion inhibitor.

23. The positive photoresist composition for far ultraviolet exposure as claimed in claim 18, wherein the compound (A) is a sulfonic acid salt compound of sulfonium or iodonium.

24. The positive photoresist composition for far ultraviolet exposure as claimed in claim 18, wherein the compound (A) is a sulfonate compound of N-hydroxyimide or a disulfonyldiazomethane compound.

25. The positive photoresist composition for far ultraviolet exposure as claimed in claim 18, wherein the exposure light used is a far ultraviolet ray at a wavelength of 150 to 220 nm.

\* \* \* \* \*